United States Patent
Futatsuyama et al.

(10) Patent No.: US 9,214,238 B2
(45) Date of Patent: Dec. 15, 2015

(54) SEMICONDUCTOR MEMORY DEVICE

(71) Applicant: KABUSHIKI KAISHA TOSHIBA, Tokyo (JP)

(72) Inventors: Takuya Futatsuyama, Yokohama Kanagawa (JP); Masanobu Shirakawa, Chigasaki Kanagawa (JP); Kenichi Abe, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/474,307

(22) Filed: Sep. 2, 2014

(65) Prior Publication Data

US 2015/0262682 A1 Sep. 17, 2015

(30) Foreign Application Priority Data

Mar. 14, 2014 (JP) ................................. 2014-051934

(51) Int. Cl.
  *G11C 16/10* (2006.01)
  *G11C 16/34* (2006.01)

(52) U.S. Cl.
  CPC ............ *G11C 16/10* (2013.01); *G11C 16/3459* (2013.01)

(58) Field of Classification Search
  CPC ........................... G11C 16/10; G11C 16/3459
  USPC .............. 365/185.22, 185.17, 185.11, 185.01
  See application file for complete search history.

(56) References Cited

U.S. PATENT DOCUMENTS

| | | | |
|---|---|---|---|
| 2006/0126394 A1* | 6/2006 | Li .............................. | 365/185.22 |
| 2013/0058166 A1* | 3/2013 | Maejima .................. | 365/185.18 |
| 2014/0293693 A1* | 10/2014 | Nam et al. ............... | 365/185.11 |

FOREIGN PATENT DOCUMENTS

| | | |
|---|---|---|
| JP | 2011-096340 A | 5/2011 |
| JP | 2011-258289 A | 12/2011 |
| JP | 2014-075169 A | 4/2014 |

\* cited by examiner

*Primary Examiner* — Vu Le
*Assistant Examiner* — Sung Cho
(74) *Attorney, Agent, or Firm* — Patterson & Sheridan, LLP

(57) ABSTRACT

A semiconductor memory device includes first to fourth memory cells that are stacked above a semiconductor substrate, first to fourth word lines that are connected to gates of the first to fourth memory cells, respectively, and a row decoder that applies voltages to the first to fourth word lines. The row decoder applies a first programming voltage to the first word line during a write operation performed on the first memory cell, applies the first programming voltage to the second word line during a write operation performed on the second memory cell, applies a second programming voltage to the third word line during a write operation performed on the third memory cell, and applies the second programming voltage to the fourth word line during a write operation performed on the fourth memory cell. The second programming voltage is higher than the first programming voltage.

20 Claims, 43 Drawing Sheets

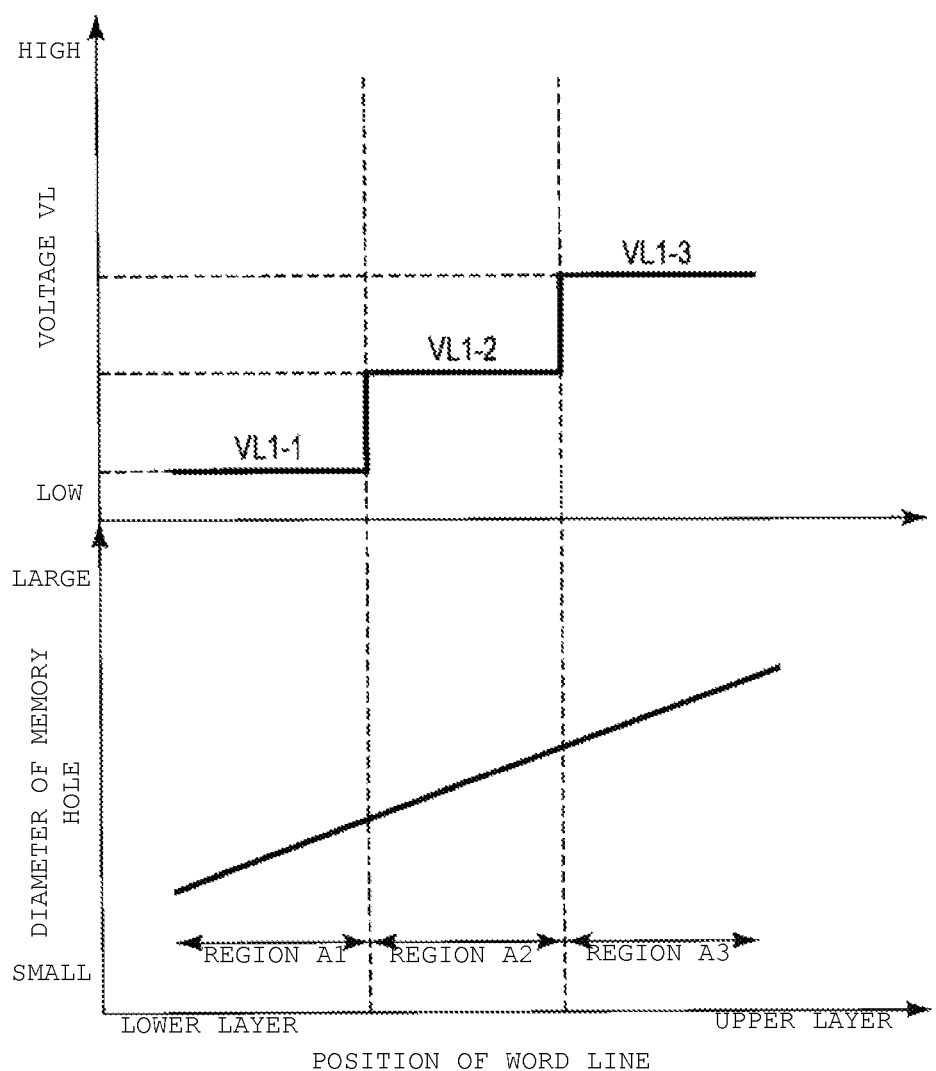

SEMICONDUCTOR MEMORY DEVICE

CROSS-REFERENCE TO RELATED APPLICATION

This application is based upon and claims the benefit of priority from Japanese Patent Application No. 2014-051934, filed Mar. 14, 2014, the entire contents of which are incorporated herein by reference.

FIELD

Embodiments described herein relate generally to a semiconductor memory device.

BACKGROUND

NAND-type flash memories are known in which memory cells are arranged in a three-dimensional manner.

DESCRIPTION OF THE DRAWINGS

FIG. 20 is a diagram illustrating a concept of a detecting operation according to the second embodiment.

FIG. 21 is a graph illustrating a relationship of a detection voltage to a position of a word line according to the second embodiment.

DETAILED DESCRIPTION

Figure 1:
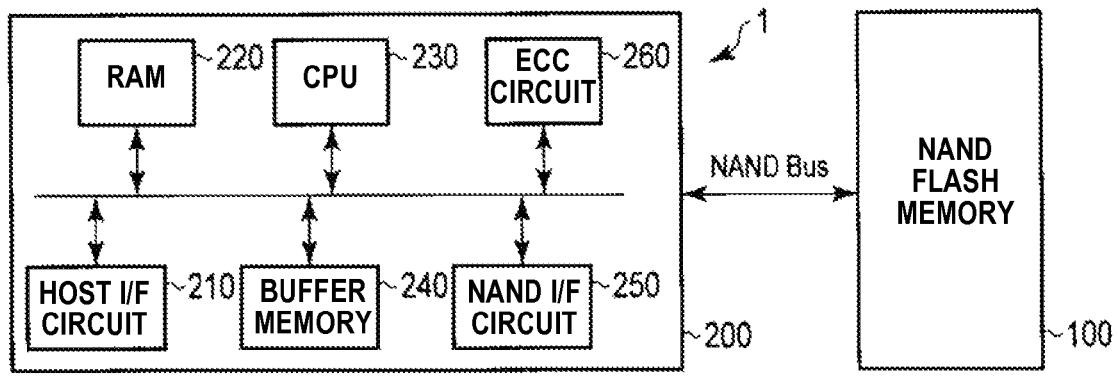
FIG. 1 is a block diagram of a memory system according to a first embodiment.

The present embodiment now will be described more fully hereinafter with reference to the accompanying drawings, in which various embodiments are illustrated. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises", "comprising", "having", "includes", "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", may therefore, encompass both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below.

Embodiments are described herein with reference to cross sections and perspective illustrations that are schematic illustrations of embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Embodiments provide a semiconductor memory device capable of improving an operating performance.

In general, according to one embodiment, a semiconductor memory device includes first and second memory cells that are stacked above a semiconductor substrate, third and fourth memory cells that are stacked above the first and second memory cells, first to fourth word lines that are electrically connected to gates of the first to fourth memory cells, respectively, and a row decoder that applies voltages to the first to fourth word lines. The row decoder applies a first programming voltage to the first word line during a write operation performed on the first memory cell, and applies the first programming voltage to the second word line during a write operation performed on the second memory cell. In addition, the row decoder applies a second programming voltage, higher than the first programming voltage, to the third word line during a write operation performed on the third memory cell, and applies the second programming voltage to the fourth word line during a write operation performed on the fourth memory cell.

Hereinafter, embodiments will be described with reference to the accompanying drawings. Meanwhile, components having the same function and configuration are denoted by common reference numerals.

1. First Embodiment

A semiconductor memory device according to a first embodiment will be described below. Hereinafter, a description will be given by taking an example of a three-dimensional stacked NAND-type flash memory in which memory cells are stacked above a semiconductor substrate, as the semiconductor memory device.

1.1 Configuration 1.1.1 Configuration of Memory System

First, a configuration of a memory system including the semiconductor memory device according to this embodiment will be described with reference to FIG. 1. FIG. 1 is a block diagram of a memory system according to this embodiment.

As illustrated in the drawing, a memory system 1 includes a NAND-type flash memory 100 and a controller 200. The controller 200 and the NAND-type flash memory 100 may configure one semiconductor device, for example, by a combination thereof. Examples of the semiconductor device include a memory card such as an SD™ card, a solid state drive (SSD), and the like.

The NAND-type flash memory 100 includes a plurality of memory cells and stores data in a nonvolatile manner. The configuration of the NAND-type flash memory 100 will be described later in detail.

The controller 200 commands the NAND-type flash memory 100 to perform reading, writing, erasing, and the like in response to a command from an external host device. In addition, the controller manages a memory space in the NAND-type flash memory 100.

The controller 200 includes a host interface circuit 210, a built-in memory (RAM) 220, a processor (CPU) 230, a buffer memory 240, a NAND interface circuit 250, and an ECC circuit 260.

The host interface circuit 210 is connected to a host device through a controller bus to communicate with the host device. The host interface circuit transmits a command and data, which are received from the host device, to the CPU 230 and the buffer memory 240. In addition, the host interface circuit transmits data within the buffer memory 240 to the host device in response to the command of the CPU 230.

The NAND interface circuit 250 is connected to the NAND-type flash memory 100 through a NAND bus to communicate with the NAND-type flash memory 100. The NAND interface circuit transmits the command received from the CPU 230 to the NAND-type flash memory 100 and transmits writing data within the buffer memory 240 to the NAND-type flash memory 100 during writing. Further, the NAND interface circuit transmits data which is read out from the NAND-type flash memory 100 to the buffer memory 240 during reading.

The CPU 230 controls the overall operation of the controller 200. For example, when the CPU 230 receives a writing command from the host device, the CPU issues a writing command based on a NAND interface, in response to the received writing command. The same is true during reading and erasing. In addition, the CPU 230 executes various processes, such as wear leveling, for managing the NAND-type flash memory 100. Further, the CPU 230 executes various computations. For example, the CPU executes data encryption processing, data randomization processing, and the like.

The ECC circuit 260 executes data error correction (error checking and correcting: ECC) processing. That is, the ECC circuit 260 generates parity based on writing data during data wiring, generates a syndrome from the parity to detect an error during reading, and corrects the error. Meanwhile, the CPU 230 may have a function as the ECC circuit 260.

For example, the built-in memory 220, which is a semiconductor memory such as a DRAM, is used as a work region of the CPU 230. The built-in memory 220 holds a firmware for managing the NAND-type flash memory 100, various management tables, and the like.

1.1.2 Configuration of Semiconductor Memory Device

Next, a configuration of the NAND-type flash memory 100 will be described.

1.1.2.1 Overall Configuration of Semiconductor Memory Device

Figure 2:
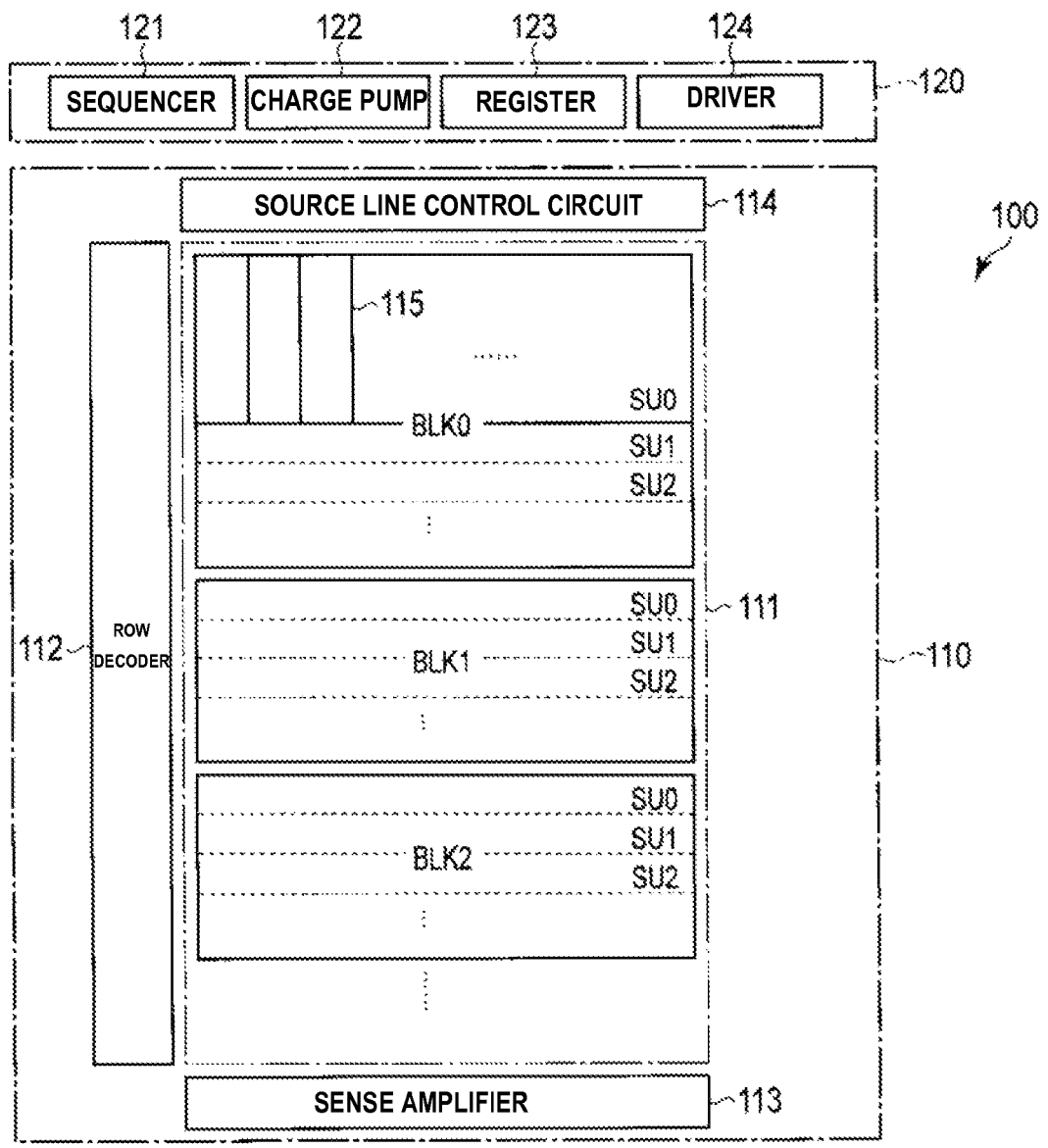
FIG. 2 is a block diagram of a semiconductor memory device according to the first embodiment.

FIG. 2 is a block diagram of the NAND-type flash memory 100 according to this embodiment. As illustrated in the drawing, the NAND-type flash memory 100 includes a core unit 110 and a peripheral circuit 120.

The core unit 110 includes a memory cell array 111, a row decoder 112, a sense amplifier 113, and a source line control circuit 114.

The memory cell array 111 includes a plurality of blocks BLK (BLK0, BLK1, BLK2, . . . ) which are a set of a plurality of nonvolatile memory cells, each of which is associated with a word line and a bit line. The block BLK is a unit of data erasing, and data within the same block BLK is collectively erased. Each of the blocks BLK includes a plurality of string units SU (SU0, SU1, SU2, . . . ) each of which includes a set of NAND strings 115 in which the memory cells are connected in series. Naturally, the number of blocks within the memory cell array 111 and the number of string units within one block BLK are arbitrary.

The row decoder 112 decodes a block address and a page address to select anyone word line of the corresponding block. The row decoder 112 applies an appropriate voltage to a selected word line and an unselected word line.

The sense amplifier 113 senses and amplifies data which is read out from the memory cell to the bit lines, during data reading. In addition, the sense amplifier transmits writing data to the memory cell during data writing. The reading and writing of data with respect to the memory cell array 111 are performed in units of a plurality of memory cells, and this unit is referred to as a page.

The source line control circuit 114 applies data to a source line during the reading, erasing, and the like of data.

The peripheral circuit 120 includes a sequencer 121, a charge pump 122, a register 123, and a driver 124.

The driver 124 supplies voltages necessary for the writing, reading, and erasing of data to the row decoder 112, the sense amplifier 113, and the source line control circuit 114. The voltages are applied to the memory cells (word lines, select gate lines, back gate lines, bit lines, and source lines which are to be described later) by the row decoder 112, the sense amplifier 113, and the source line control circuit 114.

The charge pump 122 boosts a power supply voltage supplied from the outside and supplies a necessary voltage to the driver 124.

The register 123 holds various signals. For example, the register holds statuses of data writing and erasing operations, and thus notifies the controller whether the operations are normally completed. Alternatively, the register 123 may also hold various tables.

The sequencer 121 controls the overall operation of the NAND-type flash memory 100. For example, the sequencer 121 controls a programming voltage which is supplied to the word lines during wiring. That is, when the sequencer 121 receives an address signal from the controller 200, the sequencer selects a voltage to be supplied among a plurality of programming voltages, based on the address signal, and outputs the selected signal to the charge pump 122. The charge pump 122 supplies the programming voltage based on the selected signal, among the plurality of programming voltages, to the driver 124. The driver 124 outputs the received programming voltage to the row decoder 112.

1.1.2.2 Memory Cell Array 111

Figure 3:
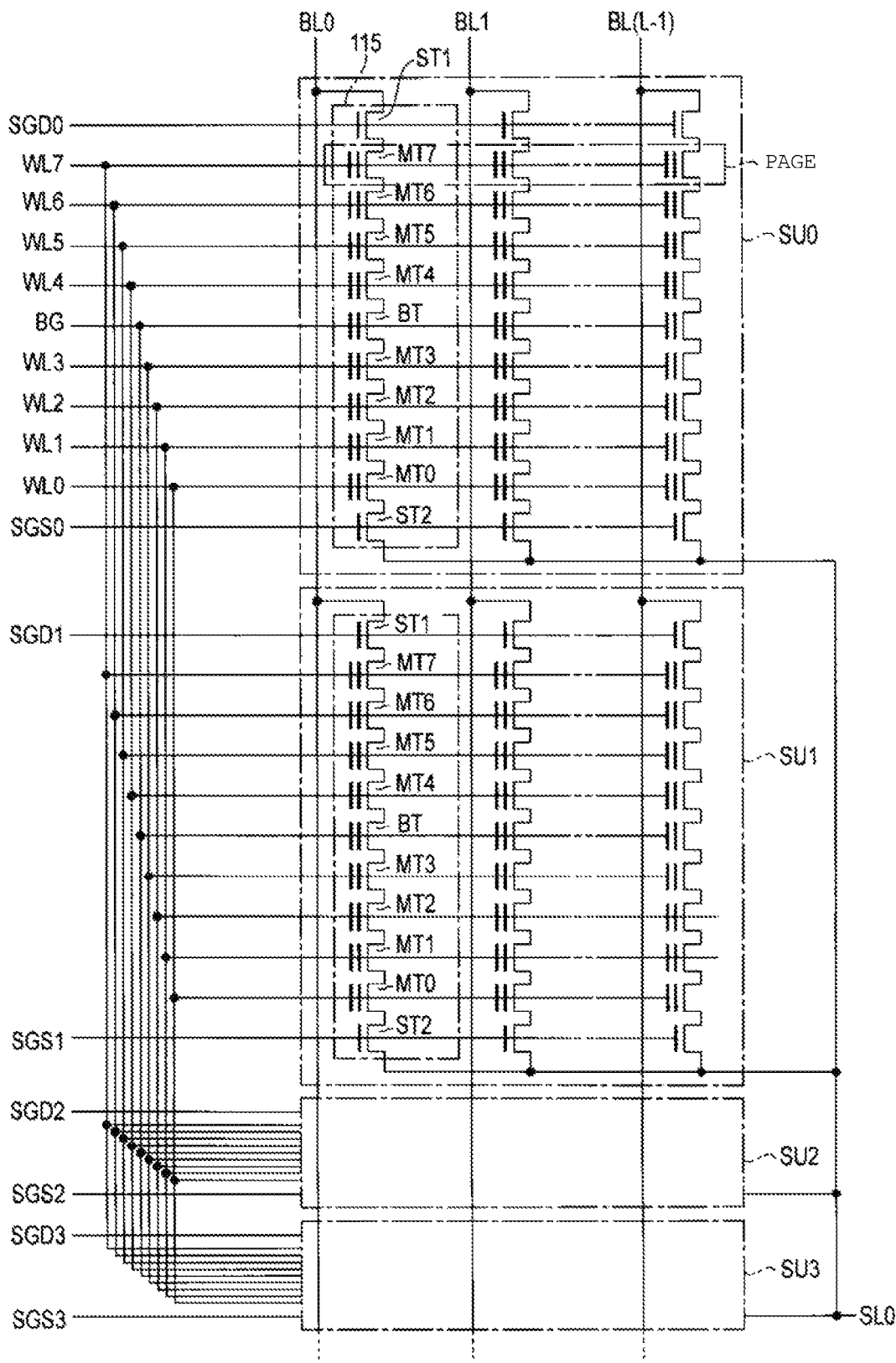
FIG. 3 is a circuit diagram of a memory cell array according to the first embodiment.

Next, a configuration of the memory cell array 111 will be described in detail. FIG. 3 is a circuit diagram of any one block BLK, and other blocks BLK also have the same configuration.

As illustrated in the drawing, the block BLK includes, for example, four string units SU (SU0 to SU3). In addition, each of the string units SU includes the plurality of NAND strings 115.

Each of the NAND strings 115 includes, for example, eight memory cell transistors MT (MT0 to MT7), select transistors ST1 and ST2, and a back gate transistor BT. The memory cell transistor MT includes a stacked gate including a control gate and a charge storage layer, and holds data in a nonvolatile manner. Meanwhile, the number of memory cell transistors MT is not limited to eight. The number of memory cell transistors may be sixteen, thirty-two, sixty-four, one hundred and twenty-eight, or the like, and is not limited thereto. Similarly to the memory cell transistor MT, the back gate transistor BT includes a stacked gate including a control gate and a charge storage layer. Herein, the back gate transistor BT is not for the purpose of holding data, and functions as a mere current path during writing, reading, and erasing of data. The memory cell transistors MT and the back gate transistor BT are disposed between the select transistors ST1 and ST2 so that the current paths thereof are connected to each other in series. Meanwhile, the back gate transistor BT is provided between the memory cell transistors MT3 and MT4. The current path of the memory cell transistor MT7 on one end side of the serial connection is connected to one end of the current path of the select transistor ST1, and the current path of the memory cell transistor MT0 on the other end side thereof is connected to one end of the current path of the select transistor ST2.

Gates of the select transistors ST1 of the string units SU0 to SU3 are connected in common to select gate lines SGD0 to SGD3, and gates of the select transistors ST2 are connected in common to select gate lines SGS0 to SGS3. On the other hand, control gates of the memory cell transistors MT0 to MT7 within the same block BLK0 are connected in common to word lines WL0 to WL7, and control gates of the back gate transistors BT are connected in common to back gate lines BG (BG0 to BG2 in the blocks BLK0 to BLK2).

That is, the word lines WL0 to WL7 and the back gate lines BG are connected in common between the plurality of string units SU0 to SU3 within the same block BLK0, while the select gate lines SGD and SGS are independent for each of the string units SU0 to SU3 even within the same block BLK0.

In addition, the other ends of the current paths of the select transistors ST1 of the NAND strings 115 in the same row, among the NAND strings 115 disposed in a matrix within the memory cell array 111, are connected in common to any one bit line BL (BL0 to BL (L−1), wherein (L−1) is a natural number equal to or greater than 1). That is, the bit line BL is connected to the NAND strings 115 in common between the plurality of blocks BLK. In addition, the other ends of the current paths of the select transistors ST2 are connected in common to a source line SL. For example, the source line SL is connected to the NAND strings 115 in common between the plurality of blocks.

As described above, data of the memory cell transistors MT within the same block BLK is collectively erased. On the other hand, the reading and writing of data are collectively performed on the plurality of memory cell transistors MT which are connected in common to any one word line WL in any one string unit SU of any one block BLK. This unit is referred to as a "page".

The configuration of the memory cell array 111 is disclosed in, for example, U.S. patent application Ser. No. 12/407,403, filed Mar. 19, 2009, entitled "Three dimensional Stacked Nonvolatile Semiconductor Memory". In addition, the configuration is disclosed in U.S. patent application Ser. No. 12/406,524, filed Mar. 18, 2009, entitled "Three dimensional Stacked Nonvolatile Semiconductor Memory", U.S. patent application Ser. No. 12/679,991, filed Mar. 25, 2010, entitled "Non-volatile Semiconductor Storage Device and Method of Manufacturing the Same", and U.S. patent application Ser. No. 12/532,030, filed Mar. 23, 2009, entitled "Semiconductor Memory and Method for Manufacturing Same". The entireties of these patent applications are incorporated in this disclosure by reference.

Figure 4:
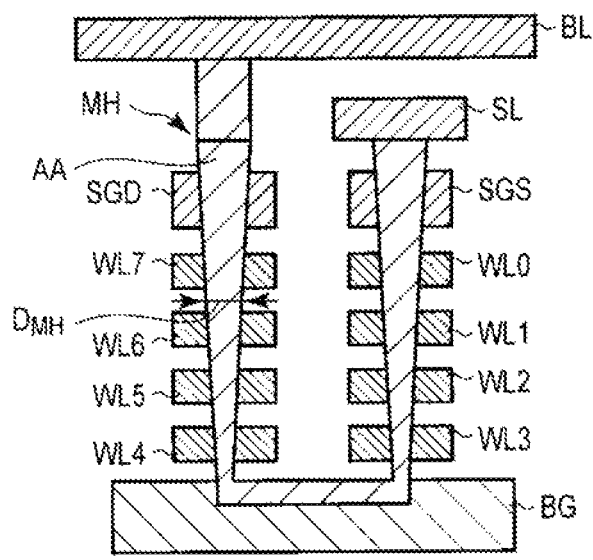
FIG. 4 is a cross-sectional view of an example of a NAND string according to the first embodiment.

FIG. 4 is a cross-sectional view of a configuration example of the NAND string 115. The configuration illustrated in FIG. 4 is just an example, and other configurations may be used. Several variations will be described in embodiments to be described later. The plurality of structures, each of which is illustrated in FIG. 4, are arrayed in the depth direction of the paper depicting FIG. 4 within the memory cell array 111, and the structures share the word lines WL0 to WL7, the select gate lines SGD and SGS, and the back gate line BG to form one string unit SU.

For example, peripheral circuit units such as the row decoder 112 and the sense amplifier 113 are formed on the semiconductor substrate. In addition, an interlayer insulating film is formed on the semiconductor substrate so as to cover the peripheral circuit units, and the memory cell array 111 is formed on the interlayer insulating film. That is, as illustrated in FIG. 4, a conductive layer (for example, a polycrystalline silicon layer) which functions as the back gate line BG is formed above the semiconductor substrate. Further, a plurality of conductive layers (for example, polycrystalline silicon layers) which function as the word lines WL0 to WL7 are formed on the back gate line BG. A conductive layer (for example, a polycrystalline silicon layer) which functions as the select gate line SGS is formed on the word line WL0. Further, a conductive layer (for example, a polycrystalline silicon layer) which functions as the select gate line SGD is formed on the word line WL7.

In this example, the word lines WL0 and WL7 are formed in the same layer, the word lines WL1 and WL6 are formed in the same layer, and the word lines WL2 and WL5 are formed in the same layer, and the word lines WL3 and WL4 are formed in the same layer.

Then, a memory hole MH is formed so as to penetrate the select gate line SGS and the word lines WL0 to WL3, and another memory hole MH is formed so as to penetrate the select gate line SGD and the word lines WL4 to WL7. A semiconductor layer AA is buried in each of the memory holes MH, and the semiconductor layers AA buried in the two memory holes MH are connected to each other by a semiconductor layer formed within the back gate line BG. The semiconductor layer AA functions as a current path of the NAND string 115, and serves as a region where a channel is formed during the operation of the memory cell transistor MT. Further, the source line SL and the bit line BL are formed on the semiconductor layers AA.

A diameter $D_{MH}$ of the memory hole MH gradually decreases from the upper-layer side toward the lower-layer side above the back gate line BG. That is, the diameter $D_{MH}$ decreases from the word line WL7 toward the word line WL4 and from the word line WL0 toward the word line WL3. For this reason, the semiconductor layer AA within the memory hole MH has a taper shape in which the diameter gradually decreases from the upper-layer side toward the lower-layer side.

Figure 5:
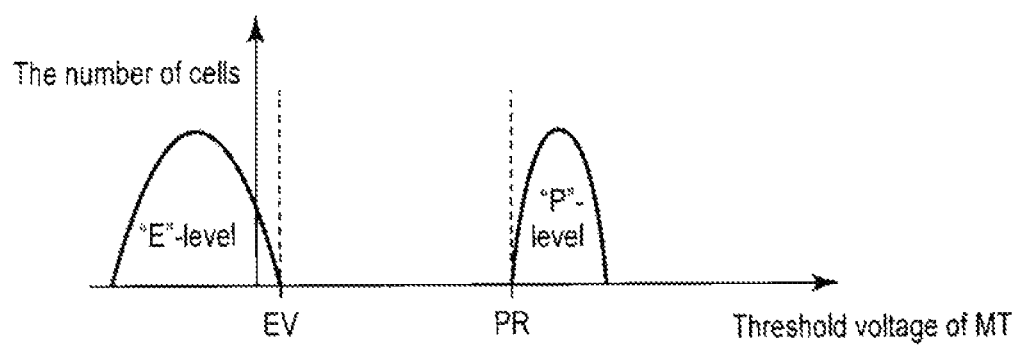
FIG. 5 is a graph illustrating the threshold distribution of an example of a memory cell according to the first embodiment.

FIG. 5 illustrates a threshold distribution of an example memory cell transistor MT according to this embodiment. As illustrated in the drawing, the memory cell transistor MT according to this example may hold data of one bit in accordance with the threshold value (single-level cell (SLC)). The data of one bit is, for example, an "E" level and a "P" level in the ascending order of threshold value. The "E" level is a threshold value in a state where data is erased. For example, the "E" level has a negative value (may have a positive value) and is lower than a verification voltage EV. The "P" level is a threshold value in a state where charges are injected into the charge storage layer. The "P" level has a threshold value higher than a reading level "PR" (PR>EV).

1.1.2.3 Regarding Configuration of Sense Amplifier 113

Figure 6:
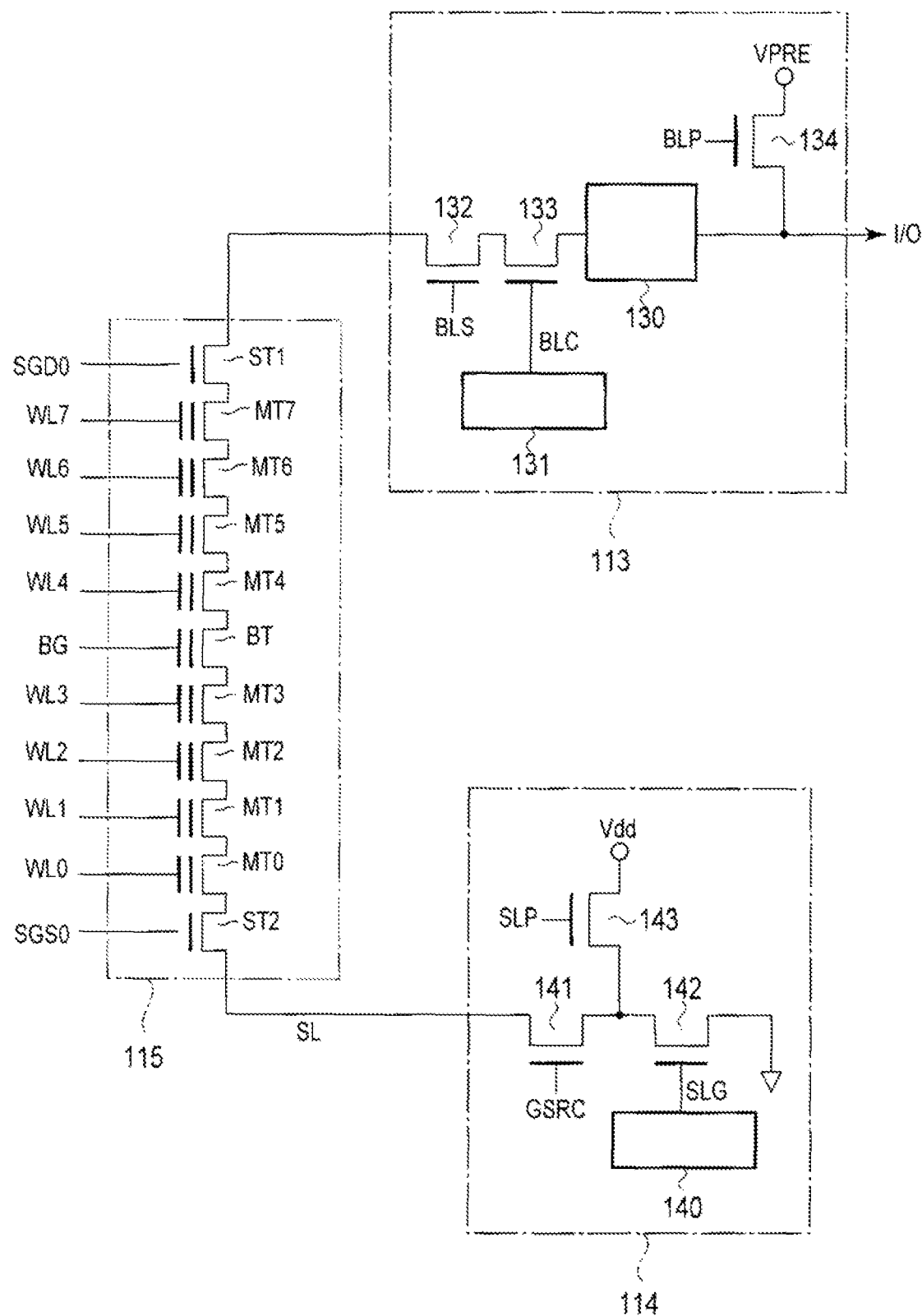
FIG. 6 is circuit diagrams of a sense amplifier and a source line control circuit according to the first embodiment.

Next, a configuration of the sense amplifier 113 will be described with reference to FIG. 6. FIG. 6 is circuit diagrams of the sense amplifier 113 and the source line control circuit 114 corresponding to any one NAND string 115 (one bit line BL). The sense amplifier 113 has the configuration illustrated in FIG. 6 for each bit line, and the source line control circuit 114 has the configuration illustrated in FIG. 6 with respect to the plurality of source lines SL.

As illustrated in the drawing, the sense amplifier 113 includes a sense amplifier unit 130, a regulator 131, and n-channel MOS transistors 132 to 134.

In the transistor 132, a signal BLS is applied to a gate, one end of a current path is connected to the bit line BL, and the other end is connected to one end of a current path of the transistor 133. The transistor 132 functions as a switch for connecting the bit line BL to the sense amplifier unit 130 through the transistor 133. Accordingly, when an erasing operation is not performed and the corresponding bit line BL is selected, a voltage of the signal BLS is set to, for example, approximately 7 V to 8 V (voltage capable of sufficiently setting the transistor 132 to be in an on-state).

In the transistor 134, a signal BLP is applied to a gate and a precharge voltage VPRE is applied to a drain. The transistor 134 precharges the bit line BL through the sense amplifier unit 130 and the transistors 132 and 133 during data reading.

The regulator 131 regulates, for example, a power supply voltage to generate a signal BLC having a voltage of a predetermined value. The voltage value of the signal BLC is determined by, for example, a command of the sequencer 121.

In the transistor 133, the signal BLC is applied to a gate, one end of a current path is connected to the bit line BL through the transistor 132, and the other end is connected to a source of the transistor 134 through the sense amplifier unit 130. The transistor 133 sets a voltage of the bit line BL to be a desired value in response to the signal BLC, for example, during reading.

The sense amplifier unit 130 detects changes in a current flowing through the bit line BL or changes in the voltage of the bit line BL during data reading to sense and amplify data which is read out to the bit line BL. The amplified data is temporarily held in a latch circuit within the sense amplifier unit 130, and is then output to the outside (memory controller 200) by an input/output circuit not illustrated in the drawing. In addition, the sense amplifier unit temporarily holds writing data supplied from the memory controller 200 during data writing, and applies a voltage based on the writing data to the bit line BL through the transistors 132 and 133.

1.1.2.4 Regarding Configuration of Source Line Control Circuit 114

Next, a configuration of the source line control circuit 114 will be described subsequently with reference to FIG. 6. As illustrated in the drawing, the source line control circuit 114 includes a regulator 140 and n-channel MOS transistors 141 to 143.

In the transistor 141, a signal GSRC is applied to a gate, one end of a current path is connected to the source line SL, and the other end is connected to one ends of current paths of the transistors 142 and 143. The transistor 141 functions as a switch for connecting the source line SL to the transistors 142 and 143. Accordingly, when the source line SL is selected, a voltage of the signal GSRC is set to, for example, approximately 7 V to 8 V (voltage capable of sufficiently setting the transistor 141 to be in an on-state).

In the transistor 143, a signal SLP is applied to a gate and, for example, a power supply voltage Vdd (for example, 3 V) is applied to the other end (drain) of a current path. The transistor 143 transmits a voltage to the source line SL through the transistor 141 during data reading, erasing, and the like.

The regulator 140 regulates, for example, a power supply voltage to generate a signal SLG having a voltage of a predetermined value. The voltage value of the signal SLG is determined by, for example, a command of the sequencer 121.

In the transistor 142, the signal SLG is applied to a gate, and the other end of a current path is grounded (0 V). The transistor 142 grounds the source line SL, for example, during reading. At this time, a current driving force of the transistor 142 is determined by the signal SLG. Accordingly, when the transistor 143 is turned on, a potential of the source line SL is determined by a balance between the power supply voltage Vdd transmitted by the transistor 143 and strength with which the source line SL is grounded in response to the signal SLG. In addition, when the transistor 143 is turned off, 0 V is supplied to the source line SL by the transistor 142.

1.1.3 Regarding Data Write Operation

Figure 7:
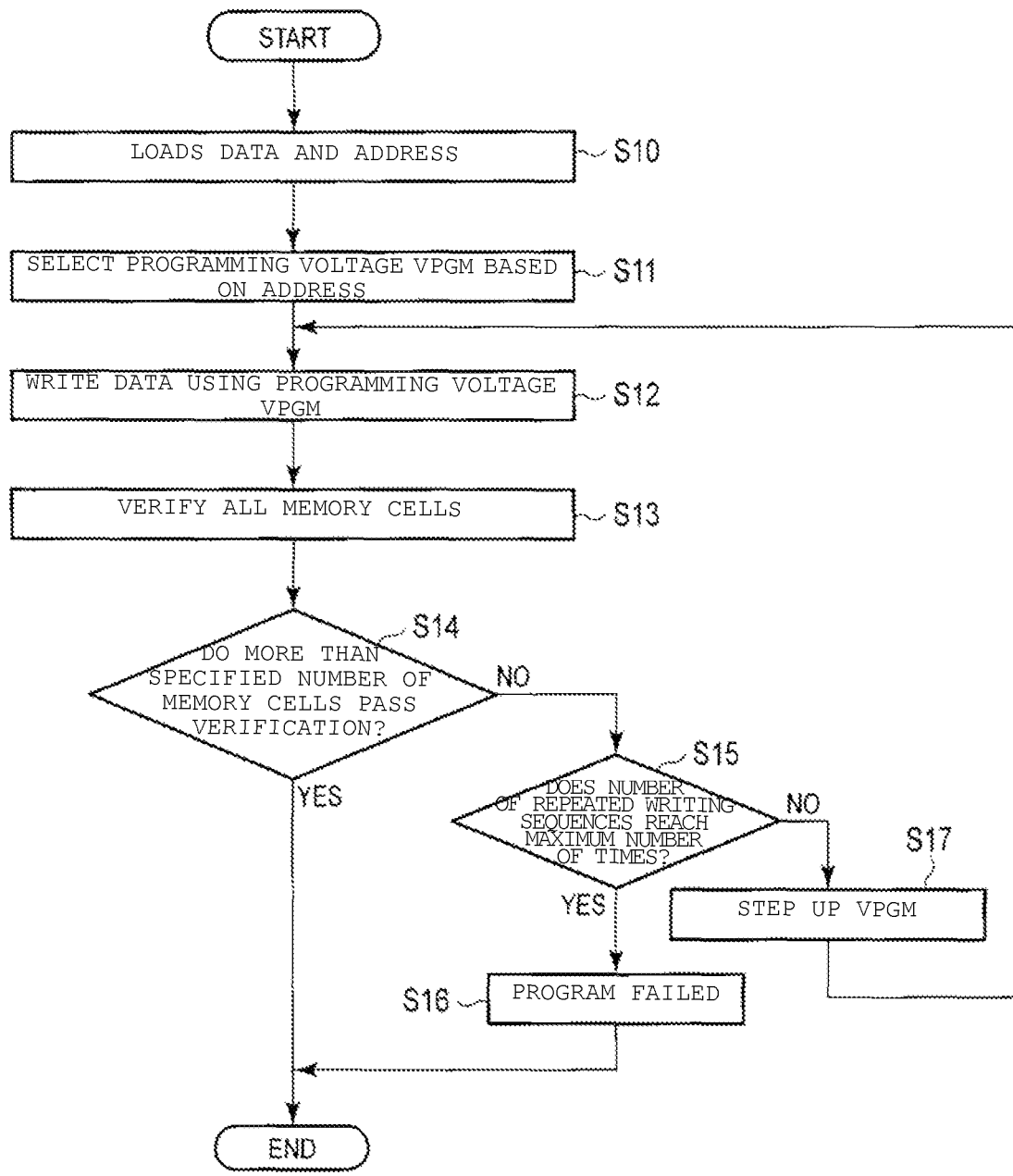
FIG. 7 is a flow chart illustrating a write operation according to the first embodiment.

Next, a write operation according to this embodiment will be described. FIG. 7 is a flow chart illustrating a flow of the write operation according to this embodiment.

The write operation includes a programming operation for increasing a threshold voltage of a memory cell by injecting charges into the charge storage layer of the memory cell and a programming verifying operation for verifying a threshold voltage that is changed as a result of the programming operation. Data is written by repeating a set of these operations (referred to as a writing sequence). Meanwhile, processes illustrated in FIG. 7 are mainly executed under the control of the sequencer 121.

As illustrated in the drawing, the NAND-type flash memory 100 first loads data and an address signal from the controller 200. The data is held in the sense amplifier 113, and the address signal is input to the sequencer 121 (step S10).

Next, the sequencer 121 selects an appropriate programming voltage VPGM based on the address signal, and commands the charge pump 122 to perform the selection result. The charge pump 122 generates the appropriate programming voltage VPGM in response to the command of the sequencer 121 and supplies the voltage to the driver 124 (step S11).

Figure 8:
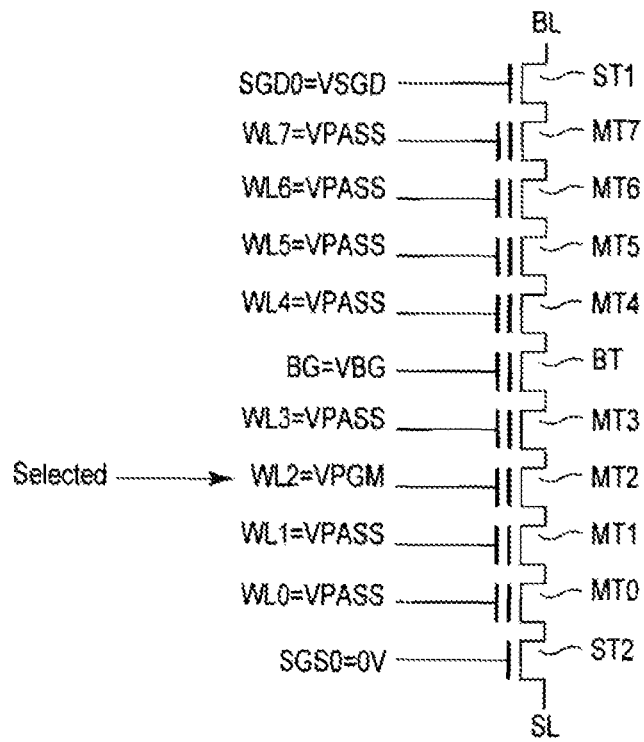
FIG. 8 is a circuit diagram of a NAND string according to the first embodiment.

Next, the row decoder 112 selects the word line WL in response to the command of the sequencer 121 and applies the programming voltage VPGM to the selected word line WL. Further, the sense amplifier 113 applies a voltage to the bit line BL. Thus, the data loaded in step S10 is programmed in units of pages in the memory cell transistor (step S12). The state of step S12 is illustrated in FIG. 8. FIG. 8 is a circuit diagram of the NAND string 115. As illustrated in the drawing, a voltage VPASS is applied to the unselected word lines, and VPGM is applied to the selected word line. The voltage VPASS is a voltage for turning on the memory cell transistor MT, regardless of holding data, and the voltage VPGM is a high voltage for injecting charges into the charge storage layer by FN tunneling (VPGM>VPASS). A voltage VBG for turning on the transistor BT is applied to the back gate line BG. Further, a voltage VSGD and 0 V are applied to the select gate lines SGD and SGS, respectively. The voltage VSGD is a voltage for turning on the select transistor ST1 corresponding to the selected bit line (0 V) and for cutting off the select transistor ST1 corresponding to the unselected bit line (V1>0 V).

Figure 9:
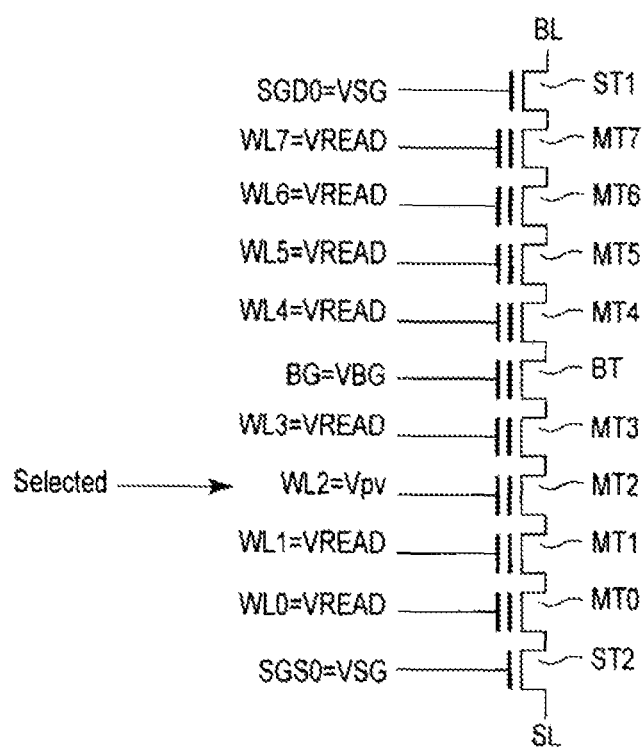
FIG. 9 is a circuit diagram of a NAND string according to the first embodiment.

Next, the charge pump 122 generates a verification voltage in response to the command of the sequencer 121. Then, the row decoder 112 applies the verification voltage to the selected word line WL to execute a programming verifying operation (step S13). That is, for example, the sense amplifier 113 reads out data from a selected page in response to the command of the sequencer 121. Then, the sequencer 121 verifies whether a threshold value of the memory cell transistor MT is increased up to a desired value, based on the reading data. Hereinafter, a case where the threshold value of the memory cell transistor MT is increased up to the desired value will be referred to as "passing" the verification, and a case where the threshold value is not increased will be referred to as "failing in" the verification. The state of step S13 is illustrated in FIG. 9. FIG. 9 is a circuit diagram of the NAND string 115. As illustrated in the drawing, a voltage VREAD is applied to unselected word lines, and a programming verification voltage Vpv is applied to a selected word line. The voltage VREAD is a voltage for turning on the memory cell transistor MT, regardless of holding data, and the voltage Vpv is a voltage based on data to be programmed (VREAD>Vpv). The voltage VBG is applied to the back gate line BG. Further, a voltage VSG is applied to the select gate lines SGD and SGS. The voltage VSG is a voltage for turning on the select transistors ST1 and ST2.

When more than a specified number of memory cells within a page pass the verification (step S14, YES), a write operation for the page is terminated. On the other hand, when the number of passed memory cells is less than the specified number, in other words, when there are too many failed memory cells (step S14, NO), the sequencer 121 determines whether the number of repeated writing sequences reaches a maximum number of times (step S15). If so, the write operation is terminated due to the failure in the programming (step S16). If not, the operation returns to the process of step S11. At this time, the sequencer 121 steps up the programming voltage VPGM (step S17).

Figure 10:
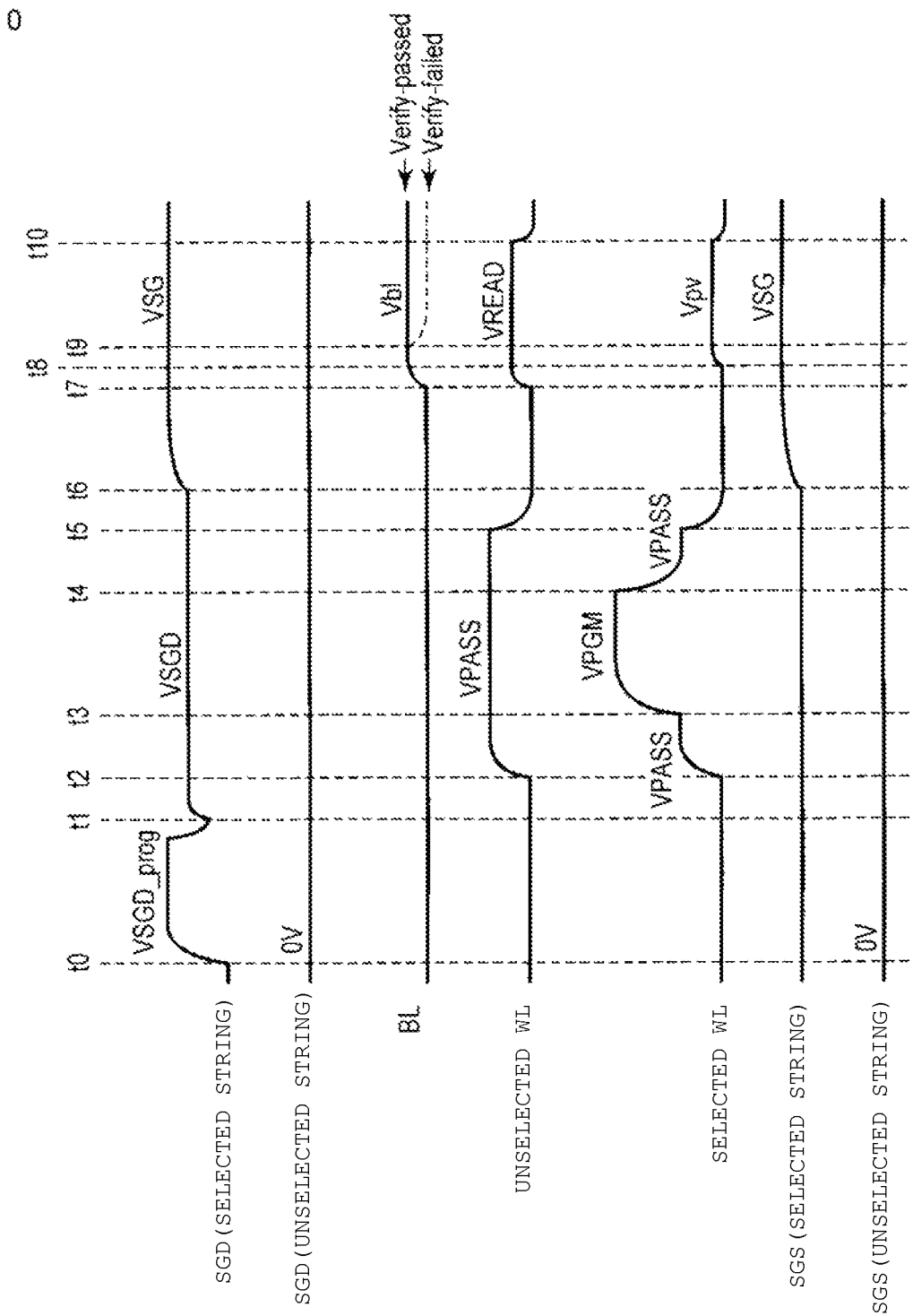
FIG. 10 is a timing chart during a write operation according to the first embodiment.

A state of change in the voltage of each wiring during the above-described write operation will be described with reference to FIG. 10. FIG. 10 is a timing chart illustrating changes in the voltage of each wiring and illustrates one writing sequence.

As illustrated in the drawing, the row decoder 112 applies a voltage VSGD_prog (>VSGD) to the select gate line SGD of the selected string unit at time t0. The voltage VSGD_prog is a voltage for turning on the select transistor ST1.

The sense amplifier 113 applies 0 V to the bit line BL which have not yet passed the programming verification, and applies a voltage V1 to the bit line BL and the unselected bit line BL which have already passed the programming verification (not illustrated). The select transistor ST1 transmits these voltages from the drain to the source.

Subsequently, the row decoder 112 lowers a potential of the select gate line SGD to VSGD at time t1. Thus, the select transistor ST1, which corresponds to the bit line BL and the unselected bit line BL which have already passed the verification, is cut off.

Then, the row decoder 112 applies the voltage VPASS to the selected word line, the unselected word line, and the back gate line BG (time t2). Thereafter, a potential of the selected word line rises to VPGM, and thus a programming operation is executed.

On the other hand, in the NAND string corresponding to the bit line BL and the unselected bit line BL which have already passed the verification, the select transistor ST1 is in a cut-off state, and thus the channel is electrically in a floating state. As a result, a potential of the channel rises due to coupling with the word line, and thus the programming is prohibited.

Thereafter, the sequencer 121 executes a programming verifying operation. That is, the row decoder 112 lowers a potential of the word line WL to 0 V and applies the voltage VSG to the select gate lines SGD and SGS in the selected string unit SU to thereby turn on the select transistors ST1 and ST2 (time t6).

Subsequently, the row decoder 112 applies the verification voltage Vpv to the selected word line and applies the voltage VREAD to the unselected word line. Then, the sense amplifier 113 senses and amplifies data which is read out to the bit line BL. The sequencer 121 determines whether writing for the selected page is completed (in other words, whether the verification is passed) in accordance with the reading result. When the writing is not completed, the programming operation for the selected page is repeated.

1.1.4 Regarding Programming Voltage VPGM

Next, the programming voltage VPGM applied to the selected word line WL during the above-described programming operation will be described.

An initial value of the programming voltage VPGM according to this embodiment becomes smaller as the word line WL having the voltage applied thereto approaches the lower layer, and becomes larger as the word line WL having the voltage applied thereto approaches the upper layer. In other words, the programming voltage VPGM applied to the word line WL becomes higher as the diameter of the memory hole to penetrate the word line increases, and the programming voltage applied to the word line WL becomes lower as the diameter of the memory hole decreases.

Figure 11:
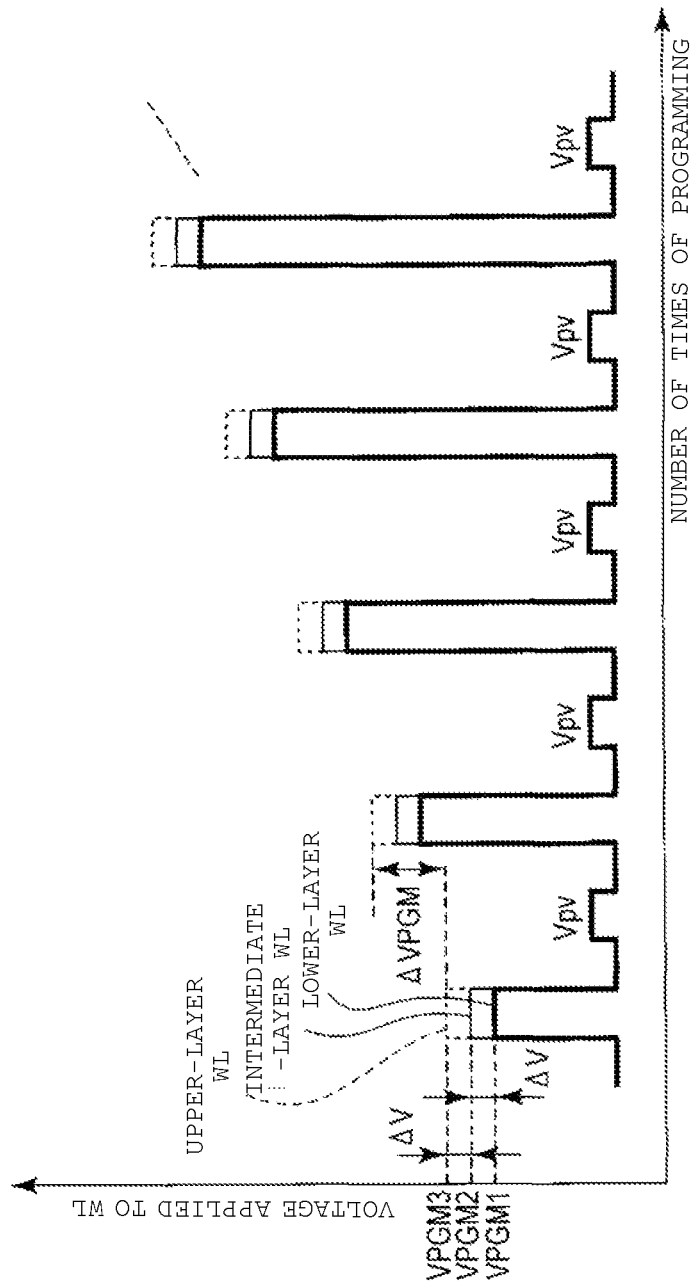
FIG. 11 is a timing chart of a word line voltage according to the first embodiment.

FIG. 11 is a timing chart of the programming voltage VPGM and the programming verification voltage Vpv which are applied to the selected word line WL during a write operation. As illustrated in the drawing, an initial value of the programming voltage VPGM applied to the word line WL located at the lower layer is VPGM1, an initial value of the programming voltage VPGM applied to the word line WL located at the intermediate layer is VPGM2 (=VPGM1+$\Delta$V), and an initial value of the programming voltage VPGM applied to the word line WL located at the upper layer is VPGM3 (=VPGM2+$\Delta$V). The programming voltage VPGM is stepped up by $\Delta$VPGM with every repetition of a writing sequence. Accordingly, when comparison is performed using the same number of wiring sequences, VPGM (for example, approximately 17 V to 20 V) which is applied to the word line WL located at the upper layer is always higher than VPGM (for example, approximately 13 V to 15 V) which is applied to the word line WL located at the lower layer.

Figure 12:
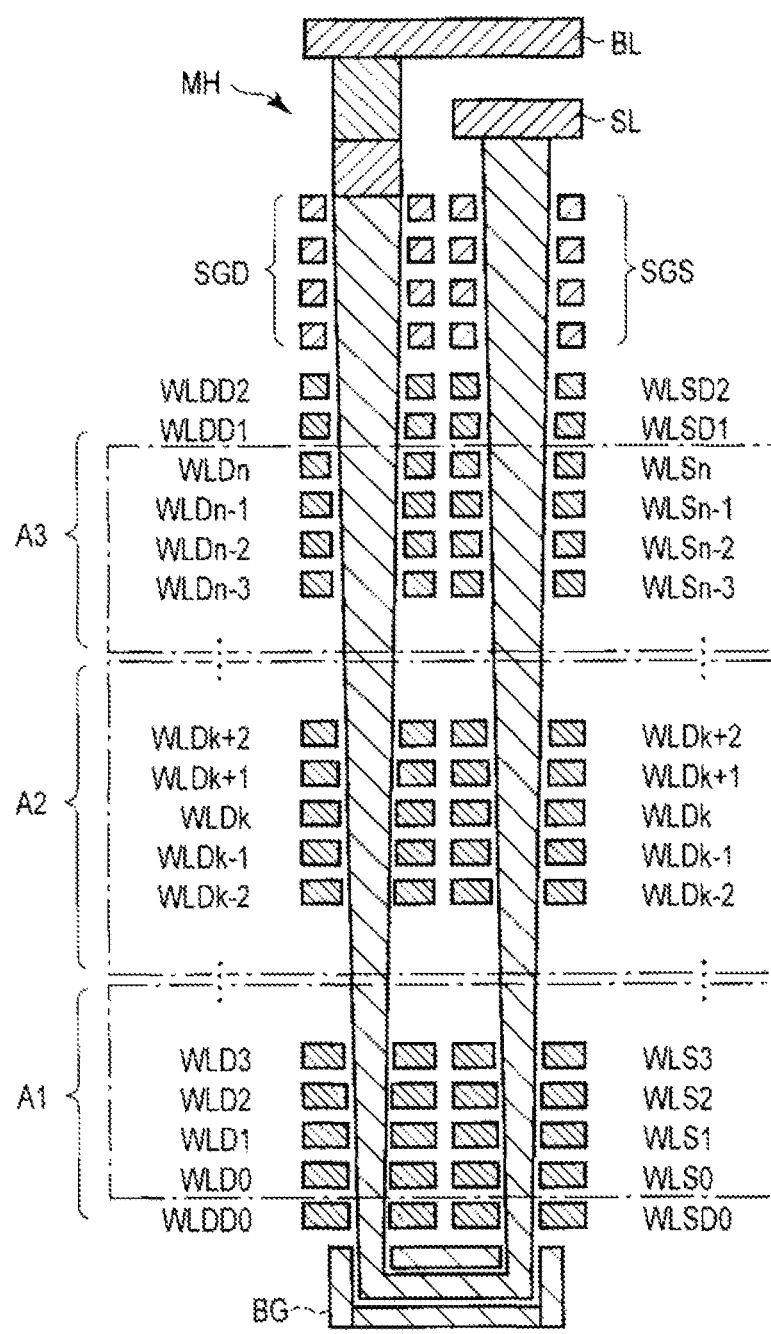
FIG. 12 is a cross-sectional view of an example of a NAND string according to the first embodiment.

Next, an example of the programming voltage VPGM will be described in detail. FIG. 12 is a more detailed cross-sectional view of the NAND string 115.

As illustrated in the drawing, the NAND string 115 has (n+1)-layered word lines which are stacked on the bit line BL side and the source line SL side. Here, n is a natural number equal to or greater than 1. A dummy word line WLDD0, word lines WLD0, WLD1, . . . , WLDk–2, WLDk–1, WLDk, WLDk+1, WLDk+2, . . . , WLDn–3, WLDn–2, WLDn–1, and WLDn, and dummy word lines WLDD1 and WLDD2 are sequentially stacked on the back gate BG on the bit line side. For example, four select gate lines SGD are stacked on the dummy word line WLDD2. The four select gate lines SGD are electrically connected in common and are equivalent to one select transistor ST1. Further, the bit line BL is disposed above the select gate line SGD, and the bit line BL is electrically connected to the semiconductor layer within the memory hole MH.

A dummy word line WLSD0, word lines WLS0, WLS1, . . . , WLSk–2, WLSk–1, WLSk, WLSk+1, WLSk+2, . . . , WLSn–3, WLSn–2, WLSn–1, and WLSn, and dummy word lines WLSD1 and WLSD2 are sequentially stacked on the back gate BG on the source line side. Four select gate lines SGS are stacked on the dummy word line WLSD2. The four-layered select gate lines SGS are electrically connected in common and are equivalent to one select transistor ST2. Further, the source line SL is disposed above the select gate line SGS, and the source line SL is electrically connected to the semiconductor layer within the memory hole MH.

In FIG. 12, the (n+1)-layered word lines WL belong to regions A1, A2, and A3 in order from the lower layer. The numbers of layers of the word lines WL included in the respective regions A1, A2, and A3 are a1, a2, and a2, all of which are natural numbers equal to or greater than 2 (a1+a2+a3=(n+1)).

Figure 13:
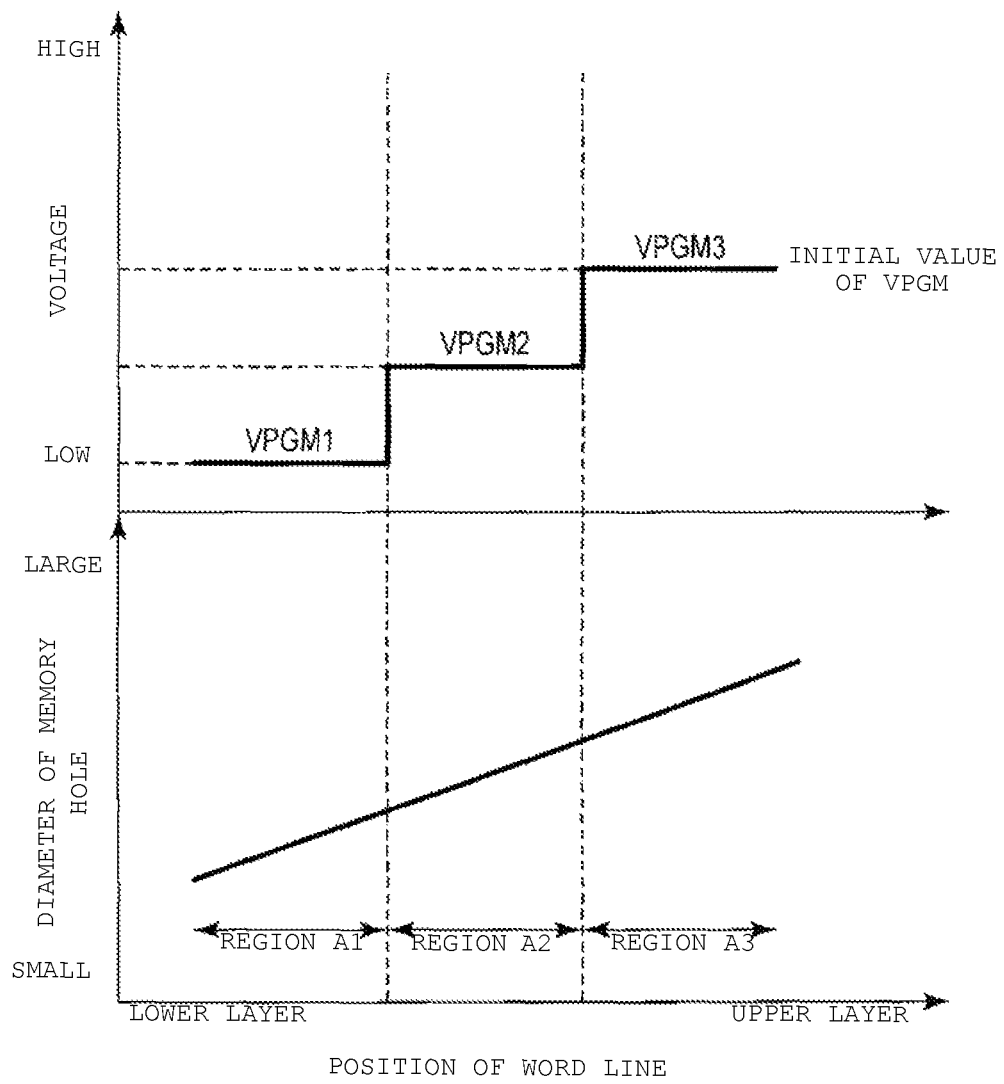
FIG. 13 is a graph illustrating a relationship between the diameter of a memory hole and a programming voltage, with respect to a position of a word line according to the first embodiment.

FIG. 13 is a graph illustrating a relationship between the diameter of the memory hole and the initial value of the programming voltage VPGM, with respect to positions (regions A1 to A3) of the word lines WL.

As described above, the diameter $D_{MH}$ of the memory hole becomes larger as the word line WL penetrated by the memory hole approaches the upper layer, and the diameter becomes smaller as the word line WL penetrated by the memory hole approaches the lower layer. The row decoder 112 sets initial values of the programming voltages VPGM applied to the word lines WL in the regions A1, A2, and A3 to VPGM1, VPGM2, and VPGM3, respectively. Then, a relationship of VPGM1>VPGM2>VPGM3 is established between the initial values. That is, the row decoder 112 sets a larger initial value of the programming voltage VPGM as the word line approaches the upper layer side, and sets a smaller initial value of the programming voltage as the word line approaches the lower-layer side. In other words, the row decoder 112 applies a higher programming voltage VPGM to the word line having a larger diameter $D_{MH}$ of the memory hole, and applies a lower programming voltage VPGM to the word line having a smaller diameter $D_{MH}$ of the memory hole. The diameter $D_{MH}$ of the memory hole may be replaced with a transistor size of the memory cell.

1.3 Effects according to First Embodiment

As described in FIGS. 4 and 12, the memory hole MH has a taper shape in which the diameter $D_{MH}$ gradually decreases from the upper layer toward the lower layer. That is, the diameter of the memory hole MH located at the lower layer is smaller than the diameter of the memory hole MH located at the upper layer.

This is because the memory hole is formed by collectively etching the word lines WL stacked into a plurality of layers. As the depth of the memory hole MH increases, such a tendency becomes more pronounced.

Then, when the same voltage is supplied to the word lines, a weaker electric field is applied in the semiconductor layer located at a position having a large diameter of the memory hole MH, as compared with the semiconductor layer located at a position having a small diameter of the memory hole MH. For this reason, a channel is not likely to be formed in the memory cell transistor disposed at a location having a large diameter of the memory hole MH, as compared with the memory cell transistor disposed at a position having a small diameter of the memory hole MH. In other words, data is not likely to be programmed as the memory cell transistor approaches the upper layer, and there is a tendency for data to be programmed as the memory cell transistor approaches the lower layer.

In this embodiment, an initial value of the programming voltage VPGM applied to the selected word line is set to gradually decrease from the upper-layer side toward the lower-layer side, that is, as the diameter of the memory hole MH decreases, in consideration of such layer dependence of the memory cell transistor. That is, the initial value of the programming voltage VPGM applied to the memory cell located at the lower layer is set to be lower than the initial value of the programming voltage VPGM applied to the memory cell located at the upper layer. Thus, it is possible to execute a write operation with an appropriate programming voltage VPGM with respect to the memory cells on the upper-layer side and the lower-layer side, thereby allowing the write operation to be speeded up.

Figure 14:
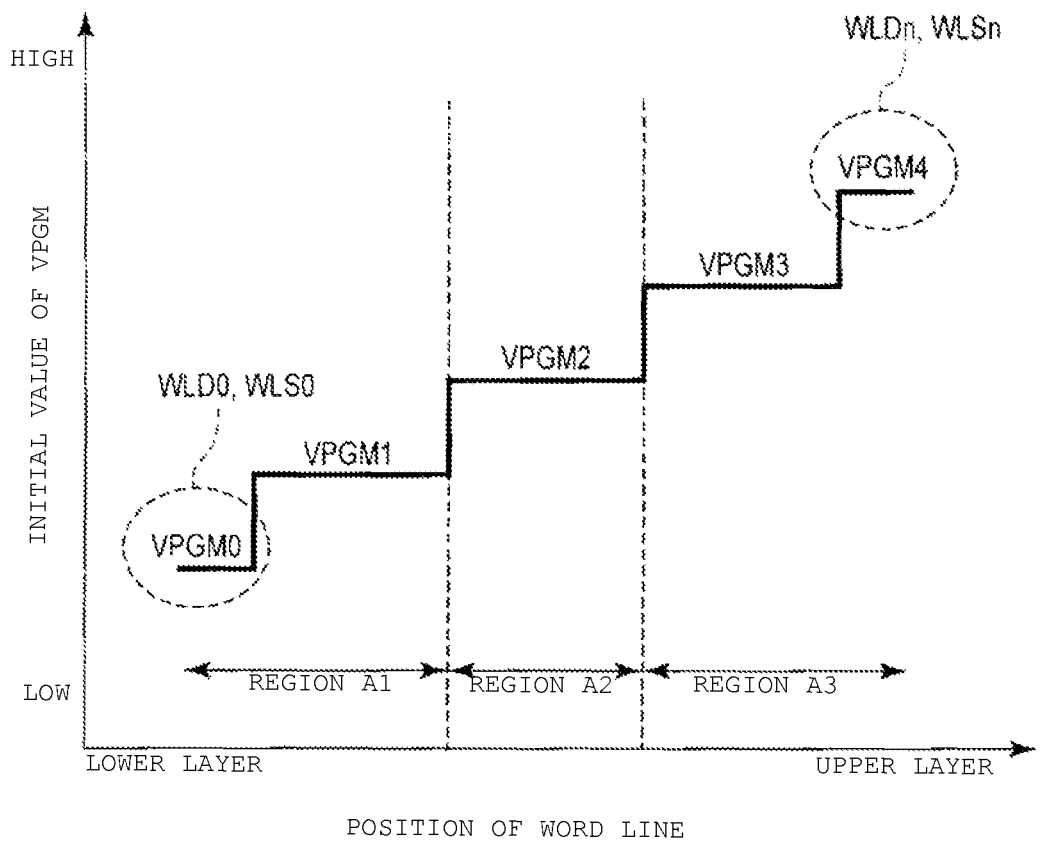
FIG. 14 is a graph illustrating a relationship of a programming voltage to the position of a word line according to the first embodiment.

Meanwhile, the initial value of the programming voltage VPGM is not limited to the relationship of FIG. 13. FIG. 14 is a graph illustrating a relationship between the position (layer) of the word line WL and the initial value of VPGM. As illustrated in the drawing, an initial value of VPGM applied to the word lines WLDn and WLSn located at the uppermost layer in a region A3 may be different from an initial value of VPGM applied to other word lines within the region A3 (although the value is set to be a large value in the example of FIG. 14 (VPGM4), is not limited thereto). Similarly, an initial value of VPGM applied to the word lines WLD0 and WLS0 located at the lowermost layer in a region A1 may be different from an initial value of VPGM applied to other word lines within the region A1 (the value is set to be a small value in the example of FIG. 14 (VPGM0), but is not limited thereto).

Further, in FIGS. 12 to 14, an example in which the NAND string is divided into three regions A1 to A3 is described. However, the NAND string may be divided into two regions or may be divided into four or more regions, and is not limited thereto.

2. Second Embodiment

Next, a semiconductor memory device according to a second embodiment will be described. This embodiment relates to a case where one memory cell transistor may hold more than two bits of data (multi-level cell (MLC)) in the above-described first embodiment. Hereinafter, only differences from the first embodiment will be described.

2.1 Regarding Threshold Distribution of Memory Cell Transistor

Figure 15:
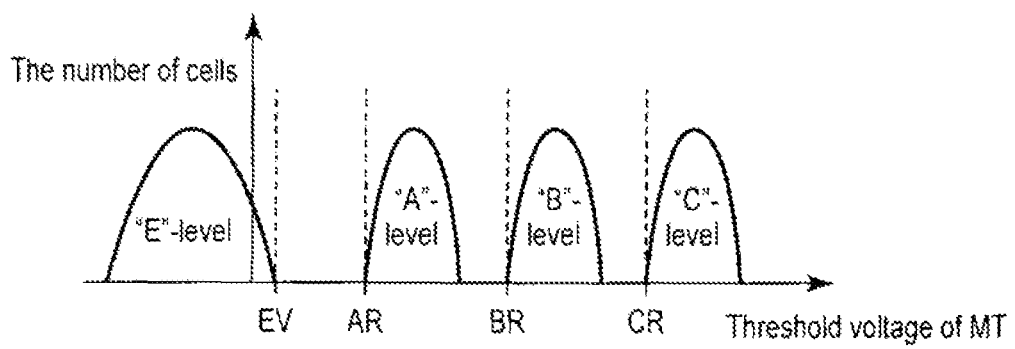
FIG. 15 is a graph illustrating the threshold distribution of an example of a memory cell according to a second embodiment.

The threshold distribution of the memory cell transistor according to this embodiment is illustrated in FIG. 15. As illustrated in the drawing, the memory cell transistor MT according to this embodiment may hold, for example, two bits of data in accordance with the threshold value. The two bits of data is, for example, an "E" level, an "A" level, a "B" level, and a "C" level in the ascending order of threshold value. The "A" to "C" levels are threshold values in a state where charges are injected into a charge storage layer. The "A" level has a threshold value which is higher than a reading level "AR" and lower than a reading level "BR". The "B" level has a threshold value which is higher than a reading level "BR" and lower than a reading level "CR". The "C" level has a threshold value which is higher than a reading level "CR".

In this manner, the individual memory cell transistor MT may store two bits of data (4-layer data) because it is able to hold four threshold value levels.

Figure 16:
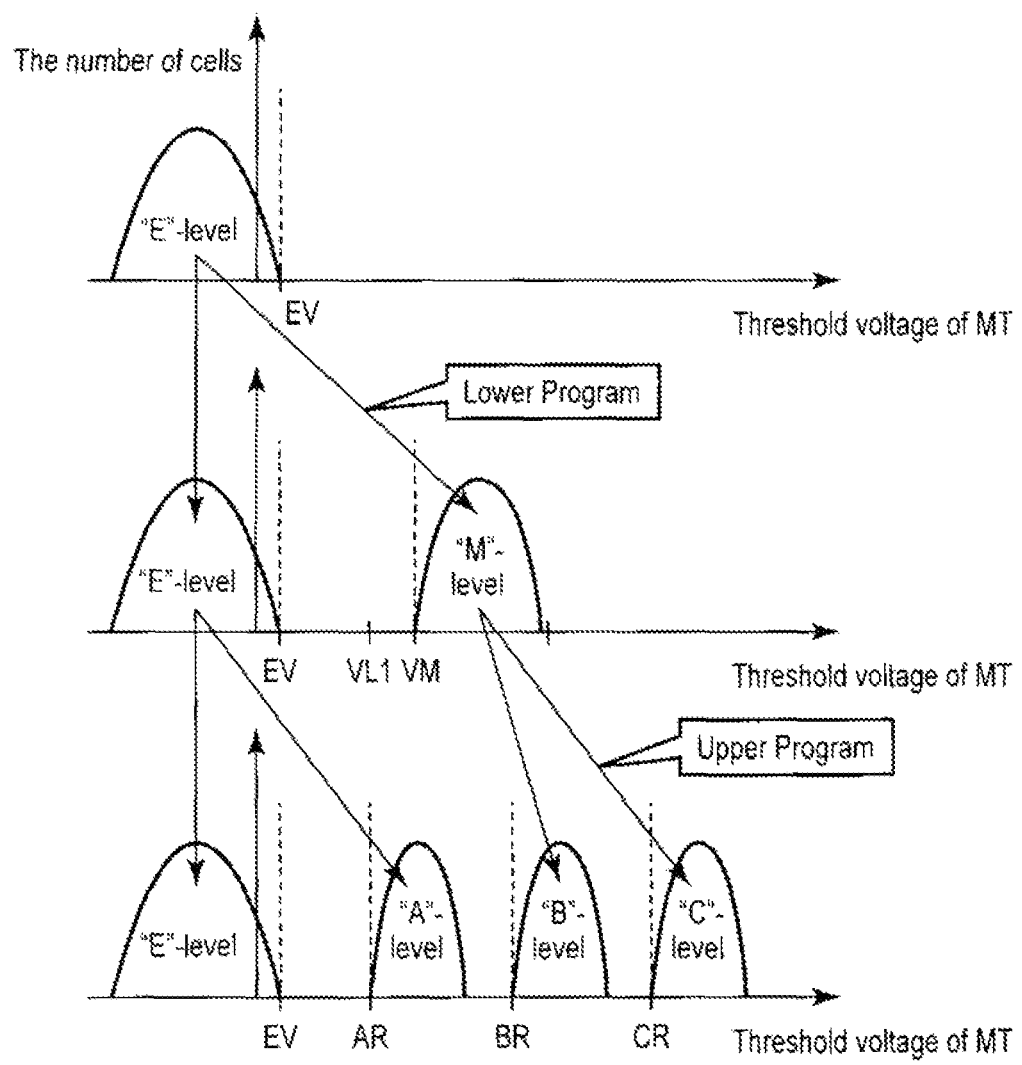
FIG. 16 is a graph illustrating changes in threshold distribution during writing according to the second embodiment.

FIG. 16 is a graph illustrating changes in threshold distribution during data writing. Regarding the memory cell transistor which is in an erasing state, the lower bit data in two bits of data is first programmed (Lower program). Thus, a threshold value of the memory cell transistor MT to write data of a "B" level or a "C" level rises up to an "M" level. The "M" level has a threshold value which is larger than a voltage VM, and is a value in a range of, for example, higher than "AR" and lower than "CR".

Next, the upper bit data is programmed (Upper program). Thus, a threshold value of each memory cell transistor MT is set to be a desired value. Meanwhile, both the lower bit programming and the upper bit programming are performed in units of pages.

2.2 Regarding Write Operation of Data

Figure 17A:
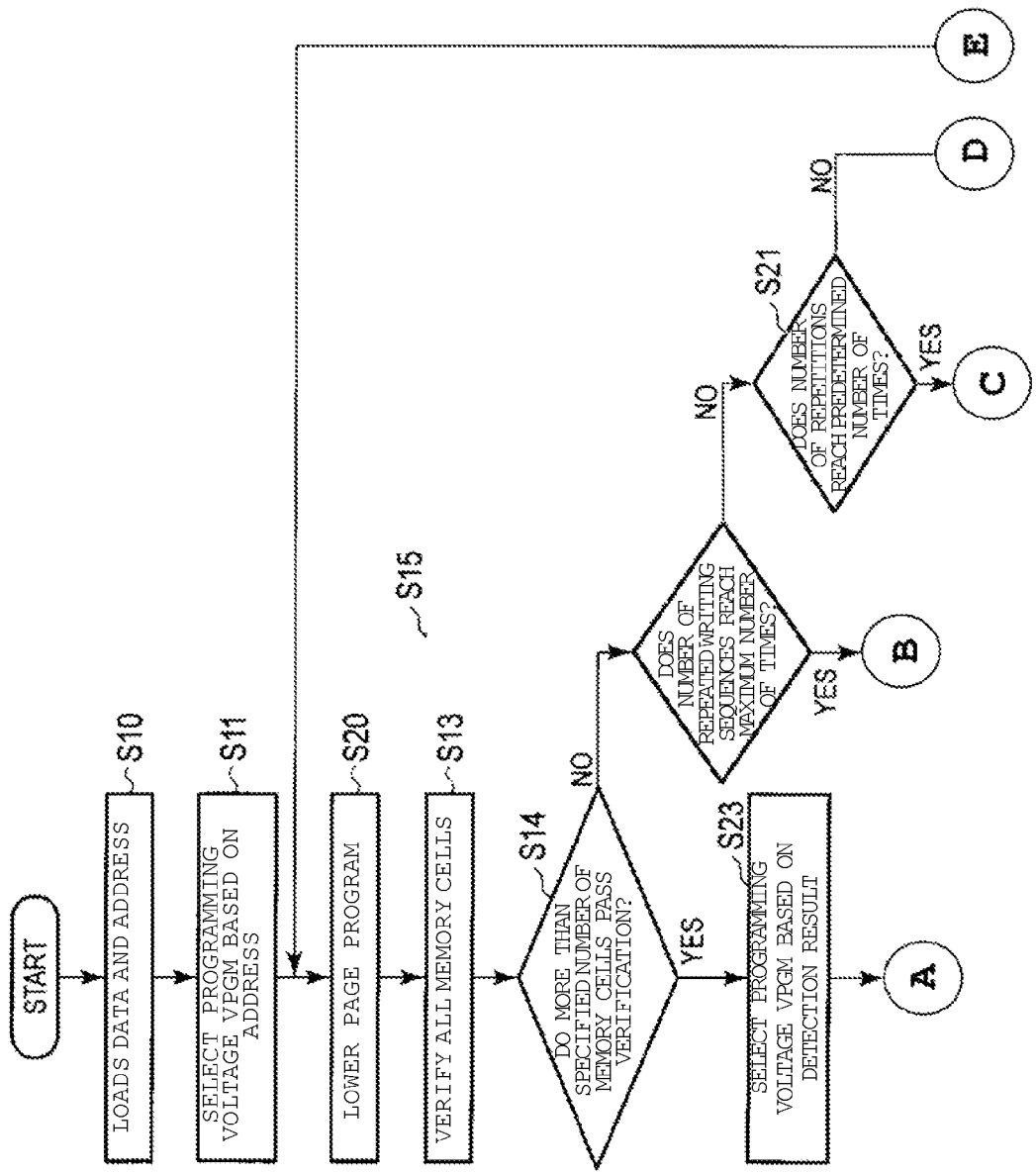
FIGS. 17A and 17B are flow charts of a write operation according to the second embodiment.
Figure 17B:
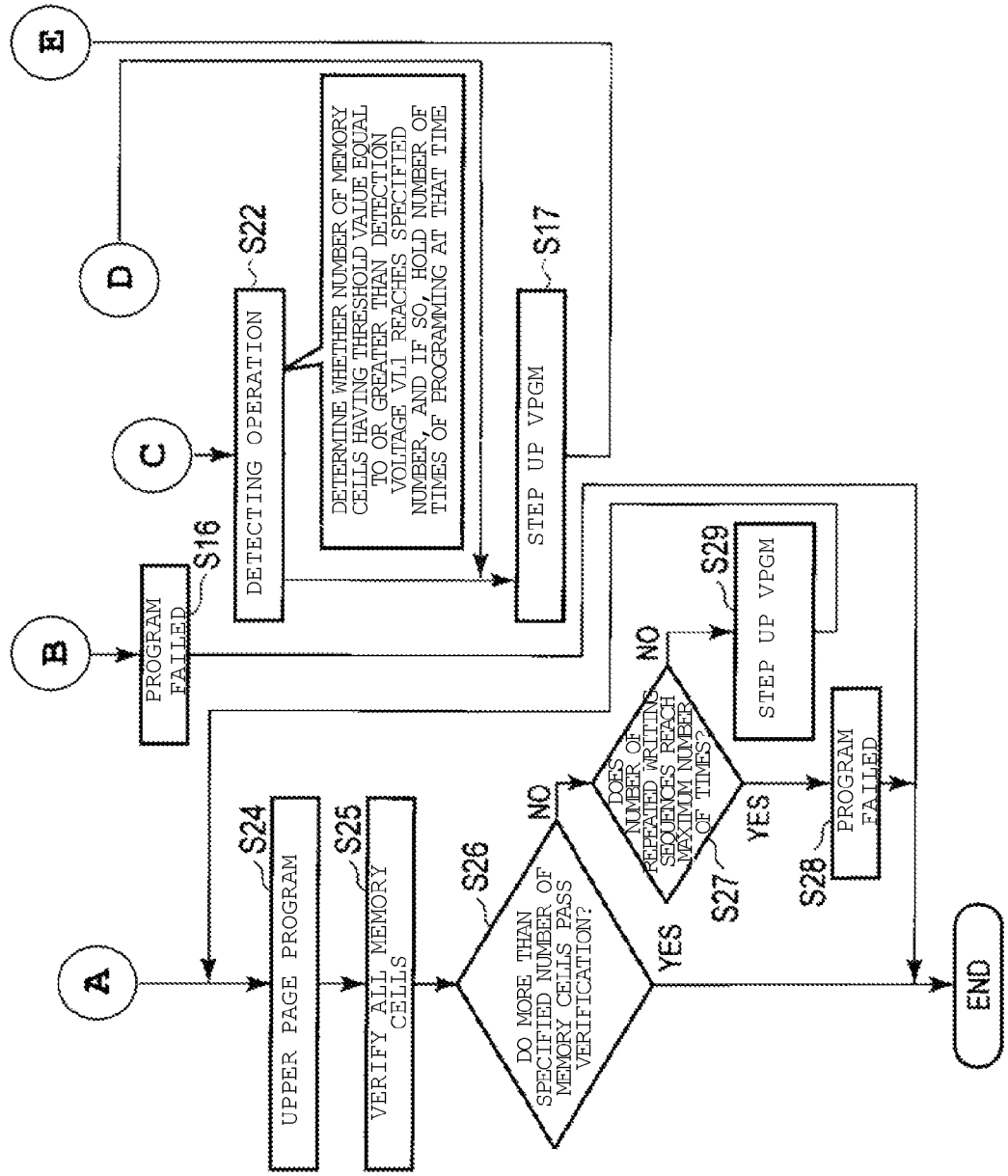

Next, a write operation according to this embodiment will be described. FIGS. 17A and 17B are flow charts illustrating a flow of a write operation of two bits of data according to this embodiment, and corresponds to FIG. 7 described in the first embodiment.

The write operation includes a repetition of a set of a lower page program and the programming verification thereof, a detecting operation having a cell characteristic based on the lower page program, and a repetition of a set of the subsequent upper page program and the programming verification thereof. Meanwhile, a process illustrated in FIGS. 17A and 17B is mainly executed under the control of a sequencer 121.

As illustrated in the drawing, the lower page program is performed after steps S10 and S11 (step S20). VPGM used in the lower page program has layer dependence as described in the first embodiment described above, and thus is set to be a higher value as the word line approaches the upper layer.

Subsequently, steps S13 to S16 are executed. A verification level Vpv used in step S13 is, for example, the voltage VM described in FIG. 16. When the memory cells do not pass the verification in spite of reaching the maximum number of repetitions, the writing is terminated due to the failure in the program.

When the number of times does not reach the maximum number of repetitions (step S15, NO), the sequencer 121 determines whether the number of repetitions reaches a predetermined number of times (step S21). If not (step S21, NO), the operation proceeds to step S17 to repeat the lower page writing again.

When the number of repetitions reaches the predetermined number of times (step S21, YES), the sequencer 121 executes a detecting operation (step S22). In the detecting operation, a programming verifying operation using a detection voltage VL1, which is lower than a verification voltage in step S13, is performed. Then, the sequencer 121 counts the number of memory cell transistors having a threshold value equal to or greater than the detection voltage VL1 based on the result of the programming verifying operation, and determines whether the counted number reaches a predetermined number. When the number of repetitions reaches the predetermined number, the sequencer 121 causes the number of times of programming at the point in time to be held in, for example, a register 123 and the like.

After the detecting operation, the operation proceeds to step S17.

In step S14, when the memory cell transistors of more than a specified number pass the verification (step S14, YES), the sequencer 121 completes writing of the lower page data, and then executes writing of the upper page data.

That is, the sequencer 121 selects a programming voltage VPGM based on the detection result obtained in step S22, and commands a charge pump 122 to perform the selection result. The charge pump 122 generates an appropriate programming voltage VPGM in response to the command of the sequencer 121 and supplies the voltage to a driver 124 (step S23).

Next, the row decoder 112 selects a word line WL in response to the command of the sequencer 121, and applies the programming voltage VPGM to the selected word line WL. Further, a sense amplifier 113 applies a voltage to a bit line BL. Thus, the upper page data is programmed (step S24).

The subsequent processing is the same as that of the lower page writing, and upper page programming verification is performed (step S26). When the verification is passed (step S26, YES), the write operation is completed. On the other hand, when the verification fails (step S26, NO), the upper page program is repeated (step S24). When the number of times of program reaches a maximum number of repetitions, the write operation is terminated due to the failure in the program.

Voltages of wirings during the lower page writing are as illustrated in FIG. 10 described in the first embodiment, and, for example, the voltage VM is used as a verification voltage Vpv. The fact that the programming voltage VPGM has layer dependence is the same as that in the first embodiment.

Figure 18:
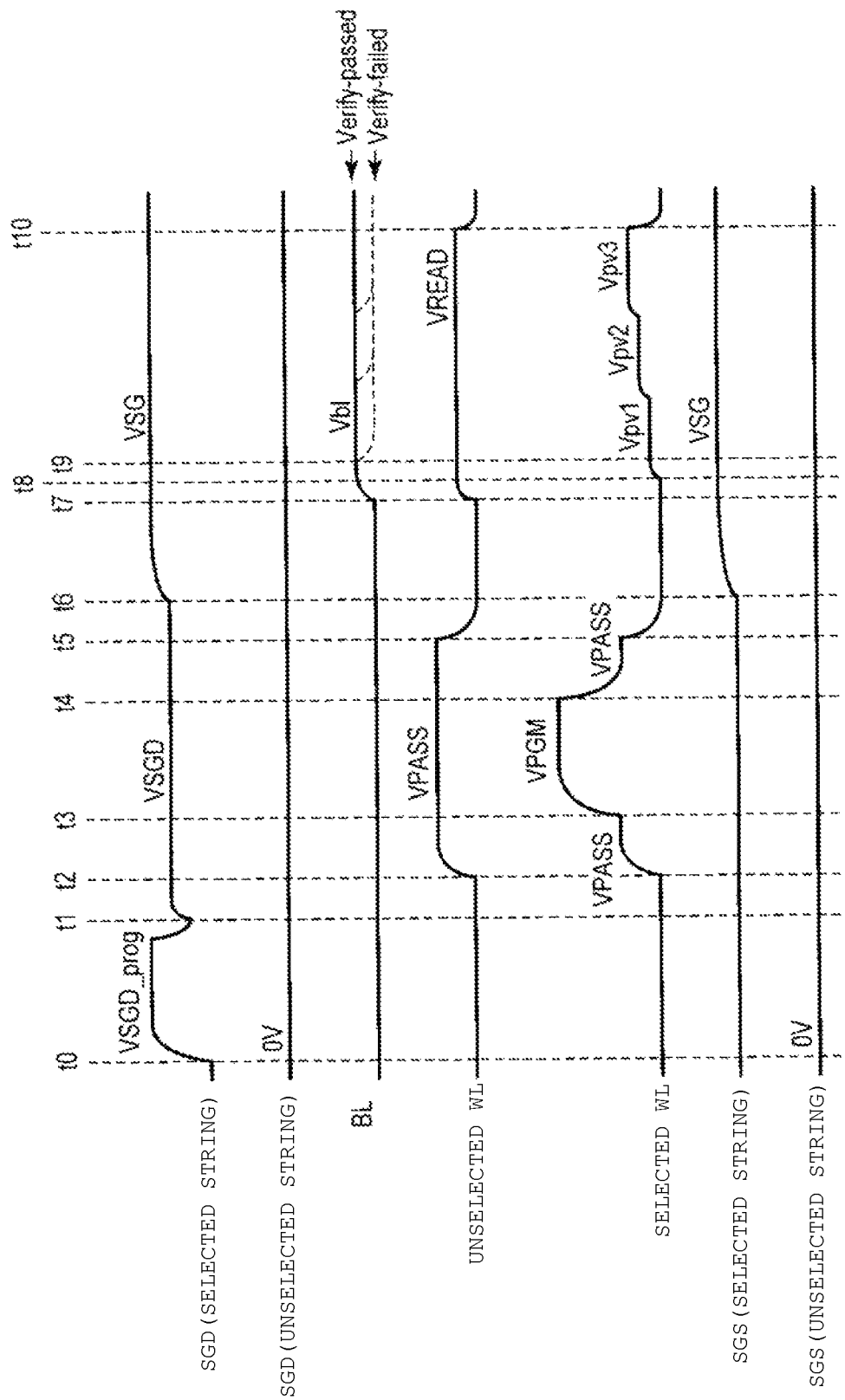
FIG. 18 is a timing chart during a write operation according to the second embodiment.

FIG. 18 illustrates voltages of wirings during the upper page writing. Differences from the lower page writing are in that the programming voltage VPGM is dependent upon a detecting operation result instead of upon a layer and that Vpv1, Vpv2, and Vpv3 are used as verification voltages. The verification voltages Vpv1, Vpv2, and Vpv3 correspond to, for example, "AR", "BR", and "CR" in FIG. 15.

Figure 19:
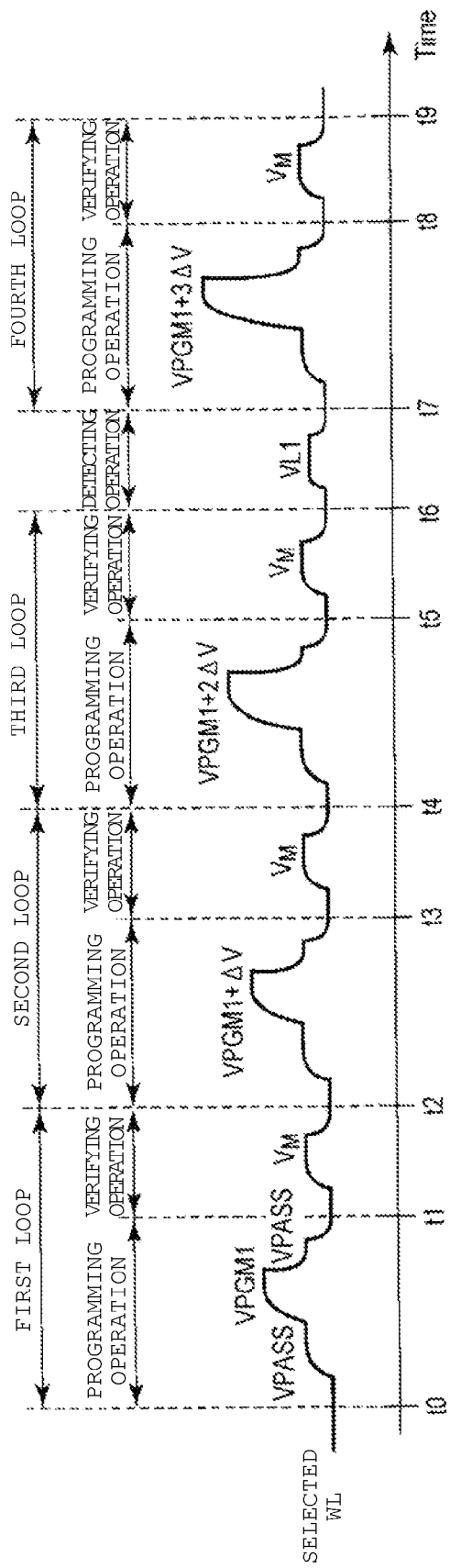
FIG. 19 is a timing chart during a write operation according to the second embodiment.

FIG. 19 is a timing chart illustrating changes in potential of a selected word line WL during the lower page writing, and illustrates a case where the word line WL located at a lower layer (region A1) is selected, as an example.

As illustrated in the drawing, a lower page program is performed using VPGM1 during a first program, and then programming verification is performed using a voltage VM (first loop). Thereafter, the same operation is repeated while a programming voltage is stepped up. When it is assumed that the predetermined number of repetitions in step S21 of FIG. 17A is "three times", a detecting operation is performed immediately after a third loop as illustrated in FIG. 19. That is, a programming verifying operation is executed using a detection voltage VL1. Thereafter, the lower page writing is subsequently repeated.

The meaning of the performing of the detecting operation will be described with reference to FIG. 20. FIG. 20 is a table illustrating the number of writing loops in which the number of memory cell transistors having a threshold value equal to or greater than the detection voltage VL1 is set to be equal to or greater than a specified number of times, characteristics of the memory cell transistors based on the number of times, and initial values of programming voltages VPGM used during the upper page program, in the detecting operation.

As illustrated in the drawing, the fact that threshold values of a large number of memory cell transistors reach VL1 with a small number of writing loops means a feature of having a tendency for the memory cell transistors within the corresponding page to be programmed (the threshold values are likely to rise or a program speed is high). In contrast, the fact that threshold values of a specified number of memory cell transistors do not reach VL1 when a writing loop is not executed over multiple times means a feature of having a tendency for the memory cell transistors within the corresponding page not to be programmed (the threshold values are not likely to rise or a program speed is low).

Accordingly, the initial value of the programming voltage VPGM is selected based on the above-described cell characteristics during the upper page program. That is, a relatively low voltage VPGM1' is used for a page which is likely to be programmed, a relatively high voltage VPGM3'(>VPGM1') is used for a page which is not likely to be programmed, and an intermediate voltage VPGM2' (provided VPGM1'<VPGM2'<VPGM3') is used for a page having an ordinary program speed.

The sequencer 121 or the register 123 holds at least a relationship between the number of writing loops and the initial value of VPGM in FIG. 20.

2.3 Regarding Detection Voltage VL1

Next, the detection voltage VL1 applied to the selected word line WL during the above-described detecting operation will be described.

The initial value of the detection voltage VL1 according to this embodiment becomes smaller as the word line WL having the voltage applied thereto approaches the lower layer, and becomes larger as the word line WL having the voltage applied thereto approaches the upper layer. In other words, the detection voltage VL1 applied to the word line WL becomes higher as the diameter of the memory hole to penetrate the word line increases, and the detection voltage applied to the word line WL becomes lower as the diameter of the memory hole decreases. That is, a relationship which is the same as the relationship between the programming voltage VPGM and the word line layer is established.

FIG. 21 is a graph illustrating a relationship between the diameter of the memory hole and the detection voltage VL1, with respect to the regions A1 to A3 described in FIG. 12.

As illustrated in the drawing, the row decoder 112 sets values of the detection voltage VL1 to be applied to the word lines WL in the regions A1, A2, and A3 to VL1-1, VL1-2, and VL1-3, respectively. Then, a relationship of VL1-1>VL1-2>VL1-3 is established between the values. Herein, each of VL1-1 to VL1-3 is a voltage smaller than VM.

2.4 Effects according to Second Embodiment

According to this embodiment, a detecting operation of determining characteristics of the memory cell transistor MT is performed during lower page writing. It is determined whether each page is a page having a tendency to be programmed, based on a result of the detecting operation. The magnitude of the programming voltage VPGM during upper page writing is determined based on the determination result. In other words, a low programming voltage VPGM is used for the page having a tendency to be programmed, and a high programming voltage VPGM is used for a page which is less likely to be programmed. Thus, it is possible to speed up a write operation.

At this time, according to this embodiment, a detection voltage to be applied to a selected word line WL is given layer dependence when performing the detecting operation. As described in the first embodiment, since the memory hole has a taper shape, characteristics (tendency to be programmed) of the memory cell transistor vary depending on a layer.

Consequently, in this embodiment, the detection voltage VL1 is appropriately set in accordance with the characteristics. Accordingly, it is possible to accurately obtain memory cell characteristics.

Meanwhile, the detecting operation method is not limited to that described in the above-described embodiment, and various changes may be made.

Figure 22:
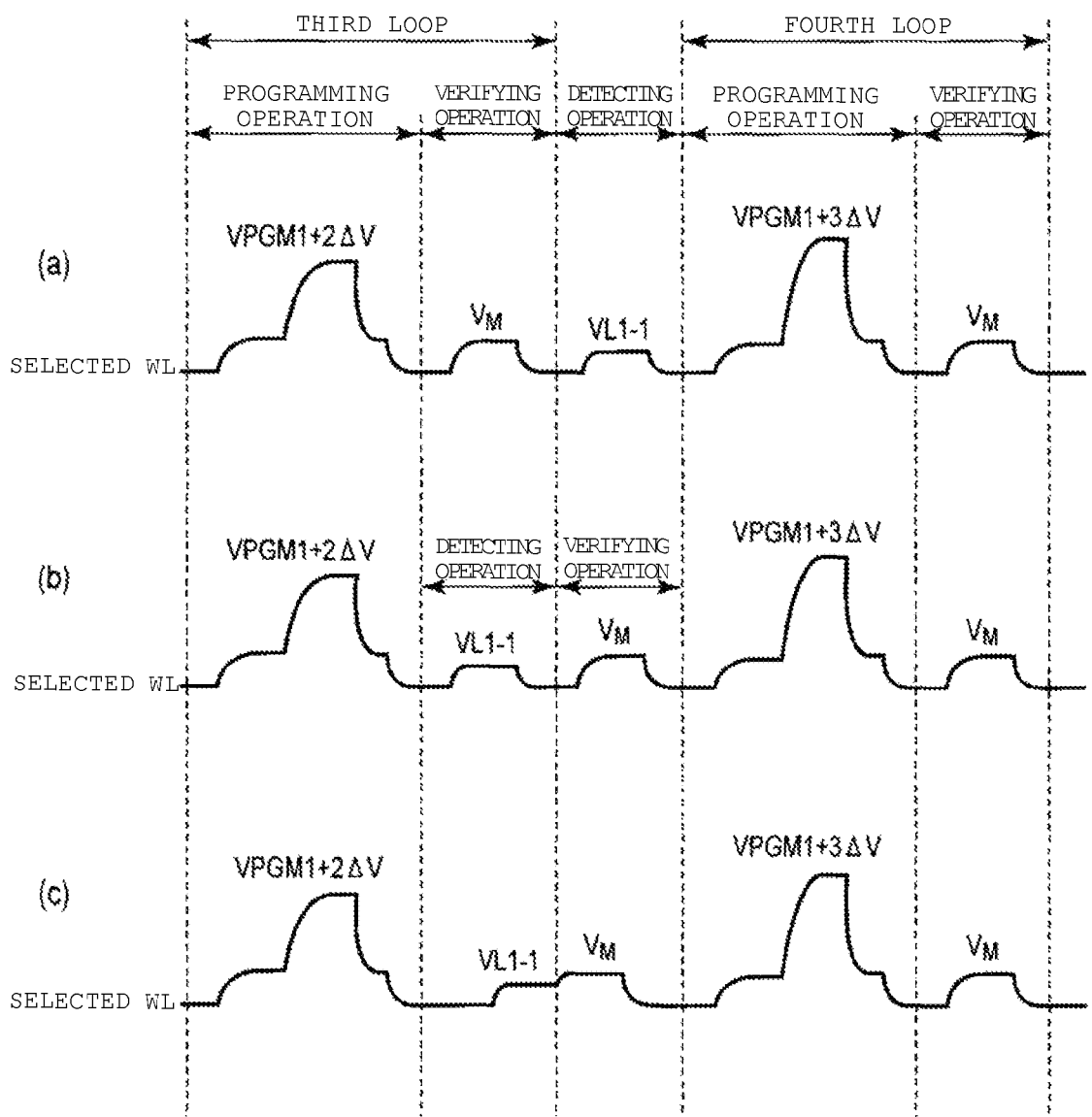
FIG. 22 is a timing chart during a write operation according to a modification example of the second embodiment.

FIG. 22 is a timing chart illustrating changes in potential of a selected word line WL, and illustrates a state from a third loop to a fourth loop. Although FIG. 22 illustrates an example of a word line located at a lower layer, the same is true of word lines located at an intermediate layer and an upper layer.

FIG. 22(a) is the same as FIG. 19 described in the above-described embodiment. On the other hand, as illustrated in FIG. 22(b), the orders of a detecting operation and a verifying operation of the third loop may be changed. In addition, as illustrated in FIG. 22(c), the detecting operation and the verifying operation may be successively performed. In addition, in FIG. 22(c), the orders of the detecting operation and the verifying operation may be reversed.

Figure 23:
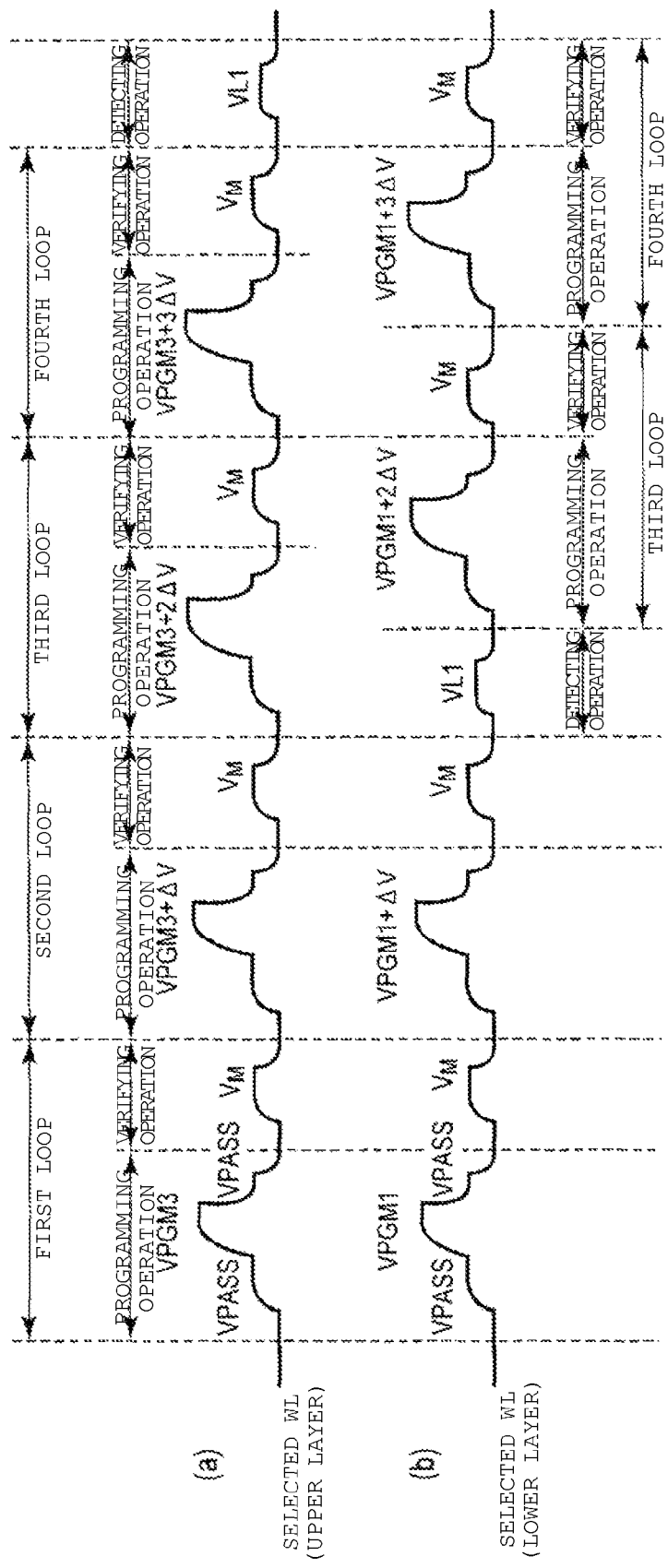
FIG. 23 is a timing chart during a write operation according to a modification example of the second embodiment.

FIG. 23 is a timing chart illustrating another example; FIG. 23 (a) illustrates a case where a word line located at an upper layer is selected, and FIG. 23 (b) illustrates a case where a word line located at a lower layer is selected.

As illustrated in the drawing, layer dependence may be given to the frequency of performing a detecting operation. More specifically, a low frequency of the detecting operation may be set for the word line located at the upper layer, and a high frequency of the detecting operation may be set for the word line located at the lower layer. In a case of the example of FIG. 23, regarding the word line of the upper layer, one detecting operation is performed for four write operations as illustrated in FIG. 23(a). On the other hand, regarding the word line located at the lower layer, one detecting operation is performed for two write operations as illustrated in FIG. 23(b).

As described above, there is a tendency for writing to be performed as the memory cell transistor approaches the lower layer. In other words, a writing speed of the memory cell transistor becomes higher as the size of a memory hole decreases. Accordingly, a relatively large number of writing loops are necessary for the memory cell transistor located at the upper layer to pass the detecting operation, and thus it may be seen that the memory cell transistor located at the lower layer passes the detecting operation with a relatively small number of writing loops.

Accordingly, the frequency of the detecting operation of the memory cell transistor located at the upper layer is reduced, and thus it is possible to omit a useless detecting operation and to improve a writing speed.

Naturally, in FIG. 23, one detecting operation may be performed for three write operations, for example, on the word line located at an intermediate layer. The numbers of times are arbitrary, and a lower frequency may be set as the word line approaches the upper layer.

In this embodiment, the detection voltage VL1 is described by dividing the word lines into three regions A1 to A3 of the lower layer, the intermediate layer, and the upper layer. However, two regions and four or more regions may be used, and a region dividing method may be different from that in FIG. 12 for setting a voltage VPGM. The number of regions regarding the voltage VPGM may be different from the number of regions regarding the detection voltage VL1.

3. Third Embodiment

Next, a semiconductor memory device according to a third embodiment will be described. This embodiment is configured such that layer dependence is also given to a voltage VPASS in the first or second embodiment described above. Hereinafter, only differences from the first and second embodiments will be described.

3.1 Regarding Layer Dependence of Voltage VPASS

Figure 24:
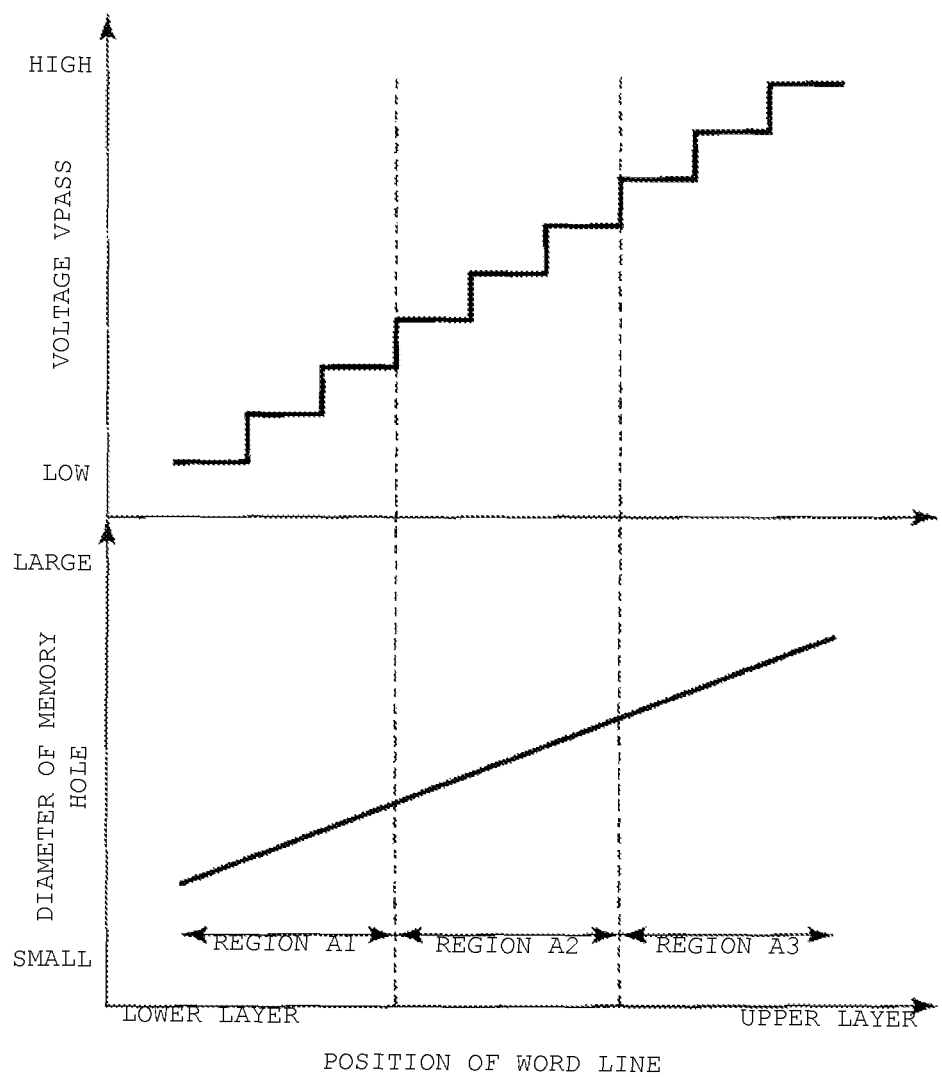
FIG. 24 is a graph illustrating a relationship between the diameter of a memory hole and a programming voltage, with respect to a position of a word line according to a third embodiment.

FIG. 24 is a graph illustrating a relationship between the diameter of a memory hole and a voltage VPASS, with respect to a position of a word line.

As illustrated in the drawing, the value of the voltage VPASS becomes smaller as the word line approaches the lower layer, and the value of the voltage becomes larger as the word line approaches the upper layer. In other words, similarly to a case of the programming voltage VPGM, a high voltage VPASS is applied to a word line having a large diameter $D_{MH}$ of the memory hole, and a low voltage VPASS is applied to a word line having a small diameter $D_{MH}$ of the memory hole.

In addition, a group is formed for each set of a plurality of adjacent word lines within a NAND string, and the voltages VPASS applied to the word lines within the same group are set to be the same value.

3.2 Regarding Relationship between Voltage VPASS and VPGM

Figure 25:
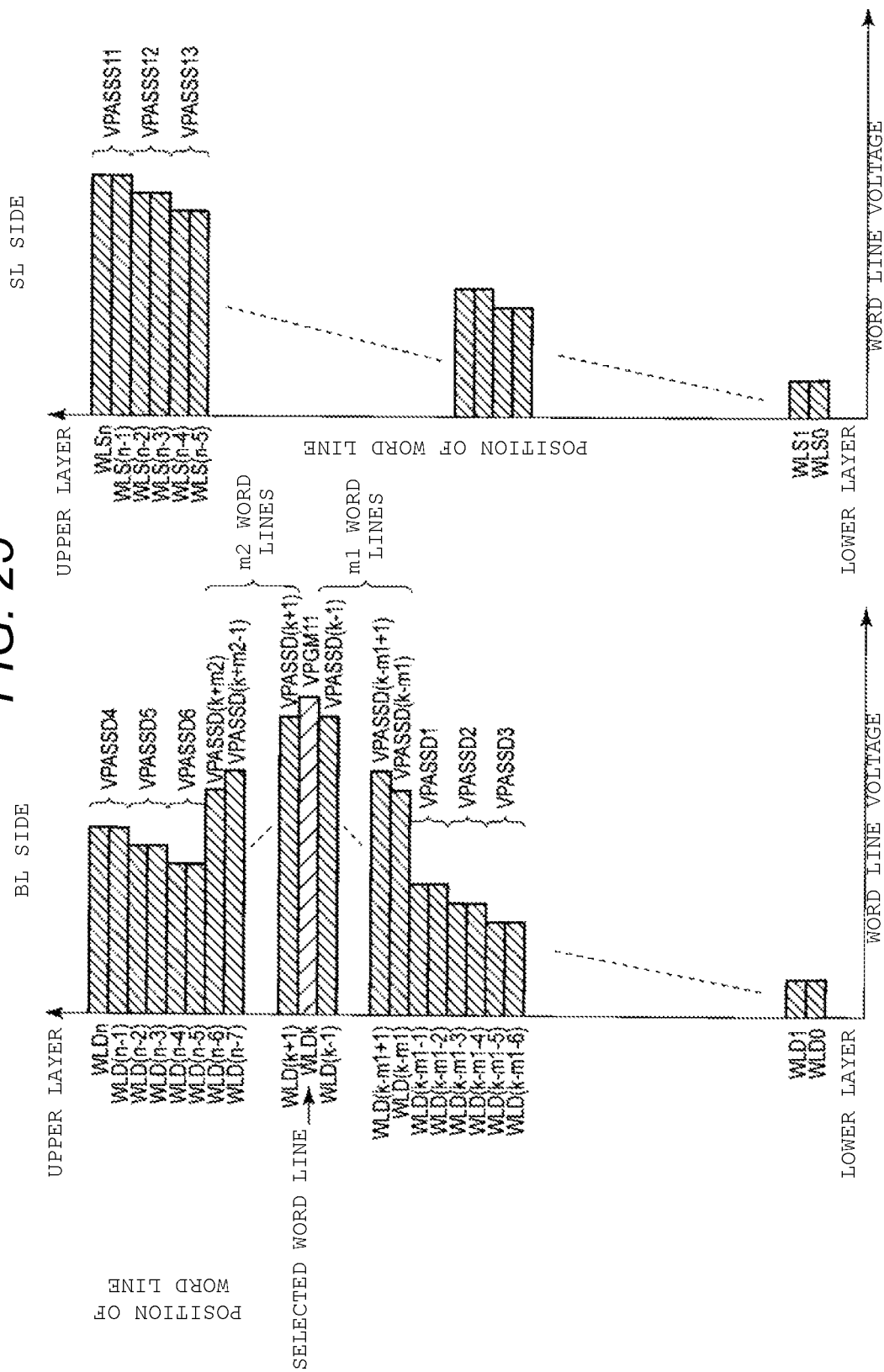
FIG. 25 is a graph illustrating a relationship between VPASS and VPGM, with respect to the position of a word line according to the third embodiment.

FIG. 25 is a graph illustrating voltages to be applied to word lines WLD0 to WLDn on the bit line side and word lines WLS0 to WLSn on the source line side when any one word line WLDk (k is any one of 0 to n) which is located at a relatively upper layer on the bit line side is selected, in the configuration of FIG. 12.

In the example as illustrated in the drawing, two adjacent unselected word lines are grouped into one set, and are applied with the same voltage VPASS. First, the word lines WLD0 to WLDn on the bit line side including the selected word line WLDk will be described. A voltage VPASSD4 is applied to the word lines WLDn and WLD(n−1) on the bit line side, and the voltage VPASS to be applied becomes lower as the word line approaches the lower layer therefrom (in FIG. 25, VPASSD4>VPASSD5>VPASSD6).

Here, m2 unselected word lines adjacent to the selected word line WLDk on the upper-layer side and m1 unselected word lines adjacent thereto on the lower-layer side are dealt with in a manner different from the above-described manner.

A programming voltage VPGM11 is applied to the selected word line WLDk. Voltages VPASSD(k+1) to VPASSD(k+m2), which gradually decrease from the voltage VPGAM11 toward a voltage VPASSD6, are applied to m2 word lines WL(k+1) to WLD(n−6) adjacent to the selected word line WLDk on the upper-layer side. That is, the following relationship of Expression (1) is established.

$$VPGM11 > VPASSD(k+1) > VPASSD(k+2) > \ldots > VPASSD(k+m2-1) > VPASSD(k+m2) \quad (1)$$

In addition, voltages VPASSD (k−1) to VPASSD (k−m1), which gradually decrease from the voltage VPGAM11, are applied to m1 word lines WL(k−1) to WLD(k−m1) adjacent to the selected word line WLDk on the lower-layer side. That is, the following relationship is established.

$$VPGM11 > VPASSD(k-1) > VPASSD(k-2) > \ldots > VPASSD(k-m1+1) > VPASSD(k-m1) \quad (2)$$

The voltage VPASS, which gradually decreases for every two word lines, is applied to word lines WLD(k−m1−1) to WLD0. For example, a voltage VPASSD1 is applied to word lines WLD(k−m1−1) and WLD(k−m1−2), a voltage VPASSD2 is applied to word lines WLD(k−m1−3) and WLD(k−m1−4), and a voltage VPASSD3 is applied to word lines WLD(k−m1−5) and WLD(k−m1−6). Then, a relationship of VPASSD1>VPASSD2>VPASSD3 is established. In addition, a relationship of VPASSD6≤VPASS1 is established between VPASSD6 and VPASSD1.

As described above, the voltage VPASS is basically set to be a higher value as the word line approaches the upper layer, and is set to be a lower value as the word line approaches the lower layer. The value of the voltage VPASS changes, for example, in units of two or more word lines. Herein, a plurality of unselected word lines (referred to as a region M1) adjacent to the selected word line on the lower-layer side and a plurality of unselected word lines (referred to as a region M2) adjacent thereto on the upper-layer side are dealt with in different manners.

In the region M2, the voltage VPASS satisfying Expression (1) described above is applied. That is, in the region M2, the value of the voltage VPASS gradually increases from the upper layer toward the lower layer. On the other hand, in the region M1, the voltage VPASS satisfying Expression (2) described above is applied. That is, in the region M2, the value of the voltage VPASS gradually decreases from the lower layer toward the upper layer. Thus, a difference in voltage between the adjacent word lines becomes gentle.

A case where the above-described method of applying the voltage VPASS is further generalized may be described as follows. That is, a plurality of word lines from the word line WLD0 located at the lowermost layer up to the region M1 are set to be a region C1 in which the number of word line layers is c1 and a region C2 in which the number of word line layers is c2, in order from the lower layer. In addition, a plurality of word lines from the word line WLDn located at the uppermost layer up to the region M2 is set to be a region D2 in which the number of word line layers is d2 and a region D1 in which the number of word line layers is d1, in order from the upper layer, and a relationship of c1+c2+m1+1+ma2+d1+d2=n is then established. Then, the voltage VPASS is applied in the following manner.

The following relationship is established at the boundary between the regions C1 and C2.

$$VPASSD(k-m1-c2+1) VPASSD(k-m1-c2) > VPASSD(k-m1-c2-1) \ VPASSD(k-m1-c2-2)$$

Herein, VPASSD(k−m1−c2) is a value of the voltage VPASS which is applied to the unselected word line WLD (k−m1−c2) in the region C2, and VPASSD(k−m1−c2−1) is a value of the voltage VPASS which is applied to the unselected word line WLD(k−m1−c2−1) in the region C1.

Similarly, the following relationship is established at the boundary between the regions D2 and D1.

$$VPASSD(k+m2+d1+2) \geq VPASSD(k+m2+d1+1) > VPASSD(k+m2+d1) \geq VPASSD(k+m2+d1-1)$$

Herein, VPASSD(k+m2+d1+1) is a value of the voltage VPASS which is applied to the unselected word line WLD (k+m2+d1+1) in the region D2, and VPASSD(k+m2+d1) is a value of the voltage VPASS which is applied to the unselected word line WLD (k+m2+d1) in the region D1.

Naturally, in the above description, the number of divisions in a region lower than the region M1 and the number of divisions in a region higher than the region M2 are not limited to two, and the word lines may be divided into three or more regions.

Next, the word lines WLS0 to WLSn on the source line side which do not include a selected word line will be described. A voltage VPASSS11 is applied to word lines WLSn and WLS (n−1) located at the uppermost layer on the source line side, and the voltage VPASS to be applied becomes lower as the word line approaches the lower layer therefrom (in FIG. 25, VPASSS11>VPASSS12>VPASSS13).

A case where a voltage VPASS on the source line side is generalized may be described as follows. That is, the word lines are set to be a region E1 in which the number of word line layers is e1, a region E2 in which the number of word line layers is e2, and a region E3 in which the number of word line layers is e3, in order from the word line WLS0 located at the lowermost layer, and a relationship of e1+e2+e3=n is then established. Then, the voltage VPASS is applied in the following manner.

The following relationship is established at the boundary between the regions E1 and E2.

$$VPASSS(e1+1) \geq VPASSS(e1) > VPASSS(e1-1) \leq VPASSS(e1-2)$$

Herein, VPASSS (e1) is a value of the voltage VPASS which is applied to the unselected word line WLS(e1) in the region E2, and VPASSS (e1−1) is a value of the voltage VPASS which is applied to the unselected word line WLS(e1−1) in the region E1.

Similarly, the following relationship is established at the boundary between the regions E2 and E3.

$$VPASSS(e1+e2+1) VPASSS(e1+e2) > VPASSS(e1+e2-1) \ VPASSS(e1+e2-2)$$

Herein, VPASSS(e1+e2) is a value of the voltage VPASS which is applied to the unselected word line WLS (e1+e2) in the region E3, and VPASSS (e1+e2−1) is a value of the voltage VPASS which is applied to the unselected word line WLS(e1+e2−1) in the region E2.

Meanwhile, a voltage VPASSSn of the unselected word line WLSn located at the uppermost layer may be different from voltages applied to other unselected word lines WLS included in the same region E3. In addition, a voltage VPASSS0 of the unselected word line WLS0 located at the lowermost layer may be different from voltages applied to other unselected word lines WLS included in the same region E1. This is the same relationship as that in FIG. 14 described in the first embodiment.

Naturally, in the above description, an example in which the word lines on the source line side are divided into three regions is described. However, the word lines may be divided into two regions or may be divided into four or more regions.

Meanwhile, the constants m (m1 and m2 in this example), c (c1 and c2 in this example), d (d1 and d2 in this example), and e (e1 and e2 in this example) are arbitrary in the above description, and may be appropriately modified in accordance with the position (that is, the value of k) of the word line WL to be selected and the number of word line layers n.

When the word lines on the source line side are selected, WLD may be replaced with WLS, WLS may be replaced with WLD, VPASSD may be replaced with VPASSS, and VPASSS may be replaced with VPASSD in the above description.

Figure 26:
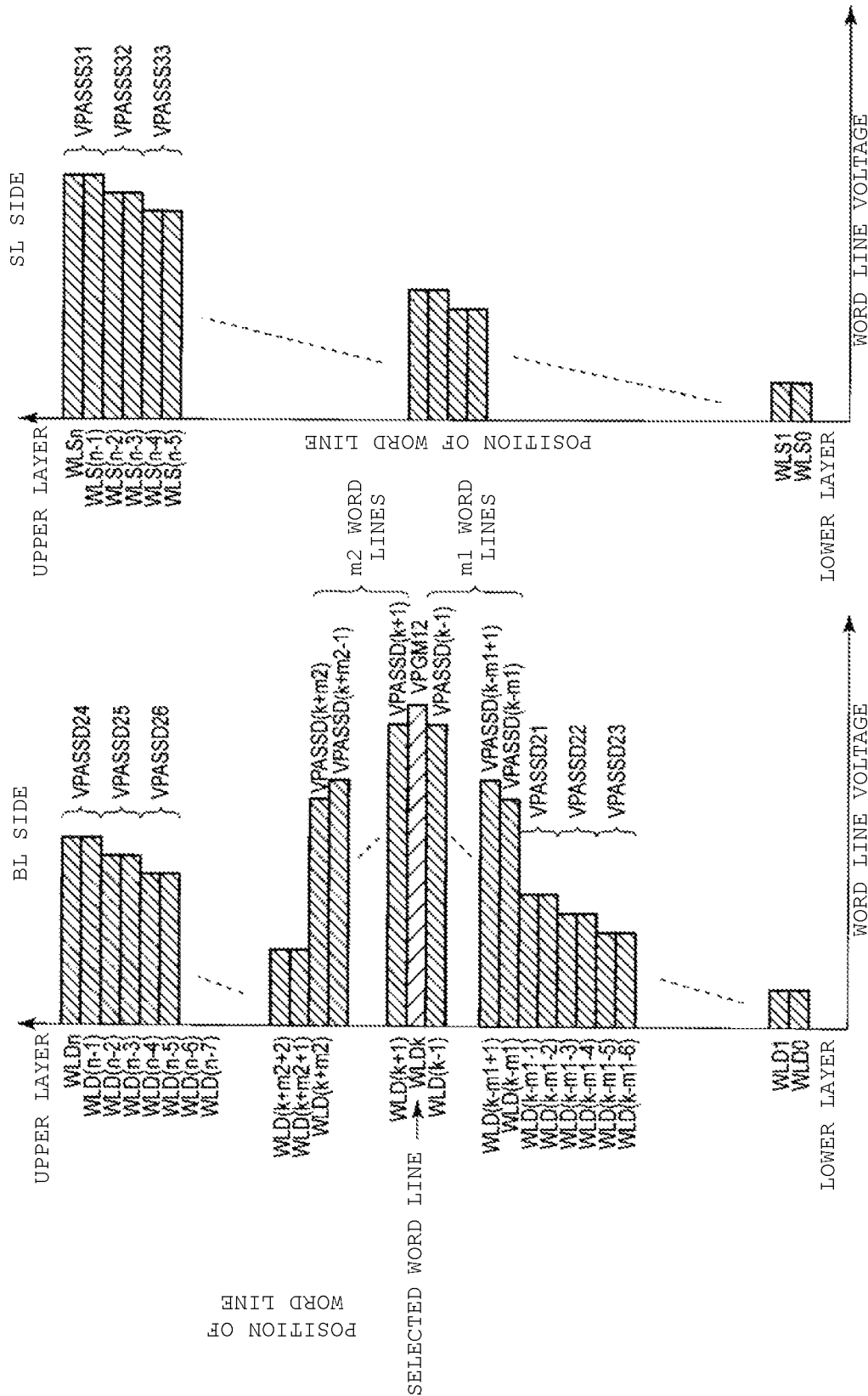
FIG. 26 is a graph illustrating a relationship between VPASS and VPGM, with respect to the position of a word line according to the third embodiment.
Figure 27:
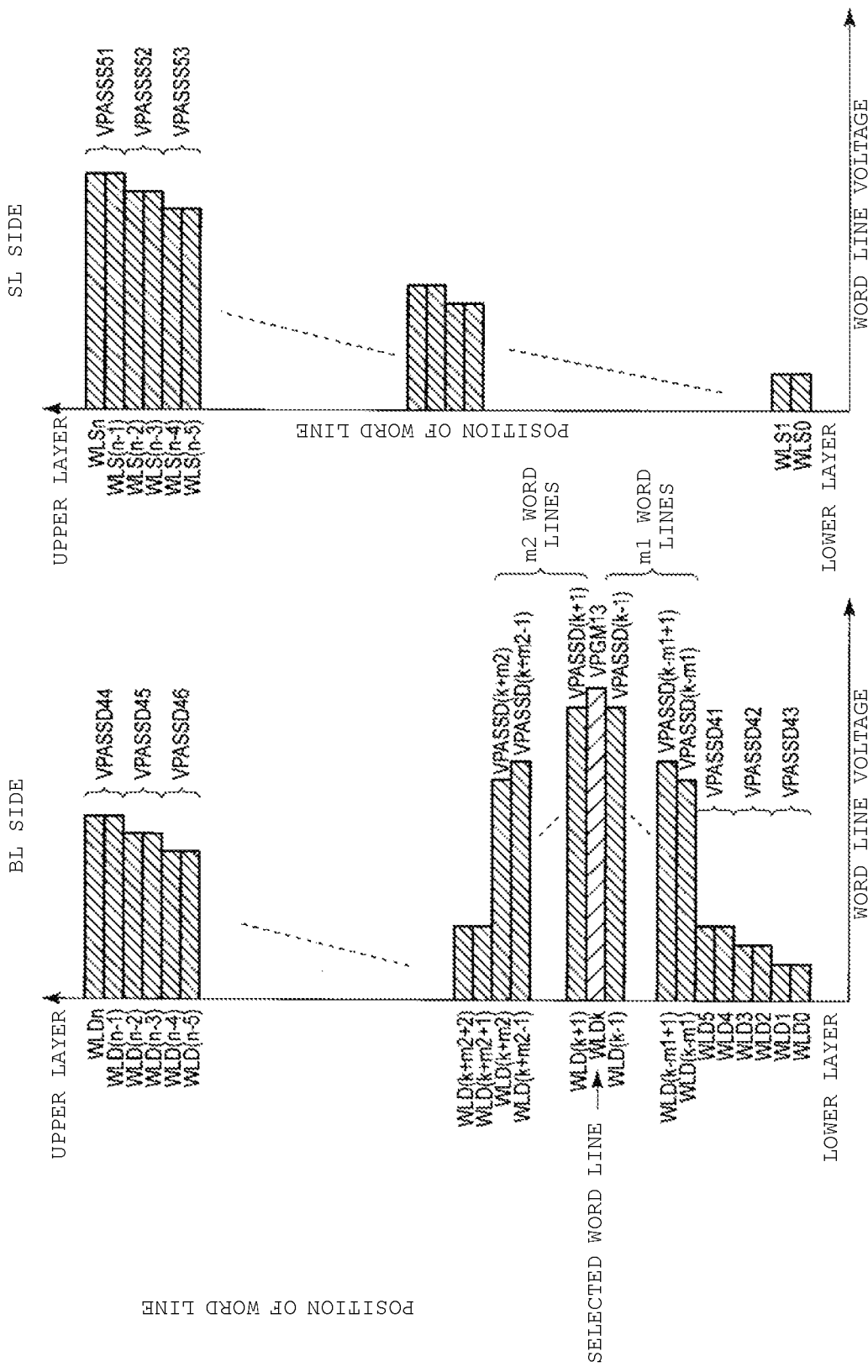
FIG. 27 is a graph illustrating a relationship between VPASS and VPGM, with respect to the position of a word line according to the third embodiment.

FIGS. 26 and 27 illustrate a case where word lines located at an intermediate layer are selected and a case where word lines located at a lower layer are selected, respectively. Even in these cases, the same relationship as that in FIG. 25 is established.

3.3 Effects according to This Embodiment

As described in the first embodiment, the size of the memory cell transistor varies in accordance with the size of the memory hole. Thus, both a program characteristic and a reading characteristic vary. More specifically, as the size of the memory hole decreases, the memory cell transistor is likely to be turned on, and as the size of the memory hole increases, the memory cell transistor is not likely to be turned on.

Consequently, according to this embodiment, the voltage VPASS is set to be lower as the unselected word line having a small size of the memory hole approaches the lower layer, and the VPASS is set to be higher as the unselected word line having a large size of the memory hole approaches the upper layer.

Thus, it is possible to apply an appropriate voltage to the unselected word line and to improve the reliability of a write operation.

In addition, in addition to simply changing the value of VPASS in accordance with layers, the value of VPASS is set so that a difference in potential between the adjacent word lines gradually changes in the unselected word lines which are close to the selected word line (regions M1 and M2 of FIG. 25). Thus, it is also possible to care for breakdown voltage between the word lines.

Meanwhile, the value of the voltage VPASS may be maintained constant while a programming operation is repeated, or may be stepped up in a similar manner to VPGM.

In addition, an embodiment regarding the above-described VPASS may also be applied to a reading voltage VREAD exactly in the same manner. In other words, it is possible to change the size of the voltage VREAD in accordance with the diameter of the memory hole.

4. Fourth Embodiment

Next, a semiconductor memory device according to a fourth embodiment will be described. This embodiment is configured such that a memory hole is formed by multiple times of etching in the first to third embodiments described above. Hereinafter, only differences from the first to third embodiments will be described.

4.1 Regarding Configuration of NAND String

Figure 28:
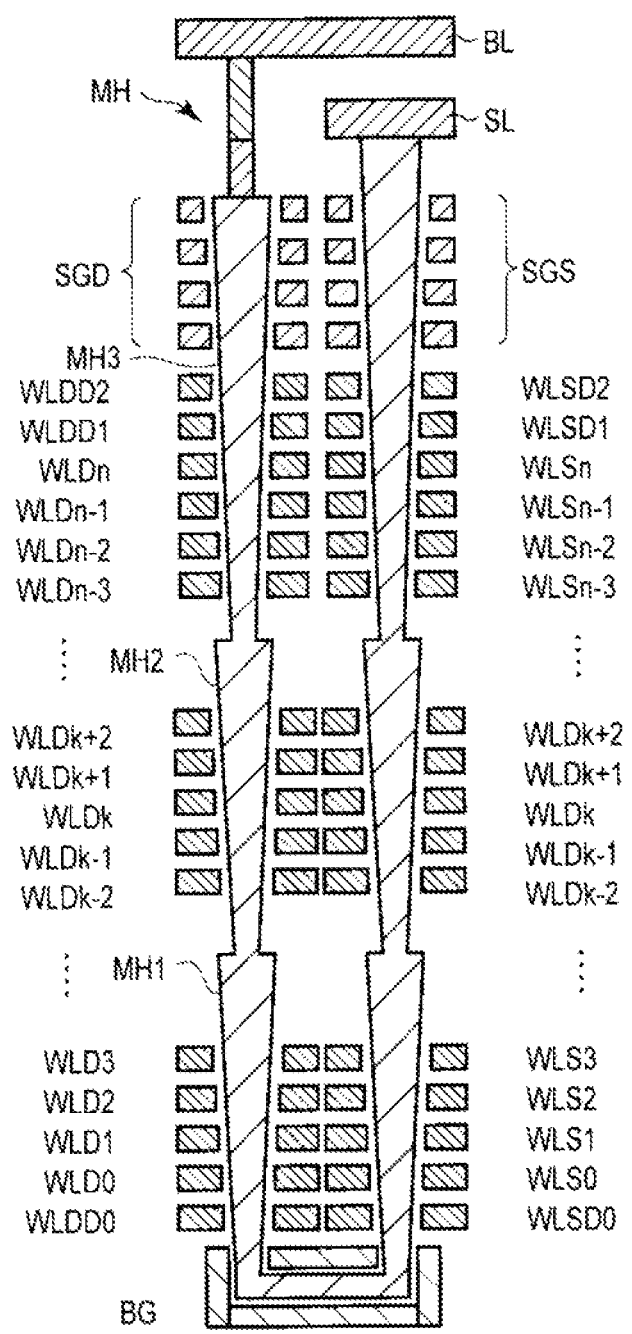
FIG. 28 is a cross-sectional view of a NAND string according to a fourth embodiment.

First, a configuration of a NAND string according to this embodiment will be described with reference to FIG. 28. FIG. 28 is a cross-sectional view of the NAND string. FIG. 28 illustrates a case where the memory hole is formed by three steps. The same is true of a case where the memory hole is formed by four or more steps.

As illustrated in the drawing, memory holes reaching a back gate transistor BT from a bit line BL or a source line SL include three memory holes MH1, MH2, and MH3 which are sequentially formed from a lower layer.

Each of the memory holes MH1 to MH3 has a taper shape. Accordingly, the diameter of the upper end of the memory hole MH1 located at the lowermost layer is larger than the diameter of the lower end of the memory hole MH2 located at the intermediate layer. The diameter of the upper end of the memory hole MH2 located at the intermediate layer is larger than the diameter of the lower end of the memory hole MH3 located at the uppermost layer, and the diameter of the memory hole MH3 located at the uppermost layer is larger than the diameter of the lower end thereof.

4.2 Regarding Programming Voltage VPGM

Figure 29:
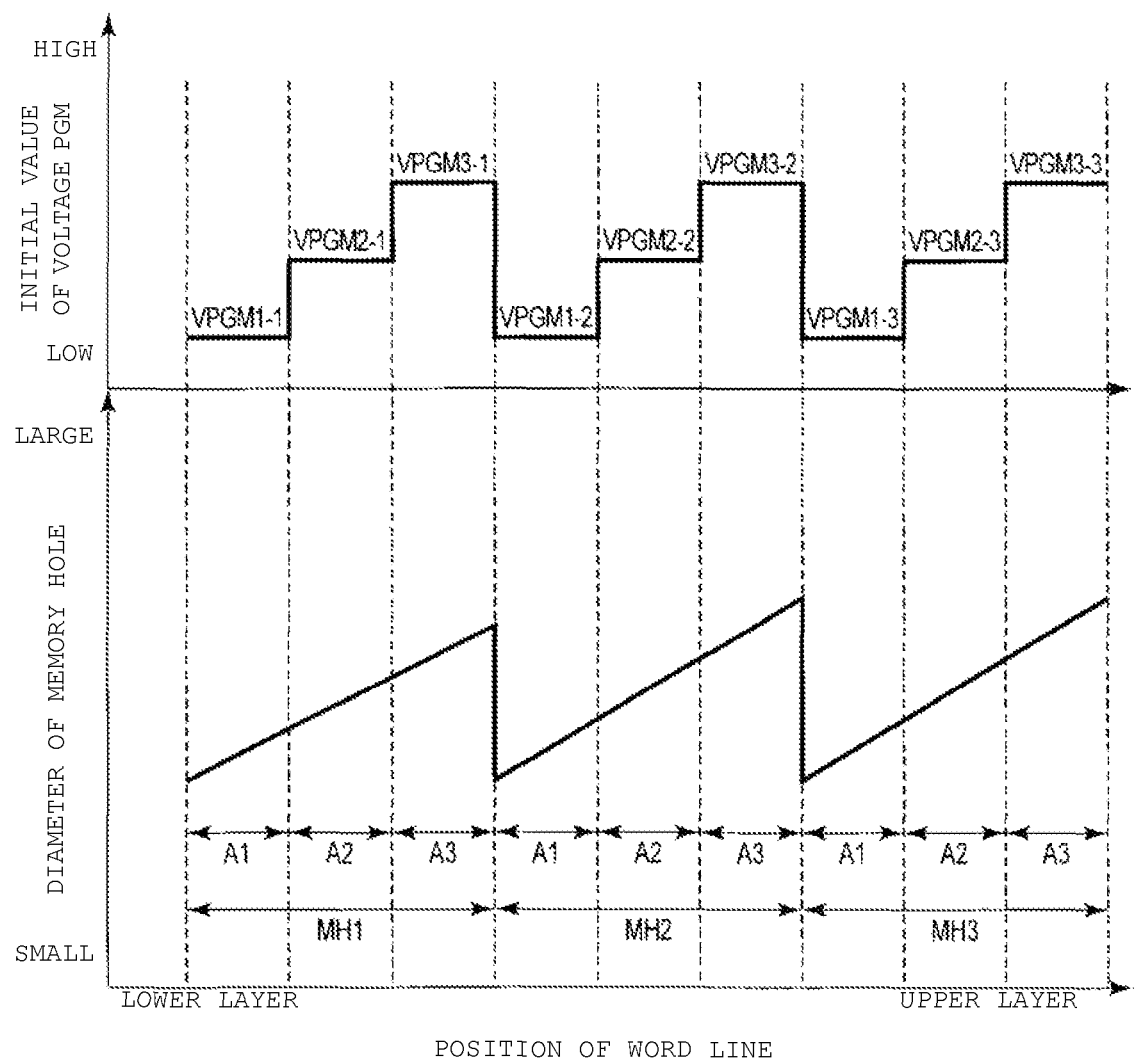
FIG. 29 is a graph illustrating a relationship between the diameter of a memory hole and a programming voltage, with respect to a position of a word line according to the fourth embodiment.

FIG. 29 is a graph illustrating a relationship between the diameter of the memory hole and a programming voltage VPGM, with respect to a position of a word line.

As illustrated in the drawing, values of VPGM are set in accordance with the diameters of the memory holes MH1 to MH3. That is, when word lines corresponding to a region A1 of the memory hole MH1 which is located at the lowermost layer are selected, VPGM1-1 is applied. When word lines corresponding to a region A2 of the memory hole MH1 which is located at the intermediate layer are selected, VPGM2-1 is applied. When word lines corresponding to a region A3 of the memory hole MH1 which is located at the uppermost layer are selected, VPGM3-1 is applied. Then, a relationship of VPGM1-1<VPGM2-1<VPGM3-1 is established.

In addition, when word lines corresponding to a region A1 of the memory hole MH2 which is located at the lowermost layer are selected, VPGM1-2 is applied. When word lines corresponding to a region A2 of the memory hole MH2 which is located at the intermediate layer are selected, VPGM2-2 is applied. When word lines corresponding to a region A3 of the memory hole MH2 which is located at the uppermost layer are selected, VPGM3-2 is applied. Then, a relationship of VPGM1-2<VPGM2-2<VPGM3-2 is established, and a relationship of VPGM1-2<VPGM3-1 is established in a stepped portion between the memory holes MH1 and MH2.

Further, when word lines corresponding to a region A1 of the memory hole MH3 which is located at the lowermost layer are selected, VPGM1–3 is applied. When word lines corresponding to a region A2 of the memory hole MH3 which is located at the intermediate layer are selected, VPGM2-3 is applied. When word lines corresponding to a region A3 of the memory hole MH3 which is located at the uppermost layer are selected, VPGM3-3 is applied. Then, a relationship of VPGM1-3<VPGM2-3<VPGM3-3 is established, and a relationship of VPGM1-3<VPGM3-2 is established in a stepped portion between the memory holes MH2 and MH3.

Meanwhile, VPGM1-1, VPGM1-2, and VPGM1-3 may be the same value or may be different values. The values are determined depending on the sizes of the memory holes MH1 to MH3. The same is true of VPGM2-1, VPGM2-2, and VPGM2-3, and the same is true of VPGM3-1, VPGM3-2, and VPGM3-3.

4.3 Regarding Voltage VPASS

Figure 30:
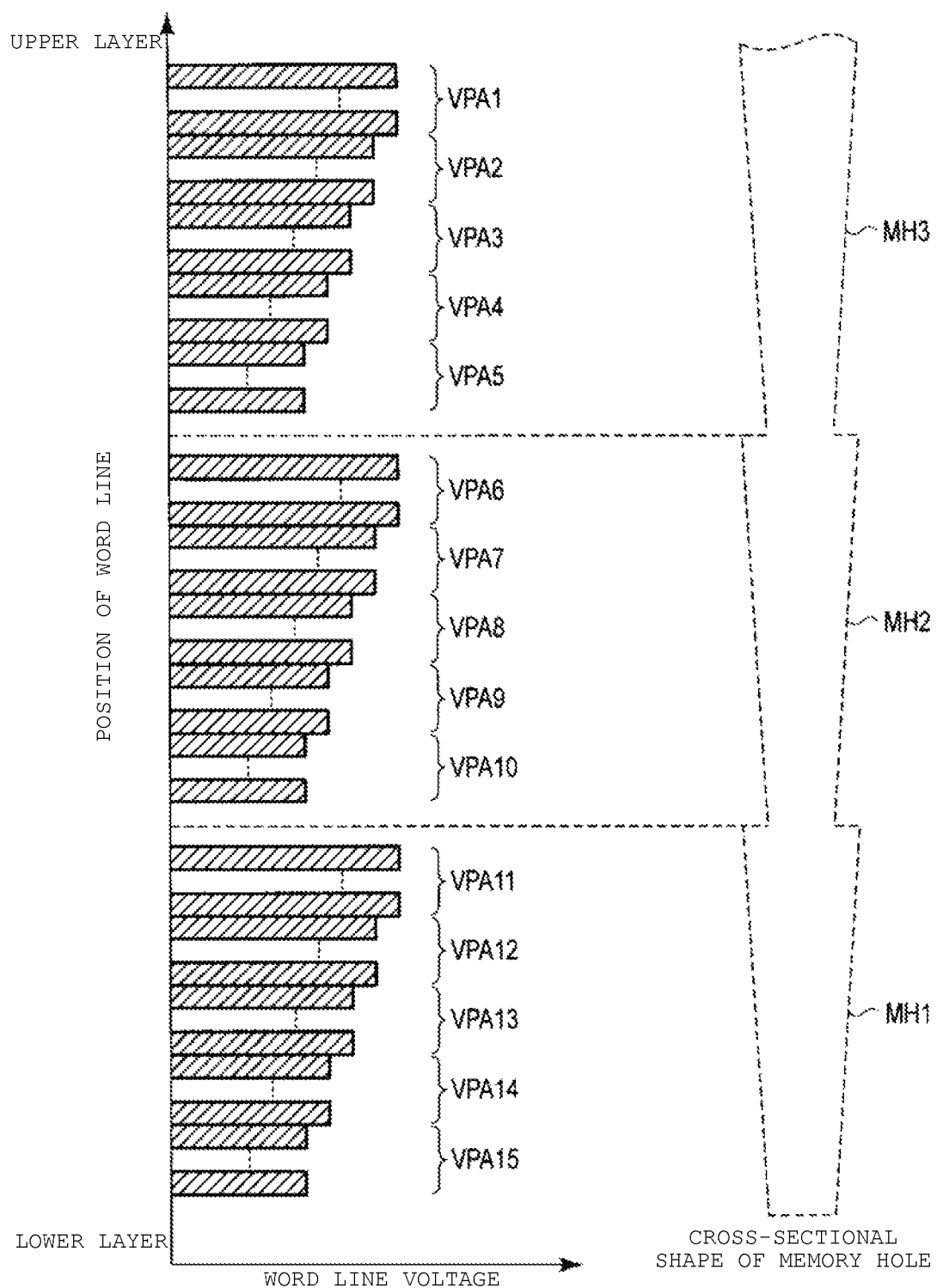
FIG. 30 is a graph illustrating a relationship between the diameter of the memory hole and VPASS, with respect to the position of a word line according to the fourth embodiment.

FIG. 30 is a graph illustrating a relationship between the diameter of the memory hole and a voltage VPASS, with respect to the position of the word line.

As illustrated in the drawing, values of VPASS are set in accordance with the diameters of the memory holes MH1 to MH3 in a similar manner to VPGM. In the example of FIG. 30, word lines WL corresponding to each of the memory holes MH1 to MH3 are divided into five regions for the plurality of word lines. Naturally, the number of regions may be four or less or may be six or more.

In the region corresponding to the memory hole MH3, VPA1, VPA2, VPA3, VPA4, and VPA5 are given as the voltage VPASS in order from the upper layer. Herein, a relationship of VPA1>VPA2>VPA3>VPA4>VPA5 is established.

In the region corresponding to the memory hole MH2, VPA6, VPA7, VPA8, VPA9, and VPA10 are given as the voltage VPASS in order from the upper layer. Herein, a relationship of VPA6>VPA7>VPA8>VPA9>VPA10 is established.

Further, in the region corresponding to the memory hole MH3, VPA11, VPA12, VPA13, VPA14, and VPA15 are given as the voltage VPASS in order from the upper layer. Herein, a relationship of VPA11>VPA12>VPA13>VPA14>VPA15 is established.

Meanwhile, VPA1, VPA6, and VPA11 may be the same value or may be different values. The values are determined in accordance with the sizes of the memory holes MH1 to MH3. The same is true of VPA2, VPA7, and VPA12, the same is true of VPA3, VPA8, and VPA13, the same is true of VPA4, VPA9, and VPA14, and the same is true of VPA5, VPA10, and VPA15.

4.4 Effects according to This Embodiment

In a three-dimensional stacked NAND-type flash memory, it is possible to improve the degree of integration as the number of stacked word lines WL increases. However, the depth of the memory hole increases as the number of stacked word lines increases. As a result, a great difference in diameter between the upper end and the lower end of the memory hole occurs. In other words, a great difference in characteristic between a memory cell transistor located at a lower layer and a memory cell transistor located at an upper layer occurs.

Accordingly, it is preferable that the memory hole be formed in multiple stages instead of being created by collective processing. In this case, the diameter of the memory hole has a complex shape having stepped portions as illustrated in FIG. 28, instead of monotonously decreasing from the upper layer toward the lower layer.

Even in this case, the values of VPGM and VPASS are appropriately set in accordance with the diameter of the memory hole, and thus it is possible to improve the operational reliability of the NAND-type flash memory. Although a description is omitted, the same is true of a detection voltage VL1.

Figure 31:
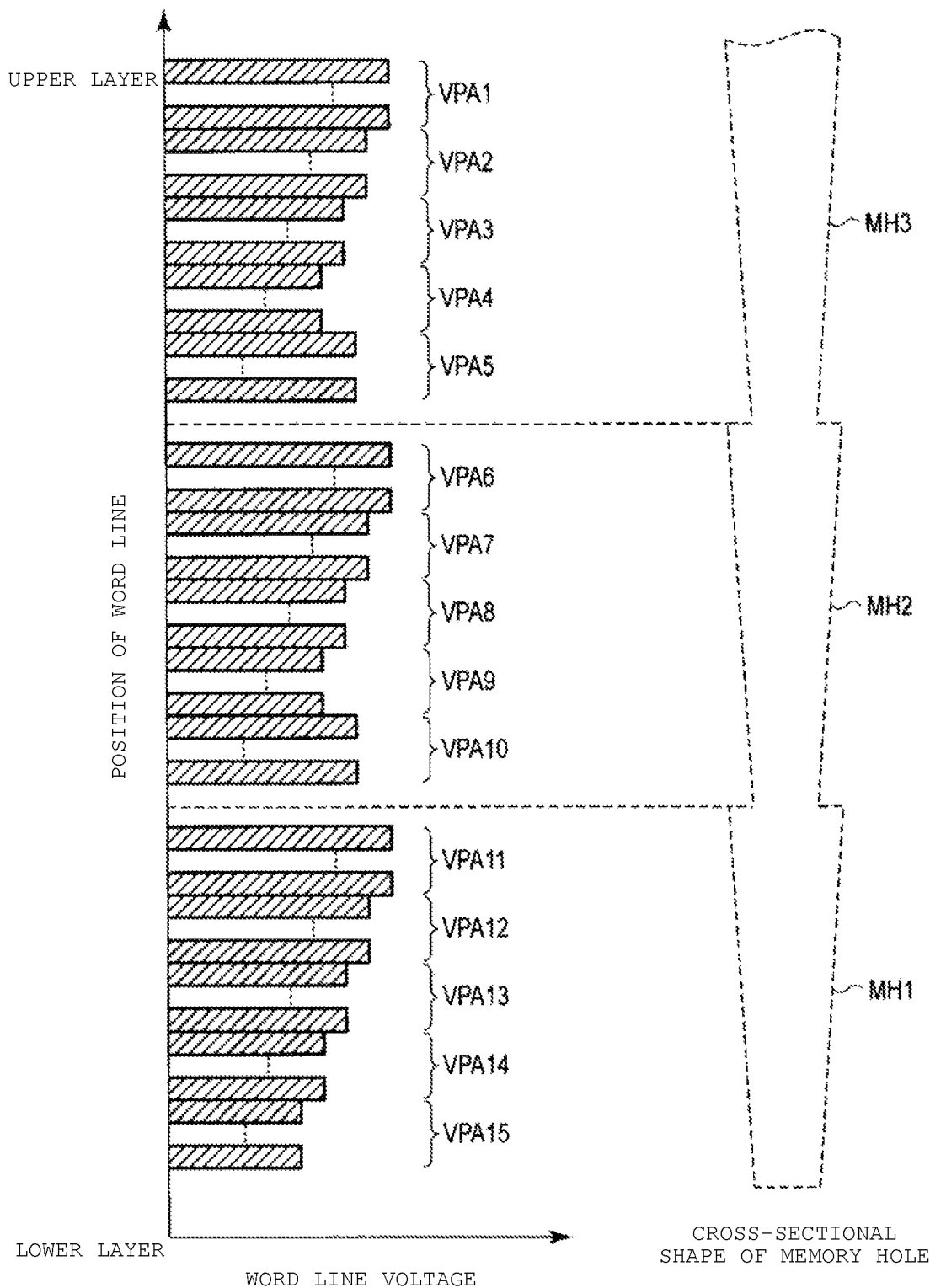
FIG. 31 is a graph illustrating a relationship between the diameter of a memory hole and VPASS, with respect to a position of a word line according to a modification example of the fourth embodiment.

Meanwhile, in a case of the configuration as illustrated in FIG. 28, the value of VPASS may be set so that a difference in potential between unselected word lines decreases, in the boundary portion between the memory holes. Such an example is illustrated in FIG. 31.

As illustrated in the drawing, a value VPA5 of the voltage VPASS applied to word lines in a region of the memory hole MH3 which is located at the lowermost layer is set to satisfy a relationship of VPA4<VPA5<VPA6. In addition, a value VPA10 of the voltage VPASS applied to word lines in a region of the memory hole MH2 which is located at the lowermost layer is set to satisfy a relationship of VPA9<VPA10<VPA11.

Alternatively, in FIG. 30, the value of VPA6 may be set to satisfy a relationship of VPA5<VPA6<VPA7, and the value of VPA11 may be set to satisfy a relationship of VPA10<VPA11<VPA12.

Figure 32:
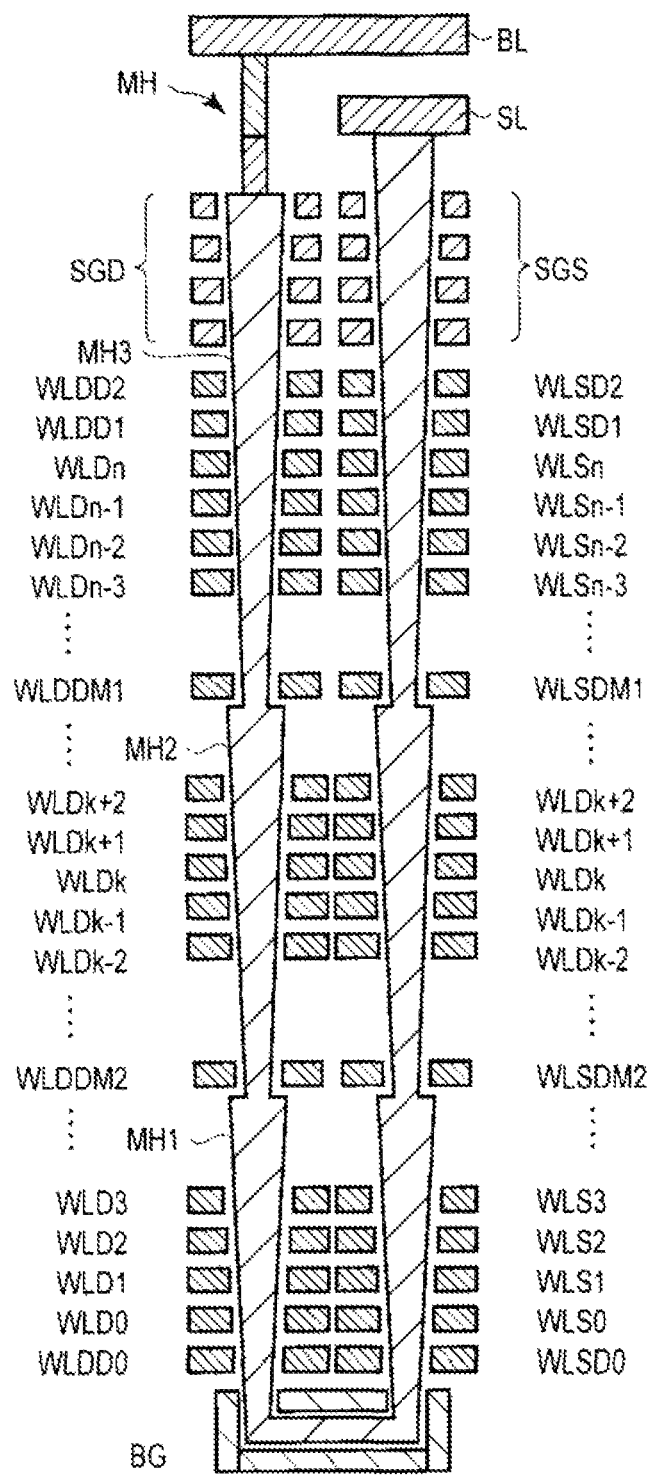
FIG. 32 is a cross-sectional view of a NAND string according to a modification example of the fourth embodiment.

Further, dummy word lines may be provided at the stepped portions of the memory holes. Such an example is illustrated in FIG. 32. FIG. 32 is a cross-sectional view of the NAND string.

As illustrated in the drawing, dummy word lines WLDDM1 and WLSDM1 are provided at the lowermost layer of the memory hole MH3, and dummy word lines WLDDM2 and WLSDM2 are provided at the lowermost layer of the memory hole MH2.

5. Fifth Embodiment

Next, a semiconductor memory device according to a fifth embodiment will be described. This embodiment is configured such that the first to fourth embodiments described above are applied to a NAND-type flash memory having a different NAND string shape. Hereinafter, only differences from the first to fourth embodiments will be described.

5.1 First Example

Figure 33:
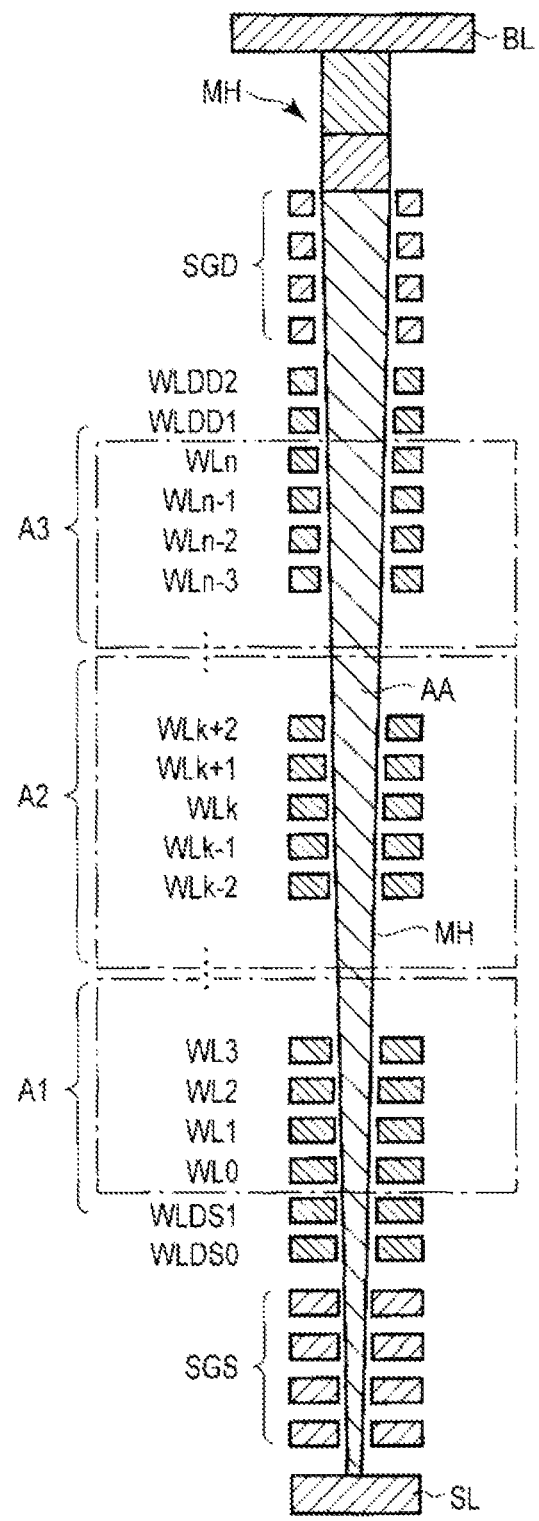
FIG. 33 is a cross-sectional view of a NAND string according to a first example of a fifth embodiment.

FIG. 33 is a cross-sectional view of a NAND string according to a first example. As illustrated in the drawing, in this example, a source line SL is first formed above a semiconductor substrate. Then, select gate lines SGS are formed above the source line SL, dummy word lines WLDS0 and WLDS1 are sequentially formed above the select gate lines SGS, word lines WL0 to WLn are sequentially formed above the dummy word line WLDS1, dummy word lines WLDD1 and WLDD2 are sequentially formed above the word line WLn, and select gate lines SGD are formed above the dummy word line WLDD2. Then, one memory hole MH penetrates these lines, and a semiconductor layer AA is formed within the memory hole MH. Then, a bit line BL is formed above the semiconductor layer AA.

Also in this configuration, a programming voltage VPGM may be set as described in FIGS. 13 and 14. In addition, a detection voltage VL1 may be set as described in FIG. 21. Further, a voltage VPASS may be set as described in FIGS. 24 to 27. Meanwhile, the voltage VPASS may be applied on the bit line BL side as described in FIGS. 24 to 27.

5.2 Second Example

Figure 34:
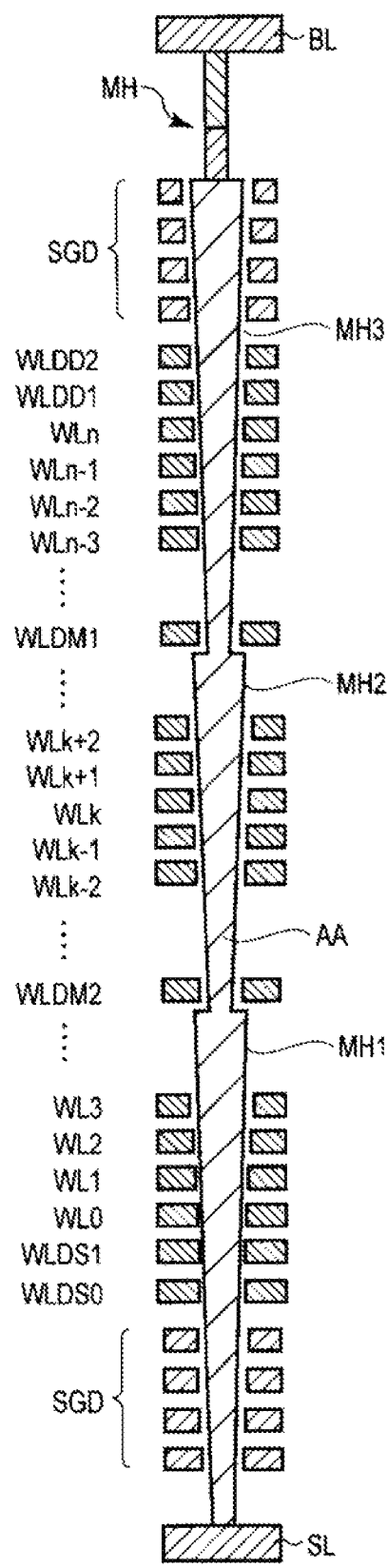
FIG. 34 is a cross-sectional view of a NAND string according to a second example of the fifth embodiment.

FIG. 34 is a cross-sectional view of a NAND string according to a second example. As illustrated in the drawing, this example is configured such that a memory hole is formed by multiple times of processing (three times in this example) in FIG. 33 described in the first example.

Also in this configuration, a programming voltage VPGM may be set as described in FIG. 29, and a voltage VPASS may be set as described in FIGS. 30 and 31. The same is true of a detection voltage VL1.

5.3 Third Example

Figure 35:
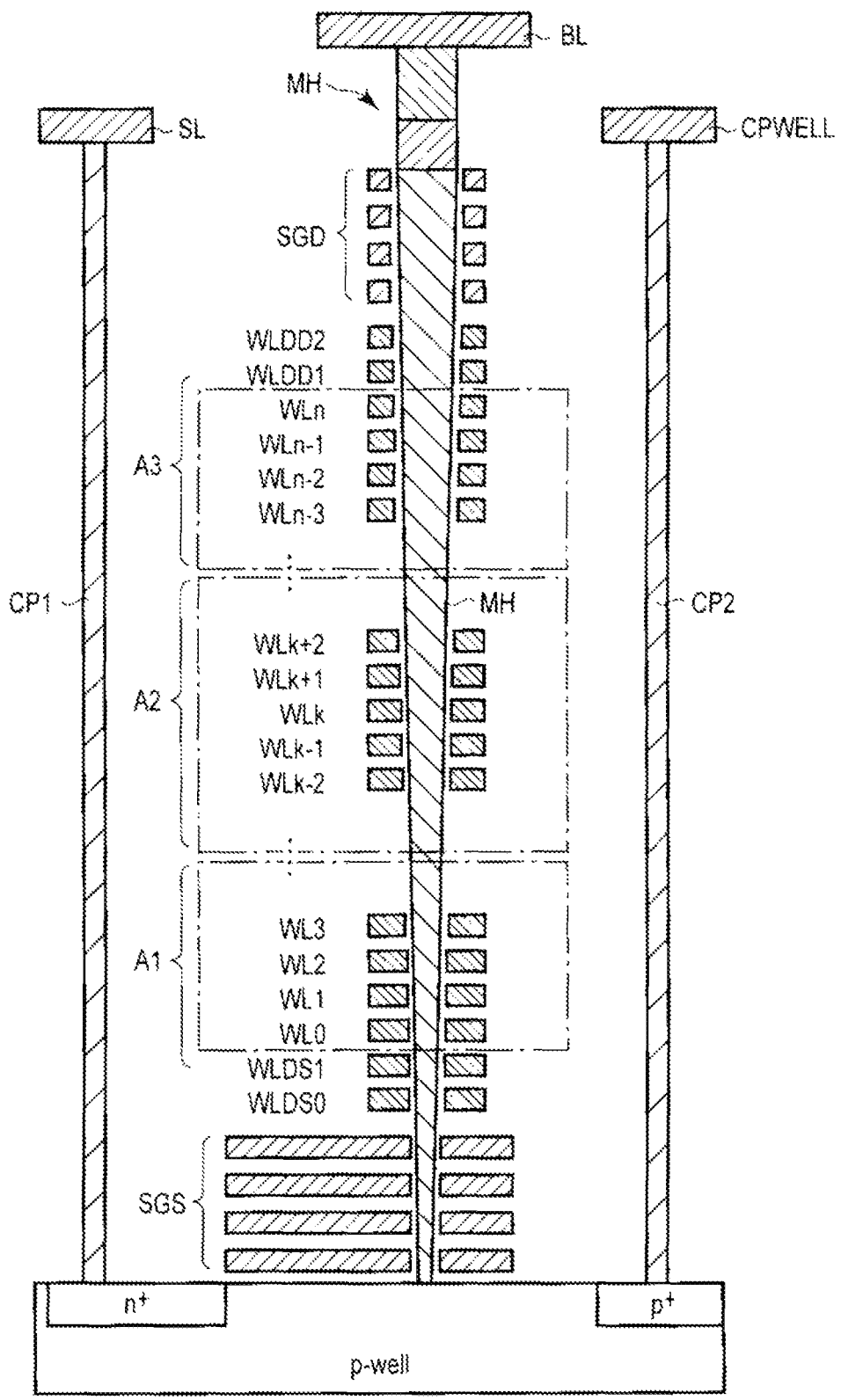
FIG. 35 is a cross-sectional view of a NAND string according to a third example of the fifth embodiment.

FIG. 35 is a cross-sectional view of a NAND string according to a third example. As illustrated in the drawing, in this example, the NAND string is formed on a p-type well region. An $n^+$-type dopant diffusion layer and a $p^+$-type dopant diffusion layer are formed within the p-type well region. A contact plug CP1 is formed on the $n^+$-type dopant diffusion layer, and a source line SL is formed on the contact plug CP1. In addition, a contact plug CP2 is formed on the $p^+$-type dopant diffusion layer, and a well wiring CPWELL is formed on the contact plug CP2. Select gate lines SGS are formed up to the vicinity of the $n^+$-type dopant diffusion layer. During reading, a channel formed in a memory cell transistor MT is electrically connected up to the $n^+$-type dopant diffusion layer, by a channel formed in a select transistor ST2 by the select gate lines SGS. According to this configuration, it is possible to apply an erasing voltage to a semiconductor layer AA during data erasing by the well wiring CPWELL.

Also in this configuration, a programming voltage VPGM may be set as described in FIGS. 13 and 14. In addition, a detection voltage VL1 may be set as described in FIG. 21. Further, a voltage VPASS may be set as described in FIGS. 24 to 27. Meanwhile, the voltage VPASS may be applied on the bit line BL side as described in FIGS. 24 to 27.

5.4 Fourth Example

Figure 36:
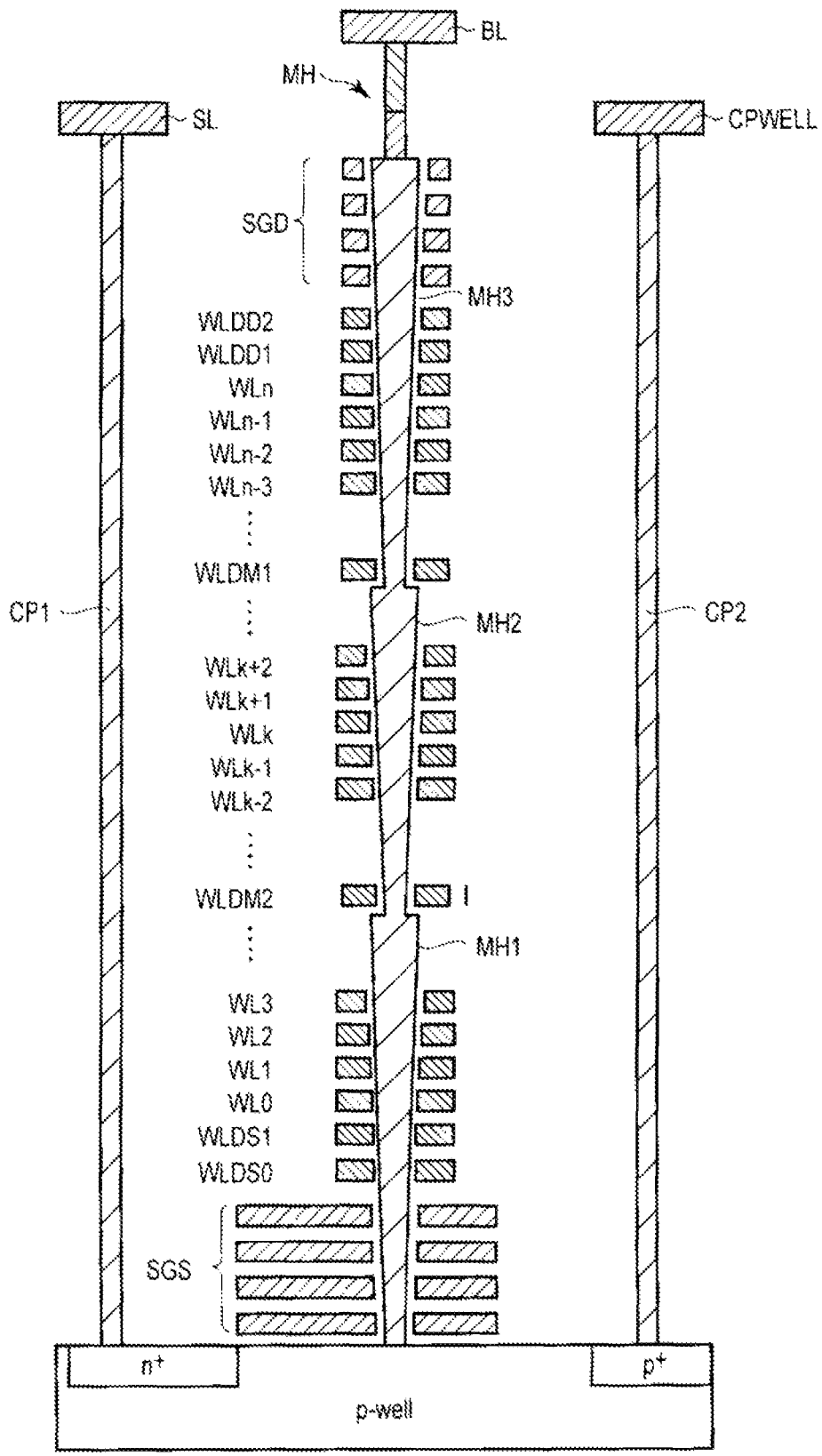
FIG. 36 is a cross-sectional view of a NAND string according to a fourth example of the fifth embodiment.

FIG. 36 is a cross-sectional view of a NAND string according to a fourth example. This example is configured such that a memory hole is formed by multiple times of processing (three times in this example) in FIG. 35 described in the third example described above.

Also in this configuration, a programming voltage VPGM may be set as described in FIG. 29, and a voltage VPASS may be set as described in FIGS. 30 and 31. The same is true of a detection voltage VL1.

5.5 Effects according to This Embodiment

As described above, the methods described in the first to fourth embodiments may also be applied to a configuration in which a semiconductor layer serving as a channel of a memory cell transistor MT has a shape of one pillar instead of a U-shape.

6. Sixth Embodiment

Next, a semiconductor memory device according to a sixth embodiment will be described. This embodiment is configured such that the first to fourth embodiments are applied to a different memory cell array. Hereinafter, only differences from the first to fourth embodiments will be described.

6.1 First Example 6.1.1 Regarding Configuration of Memory Cell Array

Figure 37:
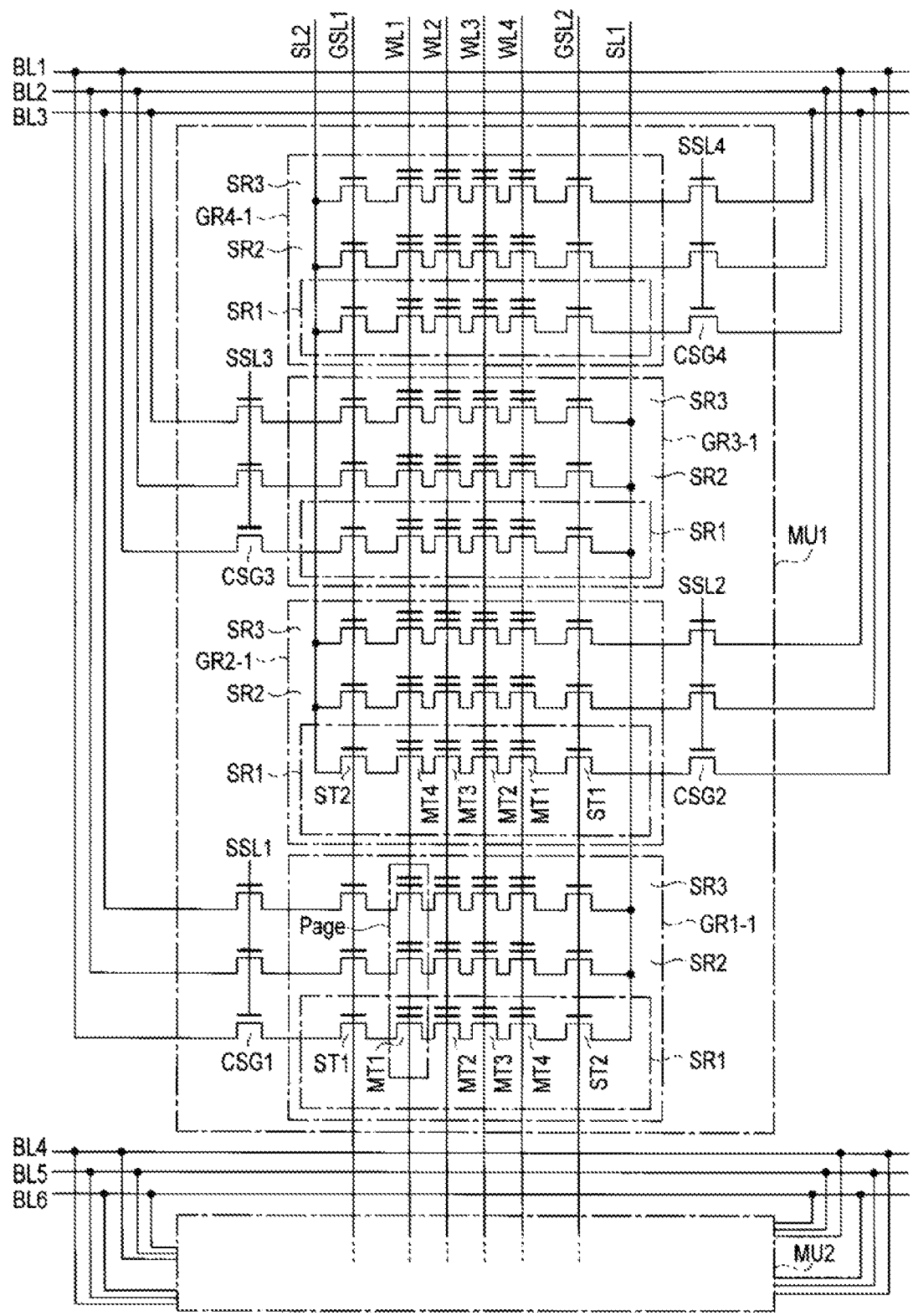
FIG. 37 is a circuit diagram of a memory cell array according to a first example of a sixth embodiment.

FIG. 37 is a circuit diagram of a memory cell array 111 according to this embodiment, and illustrates a configuration of any one block BLK. As illustrated in the drawing, the block BLK includes a plurality of memory units MU (MU1, MU2). FIG. 37 illustrates only two memory units MU. However, three or more memory units may be used, and the number of memory units is not limited thereto.

Each of the memory units MU includes, for example, four string groups GR (GR1 to GR4). Meanwhile, when performing discrimination between the memory units MU1 and MU2, the string groups GR of the memory unit MU1 are referred to as GR1-1 to GR4-1, and the string groups GR of the memory unit MU2 are referred to as GR1-2 to GR4-2.

Each of the string groups GR includes, for example, three NAND strings SR (SR1 to SR3). Naturally, the number of NAND strings SR is not limited to three, and may be four or more. Each of the NAND strings SR includes select transistors ST1 and ST2 and four memory cell transistors MT (MT1 to MT4). The number of memory cell transistors MT is not limited to four, and may be five or more, or may be three or less.

The three NAND strings SR1 to SR3 are sequentially stacked on a semiconductor substrate within the string group GR, the NAND string SR1 is formed at the lowermost layer, and the NAND string SR3 is formed at the uppermost layer. That is, the memory cell transistors MT within the NAND string are stacked in a direction perpendicular to the surface of the semiconductor substrate in FIG. 4 described in the first embodiment, while the memory cell transistors MT within the NAND string are arrayed in a direction parallel to the surface of the semiconductor substrate in this embodiment, and the NAND strings are stacked in the vertical direction. The select transistors ST1 and ST2 included in the same string group GR are connected to the same select gate lines GSL1 and GSL2, respectively, and control gates of the memory cell transistors MT located at the same column are connected to the same word line WL. Further, drains of three select transistors ST1 within a certain string group GR are connected to different bit lines BL, and sources of the select transistors ST2 are connected to the same source line SL.

In the odd-numbered string groups GR1 and GR3 and the even-numbered string groups GR2 and GR4, the select transistors ST1 and ST2 are disposed so that the positional relationship thereof is inverted. That is, in a case of the example of FIG. 37, each of the select transistors ST1 of the string groups GR1 and GR3 is disposed at the left end of the NAND string SR, and the select transistor ST2 is disposed at the right end of the NAND string SR. On the other hand, each of the select transistor ST1 of the string groups GR2 and GR4 is disposed at the right end of the NAND string SR, and the select transistor ST2 is disposed at the left end of the NAND string SR.

Gates of the select transistors ST1 of the string groups GR1 and GR3 are connected to the same select gate line GSL1, and gates of the select transistors ST2 are connected to the same select gate line GSL2. On the other hand, gates of the select transistors ST1 of the string groups GR2 and GR4 are connected to the same select gate line GSL2, and gates of the select transistors ST2 are connected to the same select gate line GSL1.

In addition, the four string groups GR1 to GR4 included in a certain memory unit MU are connected to the same bit line BL, and different memory units MU are connected to different bit lines BL. More specifically, in the memory unit MU1, drains of the select transistors ST1 of the NAND strings SR1 to SR3 in the string groups GR1 to GR4 are connected to bit lines BL1 to BL3 through column selected gates CSG (CSG1 to CSG4), respectively. For example, the column selected gate CSG has the same configuration as those of the memory cell transistor MT, the select transistors ST1 and ST2, and the like, and one string group GR connected to the bit line BL is selected in each memory unit MU. Accordingly, gates of the column selected gates CSG1 to CSG4 associated with each string group GR are controlled by different control signal lines SSL1 to SSL4, respectively.

The plurality of memory units MU each having the above-described configuration are arrayed in a vertical direction in the paper depicting FIG. 37. The plurality of memory units MU share the memory unit MU1, the word lines WL, and the select gate lines GSL1 and GSL2. On the other hand, the bit lines BL are independent, and for example, three bit lines BL4 to BL6 different from those of the memory unit MU1 are associated with the memory unit MU2. The number of bit lines BL associated with each memory unit MU corresponds to the total number of NAND strings SR included in one string group GR. Accordingly, when the NAND strings SR are four-layered strings, four bit lines BL are provided, and the same is true of cases of other numbers. In addition, the control signal lines SSL1 to SSL4 may be common between the memory units MU or may be controlled independently.

In the above-described configuration, a set of the plurality of memory cell transistors MT connected to the same word line WL in each string group GR which is selected from each memory unit MU serves as a "page".

Figure 38:
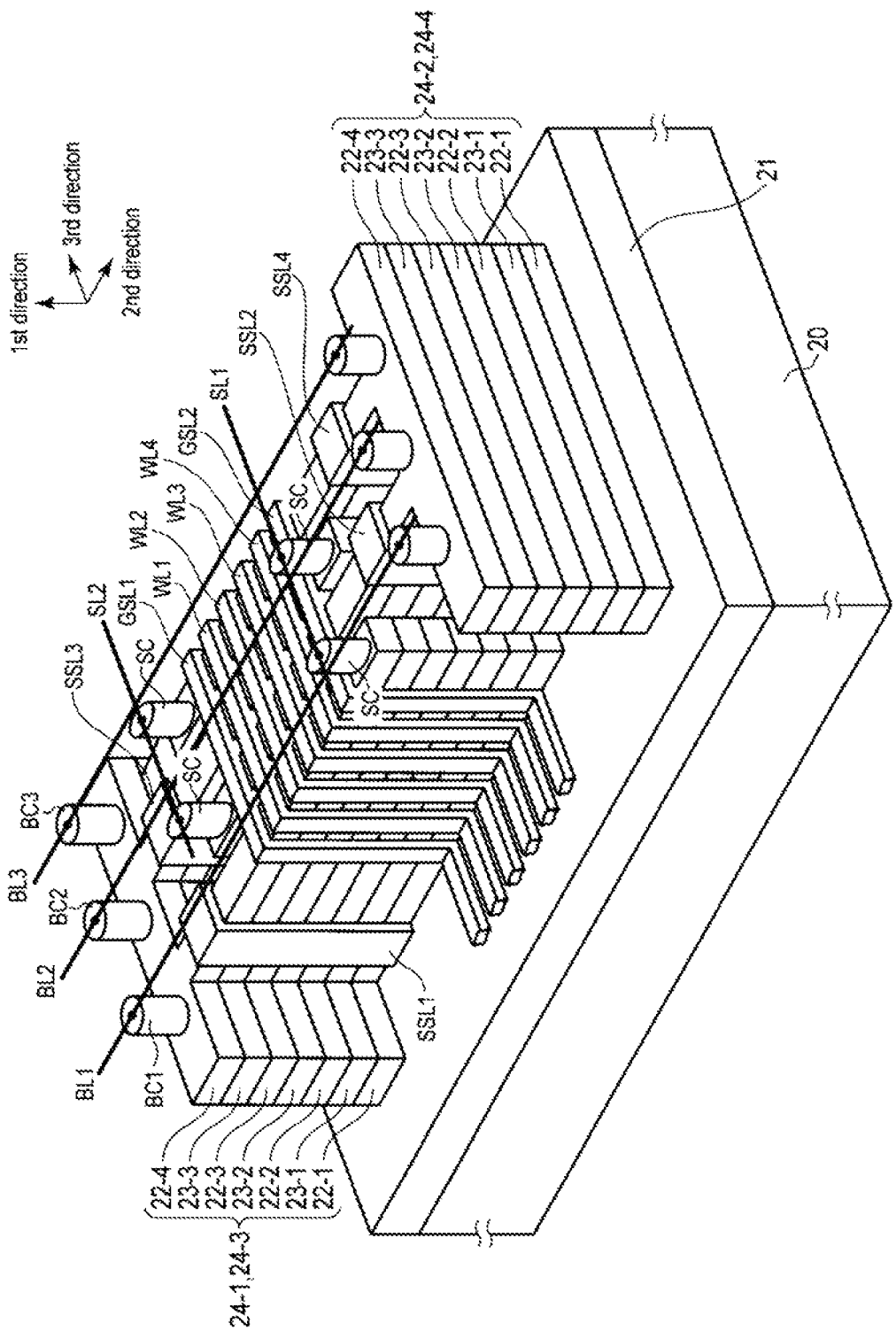
FIG. 38 is a perspective view of the memory cell array according to the first example of the sixth embodiment.
Figure 39:
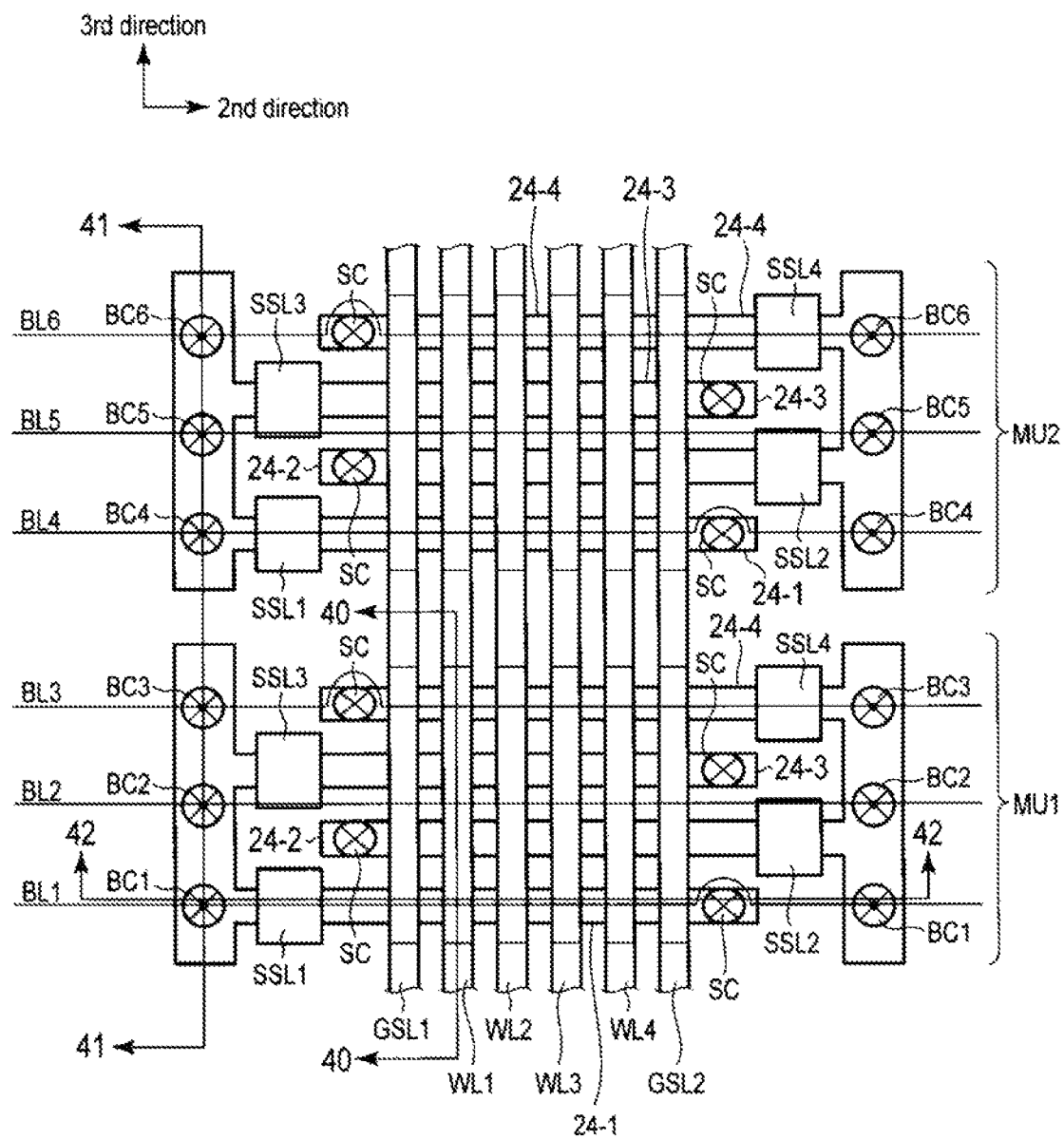
FIG. 39 is a plan view of the memory cell array according to the first example of the sixth embodiment.
Figure 40:
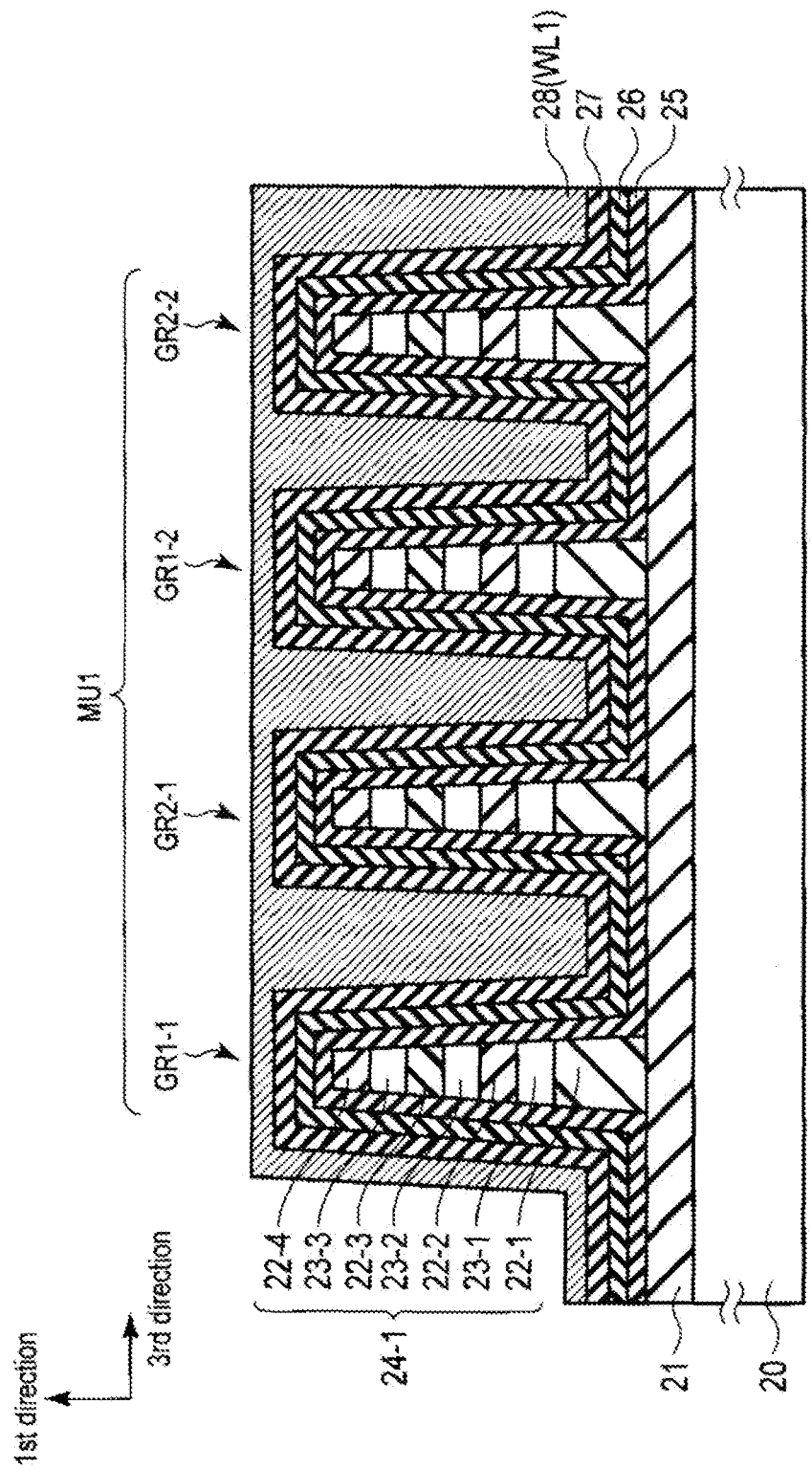
FIG. 40 is a cross-sectional view taken along line 40-40 in FIG. 39.
Figure 41:
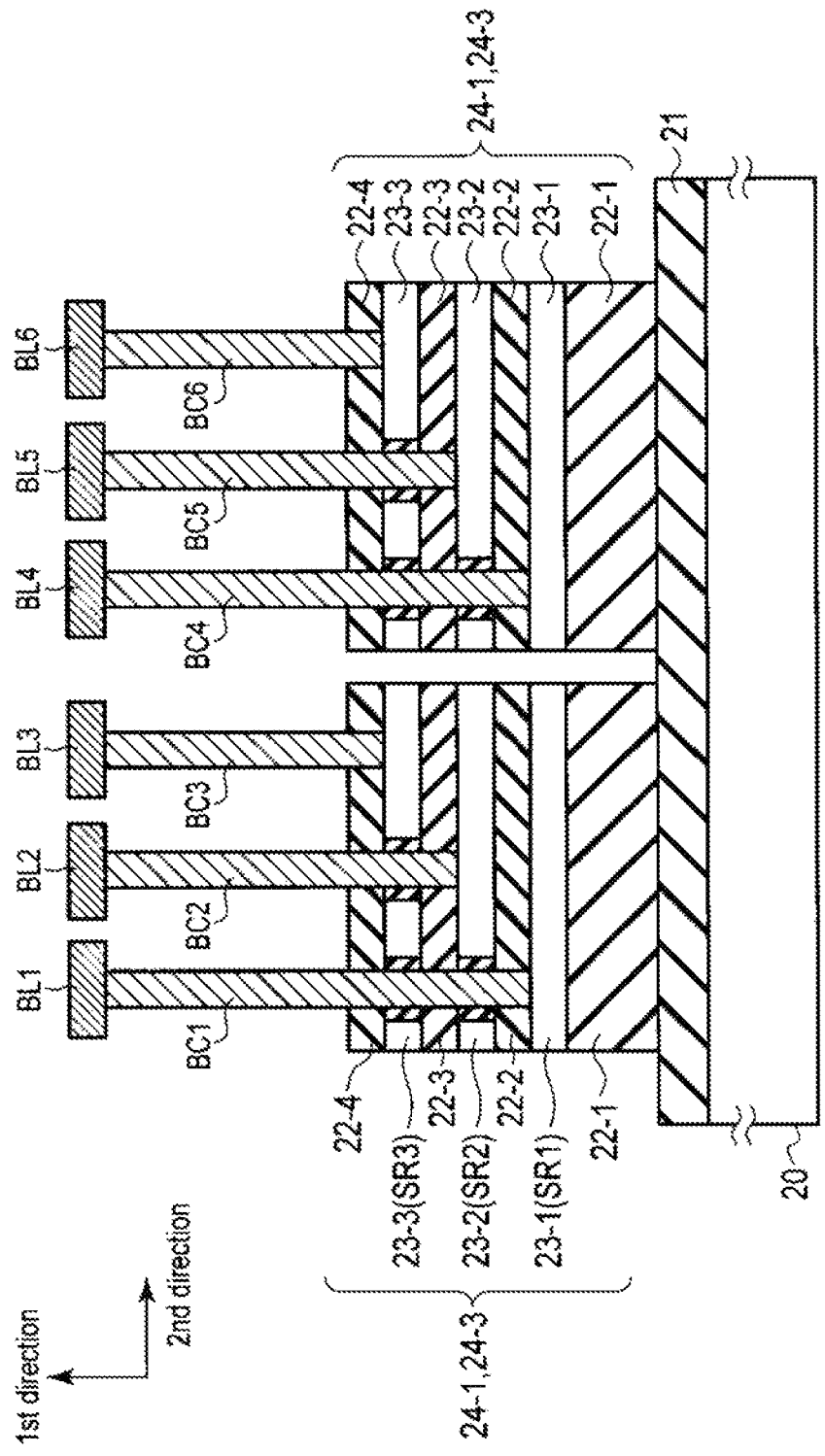
FIG. 41 is a cross-sectional view taken along line 41-41 in FIG. 39.
Figure 42:
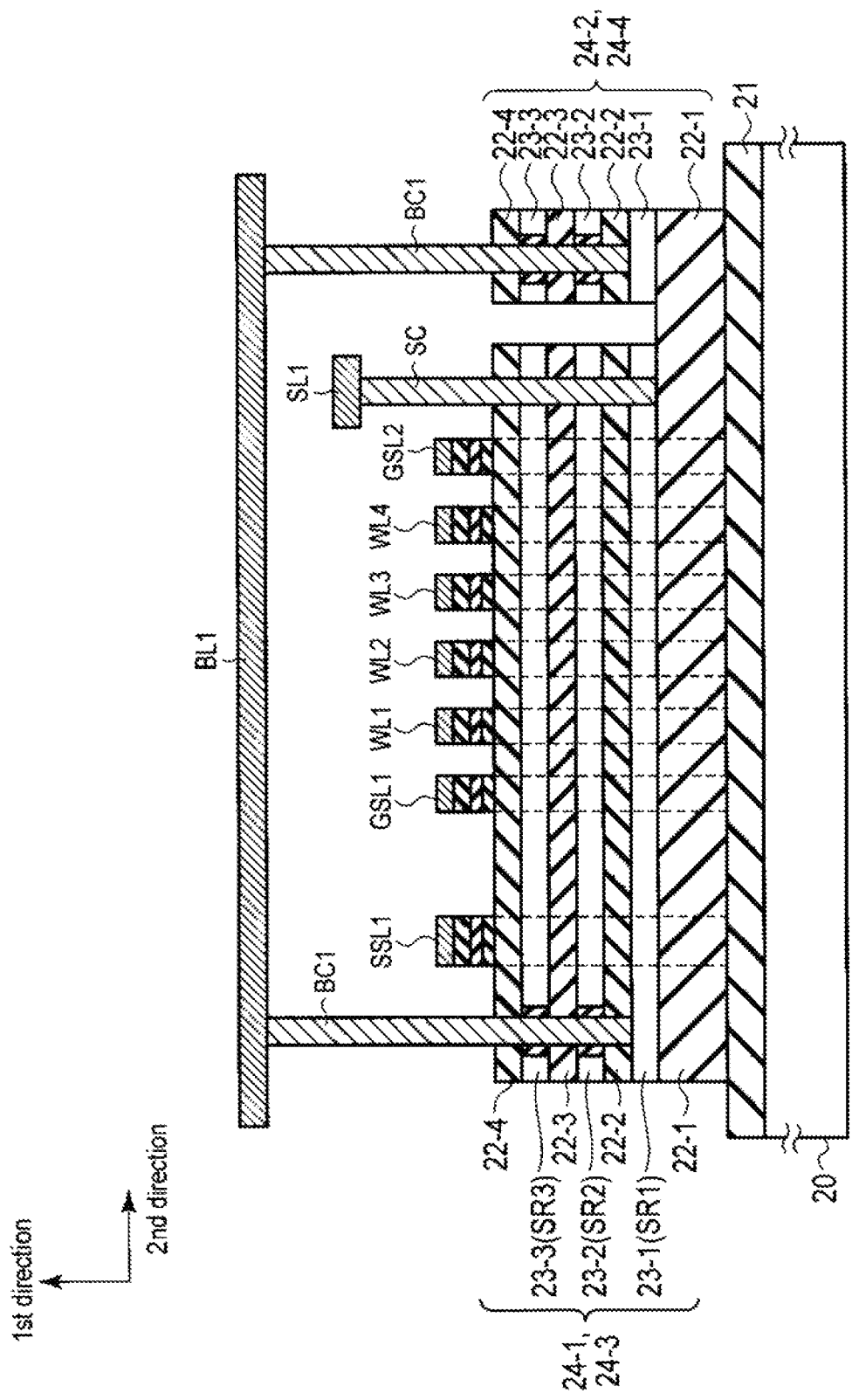
FIG. 42 is a cross-sectional view taken along line 42-42 in FIG. 39.

FIGS. 38 and 39 are a perspective view and a plan view of the block BLK, respectively, FIG. 40 is a cross-sectional view taken along line 40-40 in FIG. 39, FIG. 41 is a cross-sectional view taken along line 41-41 in FIG. 39, and FIG. 42 is a cross-sectional view taken along line 42-42 in FIG. 39. FIGS. 37, 40, and 42 illustrate one memory unit MU, and FIGS. 39 and 41 illustrate two memory units MU1 and MU2.

As illustrated in the drawing, an insulating film 21 is formed on a semiconductor substrate 20, and the block BLK is formed on the insulating film 21.

For example, four fin-type structures 24 (24-1 to 24-4), each having a stripe shape along a second direction perpendicular to a first direction which is a direction perpendicular to the surface of the semiconductor substrate 20, are formed on the insulating film 21, and thus one memory unit MU is formed. Each of the fin-type structures 24 includes insulating films 22 (22-1 to 22-4) provided along the second direction and semiconductor layers 23 (23-1 to 23-3). In each of the fin-type structures 24, the insulating films 22-1 to 22-4 and the semiconductor layers 23-1 to 23-3 are alternately stacked, and thus four stacked structures extending in a direction perpendicular to the surface of the semiconductor substrate 20 are formed. Each of the fin-type structures 24 corresponds to the string group GR described in FIG. 37. The semiconductor layer 23-1 located at the lowermost layer corresponds to a current path (region where a channel is formed) of the NAND string SR1, the semiconductor layer 23-3 located at the uppermost layer corresponds to a current path of the NAND string SR3, and the semiconductor layer 23-2 located therebetween corresponds to a current path of the NAND string SR2.

A gate insulating film 25, a charge storage layer 26, a block insulating film 27, and a control gate 28 are sequentially formed on the top surfaces and the side surfaces of the fin-type structures 24 (see FIG. 40). The charge storage layer 26 is formed of, for example, an insulating film. In addition, the control gate 28 is formed of a conductive film and functions as the word line WL or the select gate lines GSL1 and GSL2. The word line WL and the select gate lines GSL1 and GSL2 are formed between the plurality of memory units MU so as to straddle the plurality of fin-type structures 24. On the other hand, the control signal lines SSL1 to SSL4 are independent for the individual fin-type structures 24.

One end of the fin-type structure 24 is extracted to the end of the block BLK, and is connected to the bit line BL in the extracted region. That is, focusing attention on the memory unit MU1 as an example, one ends of the odd-numbered fin-type structures 24-1 and 24-3 are extracted up to a certain region along the second direction to be connected in common, and contact plugs BC1 to BC3 are formed in the region. The contact plug BC1 formed in the region connects the semiconductor layers 23-1 of the string groups GR1 and GR3 to the bit line BL1, and is insulated from the semiconductor layers 23-2 and 23-3. The contact plug BC2 connects the semiconductor layers 23-2 of the string groups GR1 and GR3 to the bit line BL2, and is insulated from the semiconductor layers 23-1 and 23-3. The contact plug BC3 connects the semiconductor layers 23-3 of the string groups GR1 and GR3 to the bit line BL3, and is insulated from the semiconductor layers 23-1 and 23-2.

On the other hand, one ends of the even-numbered fin-type structures 24-2 and 24-4 are extracted up to a region facing one ends of the fin-type structures 24-1 and 24-3 in the second direction to be connected in common, and the contact plugs BC1 to BC3 are formed in the region. The contact plug BC1 formed in the region connects the semiconductor layers 23-1 of the string groups GR2 and GR4 to the bit line BL1, and is insulated from the semiconductor layers 23-2 and 23-3. The contact plug BC2 connects the semiconductor layers 23-2 of the string groups GR2 and GR4 to the bit line BL2, and is insulated from the semiconductor layers 23-1 and 23-3. The contact plug BC3 connects the semiconductor layers 23-3 of the string groups GR2 and GR4 to the bit line BL3, and is insulated from the semiconductor layers 23-1 and 23-2.

Naturally, the above description relates to a case of the memory unit MU1. For example, in a case of the memory unit MU2, contact plugs BC4 to BC6 are formed and connect the semiconductor layers 23-1 to 23-3 to the bit lines BL4 to BL6, respectively (see FIG. 41).

In addition, a contact plug SC is formed on the other ends of the fin-type structures 24. The contact plug SC connects the semiconductor layers 23-1 to 23-3 to the source line SL.

In the above-described configuration, the memory cell transistors included in the NAND strings SR1 to SR3 have different sizes. More specifically, as illustrated in FIG. 40, the width of the semiconductor layer 23 along a third direction in each fin-type structure 24 increases as the semiconductor layer is located at a lower layer, and decreases as the semiconductor layer is located at a higher layer. That is, the width of the semiconductor layer 23-1 is largest, the width of the semiconductor layer 23-3 is smallest, and the width of the semiconductor layer 23-2 is intermediate therebetween. In other words, the plurality of memory cell transistors MT having different characteristics are included in one page.

6.1.2 Regarding Read Operation

Figure 43:
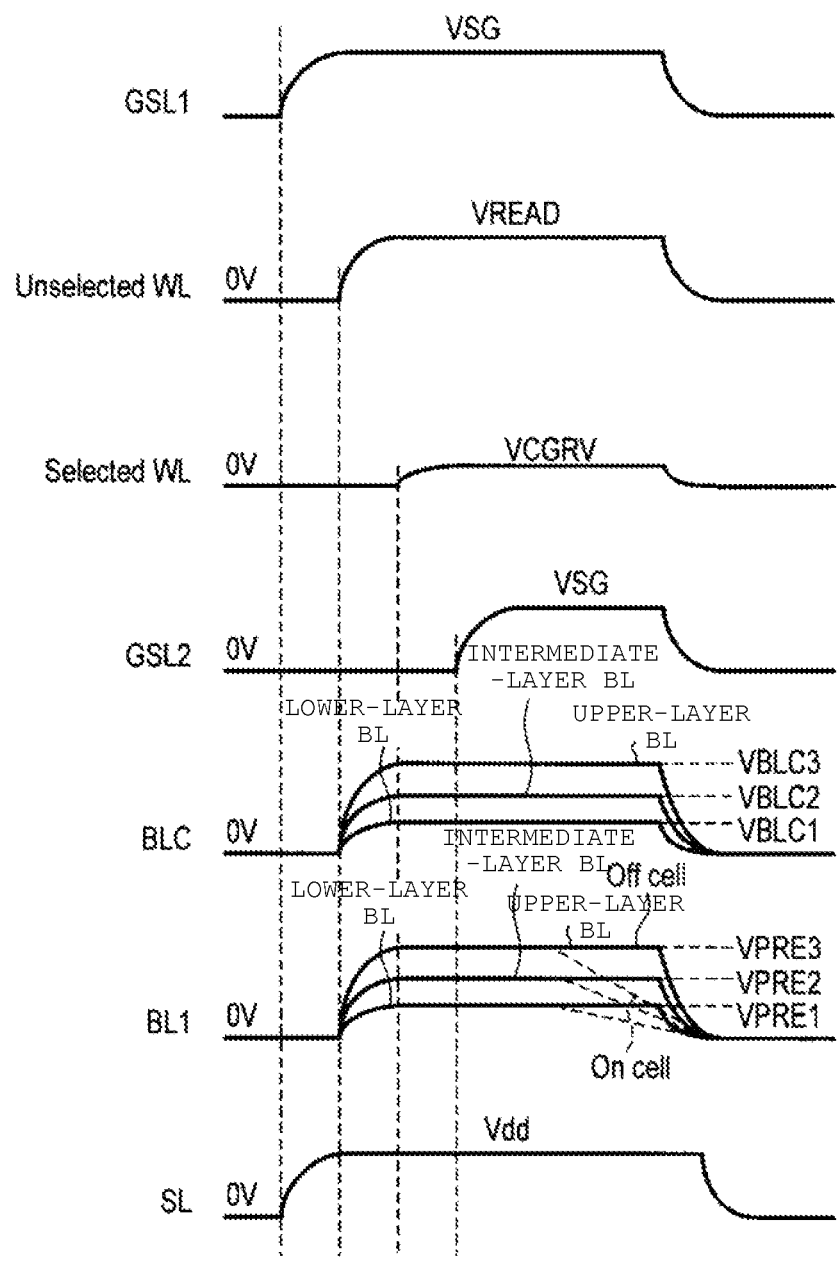
FIG. 43 is a flow chart illustrating a read operation according to the sixth embodiment.

Next, a read operation according to this embodiment will be described with reference to FIG. 43. FIG. 43 is a timing chart illustrating changes in the voltage of each wiring during a read operation of data, and illustrates a case where data is read out from a string group GR1-1, as an example.

First, a signal SSL1 is set to be at a "H" level, and thus the string group GR1-1 is connected to a sense amplifier 113. As illustrated in FIG. 43, a voltage VSG is first applied to the select gate line GSL1, and thus the select transistor ST1 is set to be in an on-state. In addition, for example, a sequencer 121 controls a regulator 140 so that a source line control circuit 114 applies an appropriate voltage to the source line SL1 (although a power supply voltage Vdd is applied in the example of FIG. 43, it is possible to appropriately set a value between 0 and Vdd, for example, approximately 1 V).

Subsequently, signals BLP and BLS are set to be at a "H" level, and thus transistors 132 and 134 in the sense amplifier 113 are set to be in an on-state. The sequencer 121 then controls the regulator 131, and thus a signal BLC is generated. At this time, the sequencer 121 controls a voltage value of the signal BLC depending on the NAND string SR to which the corresponding bit line BL is connected. More specifically, a voltage value of the signal BLC is set to VBLC1 when the bit line corresponds to the NAND string SR1 located at the lowermost layer, is set to VBLC2 when the bit line corresponds to the NAND string SR2 located at the intermediate layer, and is set to VBLC3 when the bit line corresponds to the NAND string SR3 located at the uppermost layer. A relationship of VBLC1<VBLC2<VBLC3 is then established therebetween.

As a result, precharge potentials of the bit lines BL1 to BL3 are set to VPRE1, VPRE2, and VPRE3, respectively, and a relationship of VPRE1<VPRE2<VPRE3 is established therebetween.

Thereafter, a voltage VREAD is applied to an unselected word line, a voltage VCGRV (voltage depending on a reading level) is applied to a selected word line, and a voltage VSG is applied to a select gate line GSL2.

As a result, when the memory cell transistor connected to the selected word line is set to be in an on-state, a potential of the bit line is lowered. When the memory cell transistor is set to be in an off-state, a precharge level is substantially maintained. The potential is then sensed and amplified by the sense amplifier unit 130.

Meanwhile, in this embodiment, precharge potentials of the bit lines BL1 to BL3 are set to VPRE1, VPRE2, and VPRE3, and thus the precharge potentials are changed in units of bit lines. However, this embodiment is not limited to such a case, and for example, the precharge potentials may be changed for every plurality of bit lines. The precharge potentials of three bit lines BL1 to BL3 may be set to VPRE1, the precharge potentials of three bit lines BL4 to BL6 may be set to VPRE2, and the precharge potentials of three bit lines BL7 to BL9 may be set to VPRE3.

6.1.3 Regarding Write Operation

Figure 44:
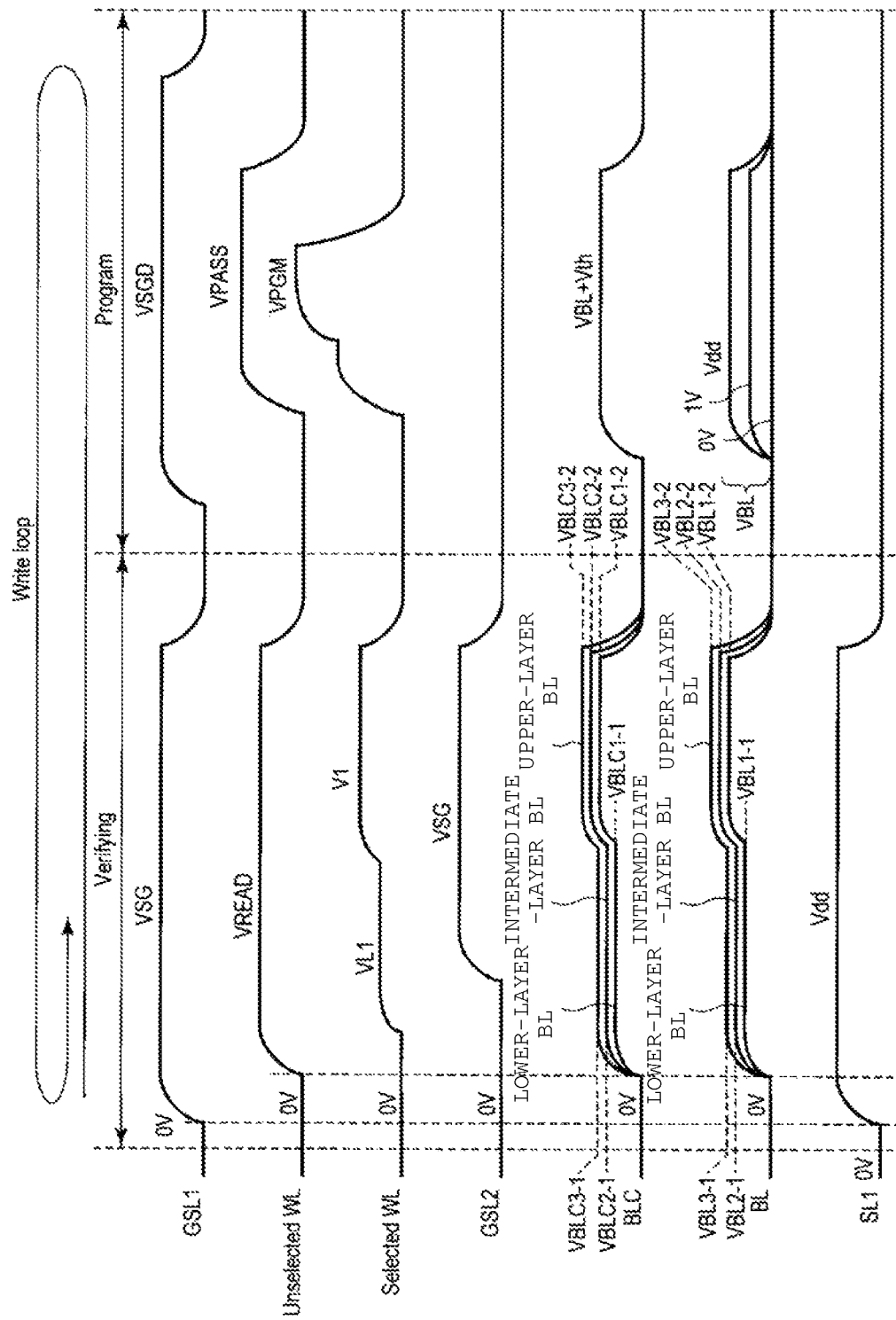
FIG. 44 is a timing chart of a write operation according to the sixth embodiment.

Next, a write operation according to this example will be described with reference to FIG. 44. FIG. 44 is a timing chart of the write operation according to this example, and substantially corresponds to FIG. 10 described in the first embodiment. Although a flow of the write operation is substantially the same as that in FIG. 7, is different from that in the first embodiment in that layer dependence is given to a bit line voltage instead of a word line voltage, similar to the read operation. Unlike the description of FIG. 7, although a verifying operation is executed prior to a programming operation in FIG. 44, the order does not matter. Further, in FIG. 44, a description is given by taking an example using a quick pass write technique. The quick pass write technique is disclosed in, for example, U.S. patent application Ser. No. 12/491,638, filed Jun. 25, 2009, entitled "NONVOLATILE SEMICONDUCTOR MEMORY DEVICE". The entirety of this patent application is incorporated in this disclosure by reference.

As illustrated in the drawing, in this example, layer dependence is given to a bit line voltage during programming verification, similar to the read operation described in the section of 6.1.2 described above. That is, the regulator 131 generates the signal BLC depending on layers under the control of the sequencer 121.

As a result, the bit line voltage during the programming verification is set to be lower in the NAND string SR1 located at the lower layer, and is set to be higher in the NAND string SR3 located at the upper layer.

6.2 Second Example

Next, a memory cell array according to a second example will be described. Unlike the first example, this example is configured such that NAND strings SR1 to SR3 are selected by source lines SL.

Figure 45:
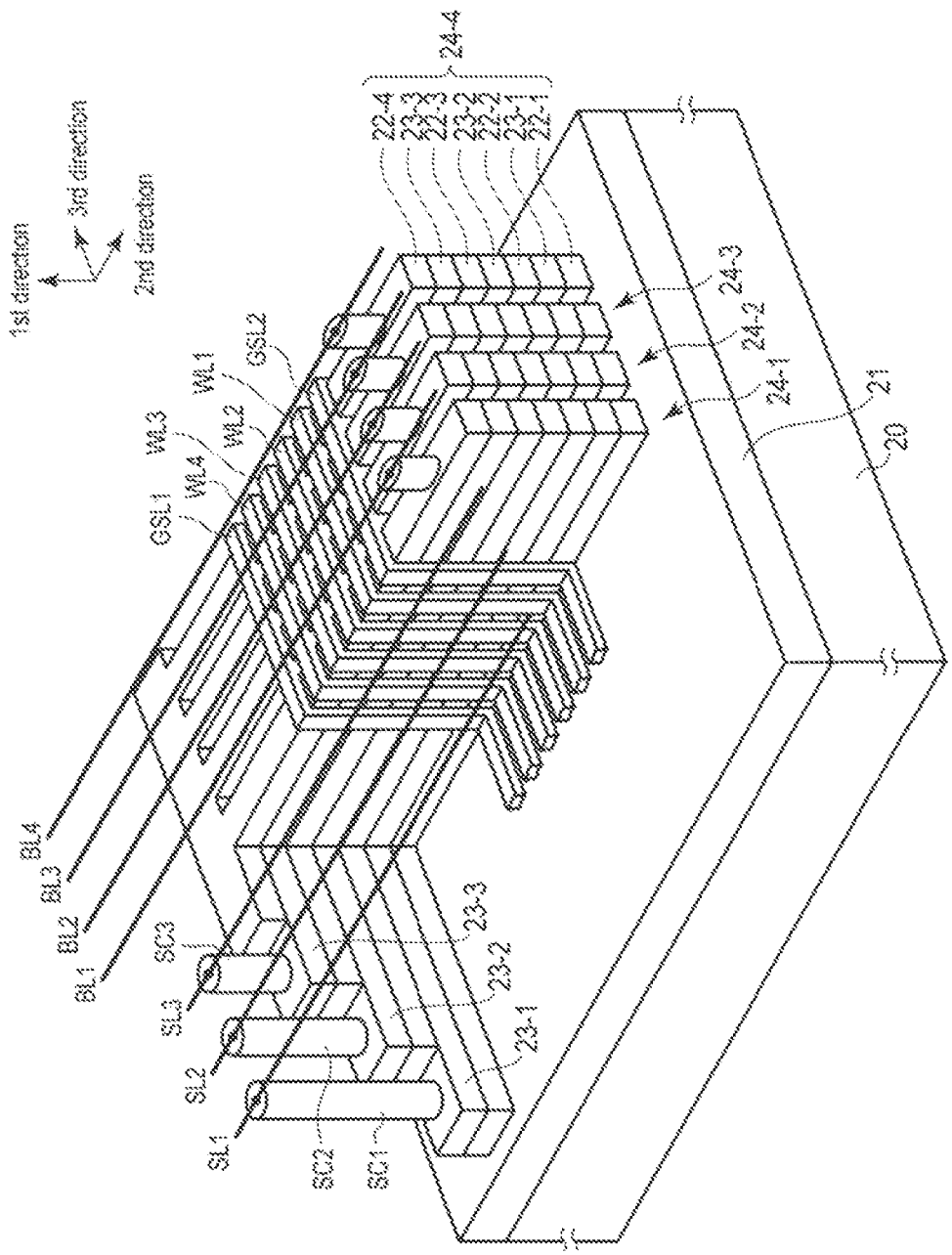
FIG. 45 is a perspective view of a memory cell array according to a second example of the sixth embodiment.
Figure 46:
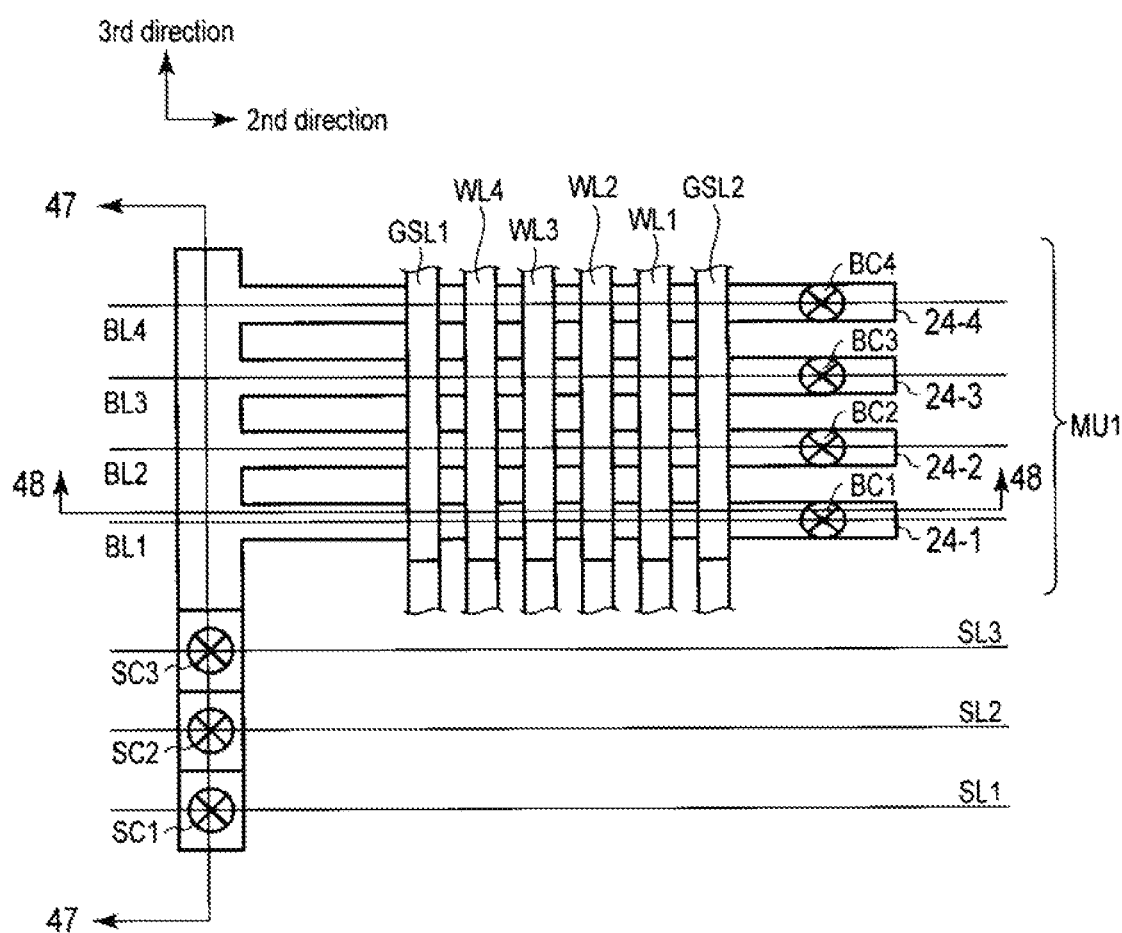
FIG. 46 is a plan view of the memory cell array according to the second example of the sixth embodiment.
Figure 47:
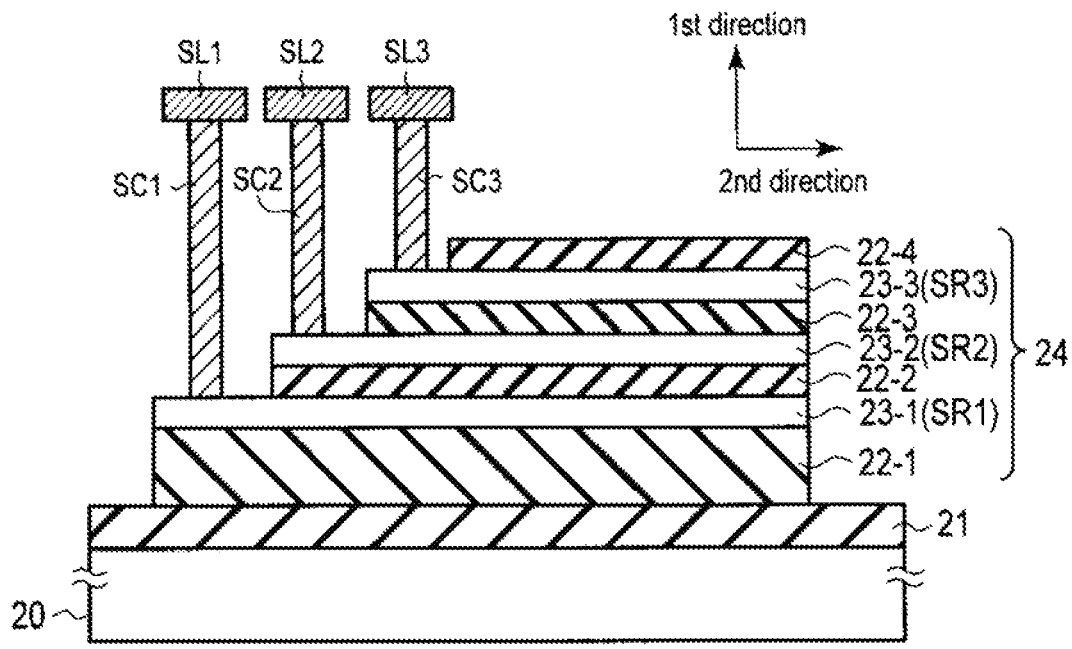
FIG. 47 is a cross-sectional view taken along line 47-47 in FIG. 46.
Figure 48:
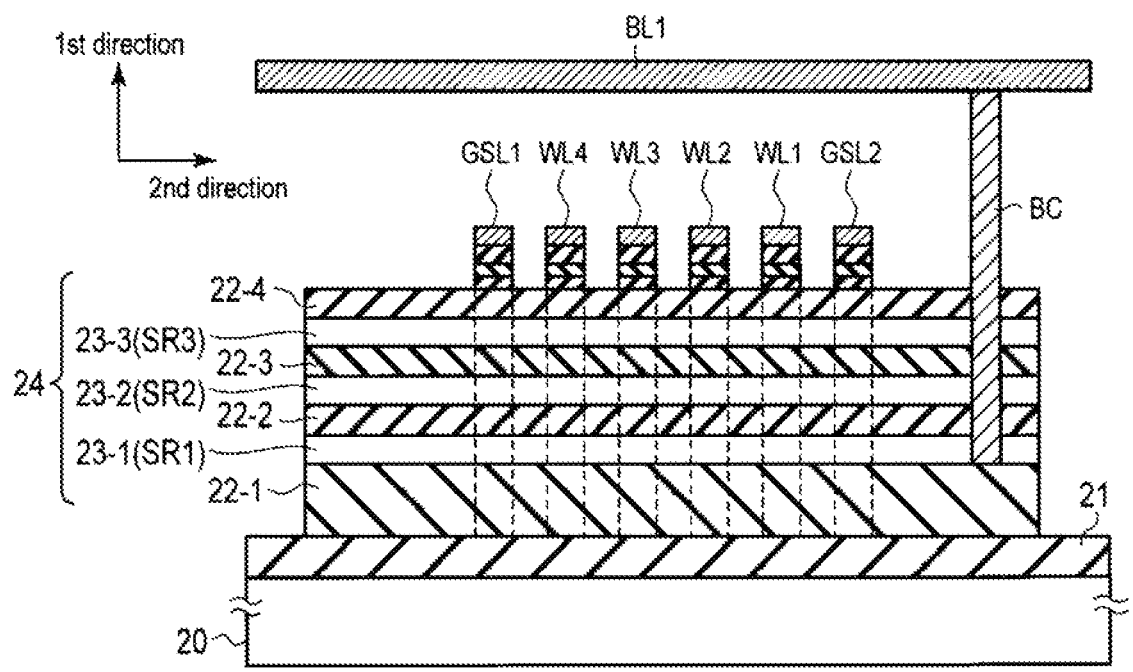
FIG. 48 is a cross-sectional view taken along line 48-48 in FIG. 46.

FIG. 45 is a perspective view of a block BLK according to this embodiment, and illustrates any one memory unit MU. FIG. 46 is a plan view of the memory unit MU, FIG. 47 is a cross-sectional view taken along line 47-47 in FIG. 46, and FIG. 48 is a cross-sectional view taken along line 48-48 in FIG. 46.

As illustrated in the drawing, this example is configured such that one ends of a plurality of fin-type structures 24 are extracted to an end of the block BLK to be connected to bit lines BL in a region where the ends are extracted and such that the other ends thereof are connected in common for each layer to be connected to the source lines SL, in the configuration described in the first example described above. The bit lines BL are then connected in common to semiconductor layers 23-1 to 23-3 in the corresponding fin-type structure 24 (see FIG. 48). On the other hand, the source lines SL are independently provided for the respective semiconductor layers 23-1 to 23-3 in the fin-type structure 24 which is connected in common (see FIG. 47). In this example, the control signal line SSL in the first example is eliminated.

6.2 Regarding Read Operation and Write Operation

The read operation and the write operation according to this example are basically the same as those in the first example described in FIGS. 43 and 44. However, in a case of this example, the bit line BL is connected in common to the plurality of NAND strings SR included in one string group GR. Accordingly, a potential of the source line SL is controlled, and thus any one NAND string SR is selected from each string group GR.

For example, when the NAND string SR1 located at the lowermost layer is selected, the corresponding source line SL1 is selected, and thus an appropriate selected source line voltage is applied to the selected source line SL1. An unselected source line voltage is applied to other unselected source lines SL2 and SL3.

A bit line voltage is set in a similar manner to that in the first example, in accordance with the corresponding layer of the selected bit line.

6.3 Effects according to This Embodiment

As described above, even if a memory cell array having the configuration according to this embodiment is provided, the first to fourth embodiments may be applied.

7. Modification Example and the like

As described above, a semiconductor memory device according to an embodiment includes a first and second memory cells stacked above a semiconductor substrate, a third and fourth memory cells stacked above the first and second memory cells, a first to fourth word lines electrically connected to gates of the first to fourth memory cells, respectively, and a row decoder that applies a voltage to the first to fourth word lines. The row decoder applies a first programming voltage to the first word line during a write operation performed on the first memory cell and applies the first programming voltage to the second word line during a write operation performed on the second memory cell. In addition, the row decoder applies a second programming voltage to the third word line during a write operation performed on the third memory cell and applies the second programming voltage to the fourth word line during a write operation performed on the fourth memory cell. The second programming voltage is higher than the first programming voltage.

According to the above-described configuration, in the semiconductor memory device in which the memory cells are stacked in a three-dimensional manner, it is possible to apply an appropriate programming voltage to the memory cells having different characteristics in accordance with layers. Accordingly, it is possible to improve an operating performance of the semiconductor memory device.

However, the embodiment is not limited to the first to seventh embodiments described above, and various modifications may be made.

For example, when each of the select gate lines SGD and SGS is formed by multiple-layered wiring layers (each of which is formed by four-layered wiring layers in the example of FIG. 12 and the like), a voltage to be applied thereto may be set to be a higher voltage as the select gate line approaches the upper layer, in a similar manner to VPGM and VPASS.

Meanwhile, the voltage applied to the select gate lines SGS and SGD is disclosed in, for example, U.S. patent application Ser. No. 12/846,234, filed Jul. 29, 2010, entitled "NONVOLATILE SEMICONDUCTOR DEVICE". The entirety of this patent application is incorporated in this disclosure by reference.

In addition, the above-described embodiments are not limited to the NAND-type flash memory. The embodiments may be applied to any storage device having different cell characteristics in accordance with layers, and are not limited to a storage device. Further, although the embodiments may be implemented independently, a plurality of combinable embodiments may be combined to be implemented.

Meanwhile, in the respective embodiments, (1) In a read operation, when each memory cell transistor MT may hold two bits of data and an "E" level (erasing level), an "A" level, a "B" level, and a "C" level are defined in the ascending order of threshold value, a voltage applied to a word line selected for a read operation of the A level is in a range, for example, between 0 V and 0.55 V. The voltage is not limited thereto, and may be set to be in any one of ranges between 0.1 V and 0.24 V, between 0.21 V and 0.31 V, between 0.31 V and 0.4 V, between 0.4 V and 0.5 V, and between 0.5 V and 0.55 V.

A voltage applied to a word line selected for a read operation of the B level is in a range, for example, between 1.5 V and 2.3 V. The voltage is not limited thereto, and may be set to be in any one of ranges between 1.65 V and 1.8 V, between 1.8 V and 1.95 V, between 1.95 V and 2.1 V, and between 2.1 V and 2.3 V.

A voltage applied to a word line selected for a read operation of the C level is in a range, for example, between 3.0 V and 4.0 V. The voltage is not limited thereto, and may be set to be in any one of ranges between 3.0 V and 3.2 V, between 3.2 V and 3.4 V, between 3.4 V and 3.5 V, between 3.5 V and 3.6 V, and between 3.6 V and 4.0 V.

A time (tR) of the read operation may be set to be in a range, for example, between 25 µs and 38 µs, between 38 µs and 70 µs, and between 70 µs and 80 µs.

(2) As described above, a write operation includes a programming operation and a verifying operation. In the write operation, a voltage which is first applied to a word line selected during a programming operation is in a range, for example, between 13.7 V and 14.3 V. The voltage is not limited thereto, and may be set to be in any one of ranges, for example, between 13.7 V and 14.0 V and between 14.0 V and 14.6 V.

A voltage which is first applied to the selected word line at the time of writing an odd-numbered word line and a voltage which is first applied to the selected word line at the time of writing an even-numbered word line may be changed.

When the programming operation is performed using an incremental step pulse program (ISPP) method, a step-up voltage may be, for example, approximately 0.5 V.

A voltage applied to an unselected word line may be set to be in a range, for example, between 6.0 V and 7.3 V, but is not limited thereto. The voltage may be set to be in a range, for example, between 7.3 V and 8.4 V and may be set to equal to or less than 6.0 V.

A path voltage to be applied may be changed according to whether the unselected word line is an odd-numbered word line or an even-numbered word line.

A time (tProg) of the write operation may be set to be in a range, for example, between 1,700 µs and 1,800 µs, between 1,800 µs and 1,900 µs, and between 1,900 µs and 2,000 µs.

(3) In an erasing operation, a voltage which is first applied to a well, which is formed above the semiconductor substrate and on which the above-described memory cell is formed, is in a range, for example, between 12 V and 13.6 V, but is not limited thereto. The voltage may be in a range, for example, between 13.6 V and 14.8 V, between 14.8 V and 19.0 V, between 19.0 V and 19.8 V, and between 19.8 V and 21 V.

A time (tErase) of the erasing operation may be set to be in a range, for example, between 3,000 µs and 4,000 µs, between 4,000 µs and 5,000 µs, and between 4,000 µs and 9,000 µs.

(4) A structure of the memory cell includes a charge storage layer which is disposed on a semiconductor substrate (silicon substrate) through a tunnel insulating film having a film thickness of 4 nm to 10 nm. The charge storage layer may be configured to have a stacked structure of an insulating film such as SiN or SiON which has a film thickness of 2 nm to 3 nm and polysilicon having a film thickness of 3 nm to 8 nm. In addition, a metal such as Ru may be added in the polysilicon. The insulating film is provided on the charge storage layer. For example, the insulating film includes a silicon oxide film having a film thickness of 4 nm to 10 nm which is interposed between a High-k film, located at a lower layer, which has a film thickness of 3 nm to 10 nm and a High-k film, located at an upper layer, which has a film thickness of 3 nm to 10 nm. The High-k film may include HfO and the like. In addition, the silicon oxide film may be formed to have a film thickness which is larger than the film thickness of the High-k film. A control electrode having a film thickness of 30 nm to 70 nm is formed on the insulating film through a material for adjusting a work function which has a film thickness of 3 nm to 10 nm. Here, the material for adjusting a work function is a metal oxide film such as TaO and a metal nitride film such as TaN. W and the like may be used for the control electrode.

In addition, it is possible to form air gaps between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   first and second memory cells that are stacked above a semiconductor substrate;
   third and fourth memory cells that are stacked above the first and second memory cells;
   first to fourth word lines that are electrically connected to gates of the first to fourth memory cells, respectively; and
   a row decoder configured to apply voltages to the first to fourth word lines, wherein
   the row decoder applies a first programming voltage to the first word line during a write operation performed on the first memory cell and applies the first programming voltage to the second word line during a write operation performed on the second memory cell, and
   the row decoder applies a second programming voltage that is higher than the first programming voltage to the third word line during a write operation performed on the third memory cell and applies the second programming voltage to the fourth word line during a write operation performed on the fourth memory cell.

2. The device according to claim 1, wherein
   the write operation includes a programming operation during which a programming voltage is applied to a word line connected to a memory cell being programmed and a programming verifying operation, and the write operation is repeated if the programming verifying operation indicates that programming of the memory cell has failed.

3. The device according to claim 2, wherein
   the programming voltage is stepped up each time the write operation is repeated, and
   the first and second programming voltages are initial programming voltages for the first and second memory cells, respectively.

4. The device according to claim 3, wherein
   the write operation further includes a detecting operation to determine whether a threshold value of the first and second memory cells is greater than or equal to a first detection voltage, and to determine whether a threshold value of the third and fourth memory cells is greater than or equal to a second detection voltage that is higher than the first detection voltage.

5. The device according to claim 4, wherein the detecting operation is performed after the write operation has been repeated a first number of times.

6. The device according to claim 5, wherein
each of the first to fourth memory cells is capable of holding more than two bits of data, and the write operation includes a lower bit write operation of the more than two bits of data, and
a programming voltage used in the upper bit write operation is set in accordance with a result of the detecting operation.

7. The device according to claim 1, further comprising:
a conductive layer that is formed through the first to fourth word lines and has current paths of the first to fourth memory cells formed therein,
wherein a diameter of the conductive layer increases in a direction from a lower end of the word lines to an upper end of the word lines.

8. The device according to claim 1, further comprising:
fifth and sixth memory cells that are stacked above a semiconductor substrate;
seventh and eighth memory cells that are stacked above the fifth and sixth memory cells; and
fifth to eighth word lines that are electrically connected to gates of the fifth to eighth memory cells, respectively, wherein
the row decoder applies a third programming voltage to the fifth word line during a write operation performed on the fifth memory cell and applies the third programming voltage to the sixth word line during a write operation performed on the sixth memory cell, and
the row decoder applies a fourth programming voltage that is higher than the third programming voltage to the seventh word line during a write operation performed on the seventh memory cell and applies the fourth programming voltage to the eighth word line during a write operation performed on the eighth memory cell.

9. The device according to claim 8, wherein the fifth and sixth memory cells are stacked above the third and fourth memory cells and the third programming voltage is higher than the second programming voltage.

10. The device according to claim 8, wherein the fifth and sixth memory cells are stacked above the third and fourth memory cells and the third programming voltage is lower than the second programming voltage.

11. The device according to claim 1, wherein
during the write operation performed on a selected memory cell, the row decoder applies pass voltages to unselected memory cells.

12. The device according to claim 11, wherein a pass voltage applied to a fifth memory cell is greater than a pass voltage applied to a sixth memory cell that is closer to the substrate than the fifth memory cell.

13. The device according to claim 11, wherein a pass voltage applied to a fifth memory cell is less than a pass voltage applied to a sixth memory cell that is closer to the substrate than the fifth memory cell and is a first number of memory cells away from the selected memory cell.

14. A semiconductor memory device comprising:
a first memory cell that is provided above a semiconductor substrate;
a second memory cell that is provided above the first memory cell;

first and second word lines that are electrically connected to gates of the first and second memory cells, respectively, and
a row decoder configured to apply voltages to the first and second word lines, wherein
the write operation includes a programming operation during which a programming voltage is applied to a word line connected to a memory cell being programmed, a programming verifying operation to verify whether the programming of the memory cell has succeeded or failed, and a detecting operation to determine whether a threshold value of the memory cell is greater than or equal to a detection voltage, and
the detection voltage for the first memory cell is a first detection voltage, and the detection voltage for the second memory cell is a second detection voltage that is higher than the first detection voltage.

15. The device according to claim 14, wherein
the programming operation is repeated if the programming verifying operation indicates that programming of the memory cell has failed,
the detecting operation for the first memory cell is executed after the programming operation for the first memory cell is repeated a first number of times, and
the detecting operation for the second memory cell is executed after the programming operation for the second memory cell is repeated a second number of times that is greater than the first number of times.

16. The device according to claim 15, wherein
each of the first and second memory cells is capable of holding more than two bits of data, and the write operation includes a lower bit write operation of the more than two bits of data, and
a programming voltage used in the upper bit write operation is set in accordance with a result of the detecting operation.

17. The device according to claim 14, further comprising:
a conductive layer that is formed through the first and second word lines and has current paths of the first and second memory cells formed therein,
wherein a diameter of the conductive layer increases in a direction from a lower end of the word lines to an upper end of the word lines.

18. A semiconductor memory device comprising:
a plurality of memory cells that are stacked above a semiconductor substrate and divided into first and second groups, the first group of memory cells being located a first distance range away from the semiconductor substrate and the second group of memory cells being located a second distance range, not overlapping with the first distance range, away from the semiconductor substrate, the memory cells including first and second memory cells that are in the first group and third and fourth memory cells that are in the second group;
a plurality of word lines that are connected to gates of the plurality of memory cells, respectively; and
a row decoder configured to apply voltages to the plurality of word lines, wherein
the row decoder applies a first programming voltage to the first word line during a write operation performed on the first memory cell and applies the first programming voltage to the second word line during a write operation performed on the second memory cell, and
the row decoder applies a second programming voltage that is different from the first programming voltage to the third word line during a write operation performed on the third memory cell and applies the second programming voltage to the fourth word line during a write operation performed on the fourth memory cell.

19. The device according to claim 18, wherein the first memory cell includes a first portion within a circular opening through a first word line and the second memory cell includes a second portion within a circular opening through a second word line, and a diameter of the first portion is less than a diameter of the second portion.

20. The device according to claim 19, wherein the first and second memory cells are closer to the semiconductor substrate than the third and fourth memory cells.

* * * * *